United States Patent
Wu et al.

(10) Patent No.: US 12,243,843 B2
(45) Date of Patent: Mar. 4, 2025

(54) INTEGRATED CIRCUIT PACKAGE AND METHOD OF FORMING SAME

(71) Applicant: Taiwan Semiconductor Manufacturing Co., Ltd., Hsinchu (TW)

(72) Inventors: Jiun Yi Wu, Zhongli (TW); Chen-Hua Yu, Hsinchu (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 337 days.

(21) Appl. No.: 17/813,639

(22) Filed: Jul. 20, 2022

(65) Prior Publication Data
US 2023/0369274 A1 Nov. 16, 2023

Related U.S. Application Data

(60) Provisional application No. 63/364,435, filed on May 10, 2022.

(51) Int. Cl.
*H01L 23/00* (2006.01)
*G02B 6/42* (2006.01)
(Continued)

(52) U.S. Cl.
CPC ............ *H01L 24/26* (2013.01); *G02B 6/4253* (2013.01); *G02B 6/4268* (2013.01); *H01L 23/13* (2013.01);
(Continued)

(58) Field of Classification Search
None
See application file for complete search history.

(56) References Cited

U.S. PATENT DOCUMENTS 7,262,509 B2 * 8/2007 Garcia ................ H01L 23/3121
257/691
8,993,380 B2 3/2015 Hou et al.
(Continued)

FOREIGN PATENT DOCUMENTS

KR 20120053332 A 5/2012
KR 20200001473 A 1/2020
(Continued)

*Primary Examiner* — Jerry Rahll
(74) *Attorney, Agent, or Firm* — Slater Matsil, LLP

(57) ABSTRACT

A package includes a package substrate including an insulating layer having a trench and a package component bonded to the package substrate. The package component includes a redistribution structure, an optical die bonded to the redistribution structure, the optical die including an edge coupler near a first sidewall of the optical die, a dam structure on the redistribution structure near the first sidewall of the optical die, a first underfill between the optical die and the redistribution structure, an encapsulant encapsulating the optical die, and an optical glue in physical contact with the first sidewall of the optical die. The first underfill does not extend along the first sidewall of the optical die. The optical glue separates the dam structure from the encapsulant. The package further includes a second underfill between the insulating layer and the package component. The second underfill is partially disposed in the trench.

20 Claims, 46 Drawing Sheets

(51) Int. Cl.
  *H01L 23/13* (2006.01)
  *H01L 23/31* (2006.01)
  *H01L 23/538* (2006.01)
  *H01L 25/00* (2006.01)
  *H01L 25/10* (2006.01)

(52) U.S. Cl.
  CPC ...... H01L 23/3185 (2013.01); H01L 23/5386 (2013.01); H01L 24/16 (2013.01); H01L 24/20 (2013.01); H01L 24/32 (2013.01); H01L 24/73 (2013.01); H01L 24/92 (2013.01); H01L 25/105 (2013.01); H01L 25/50 (2013.01); *H01L 23/5383* (2013.01); *H01L 24/13* (2013.01); *H01L 24/19* (2013.01); *H01L 24/81* (2013.01); *H01L 24/83* (2013.01); *H01L 2224/13082* (2013.01); *H01L 2224/16227* (2013.01); *H01L 2224/19* (2013.01); *H01L 2224/211* (2013.01); *H01L 2224/26175* (2013.01); *H01L 2224/32137* (2013.01); *H01L 2224/32237* (2013.01); *H01L 2224/73204* (2013.01); *H01L 2224/81815* (2013.01); *H01L 2224/831* (2013.01); *H01L 2224/83855* (2013.01); *H01L 2224/92125* (2013.01)

(56) References Cited

U.S. PATENT DOCUMENTS

| | | | |
|---|---|---|---|
| 9,000,584 | B2 | 4/2015 | Lin et al. |
| 9,048,222 | B2 | 6/2015 | Hung et al. |
| 9,048,233 | B2 | 6/2015 | Wu et al. |
| 9,064,879 | B2 | 6/2015 | Hung et al. |
| 9,111,949 | B2 | 8/2015 | Yu et al. |
| 9,263,511 | B2 | 2/2016 | Yu et al. |
| 9,281,254 | B2 | 3/2016 | Yu et al. |
| 9,299,649 | B2 | 3/2016 | Chiu et al. |
| 9,368,460 | B2 | 6/2016 | Yu et al. |
| 9,372,206 | B2 | 6/2016 | Wu et al. |
| 9,425,126 | B2 | 8/2016 | Kuo et al. |
| 9,443,783 | B2 | 9/2016 | Lin et al. |
| 9,461,018 | B1 | 10/2016 | Tsai et al. |
| 9,496,189 | B2 | 11/2016 | Yu et al. |
| 9,638,859 | B1* | 5/2017 | Nuttall ............ G02B 6/4274 |
| 9,666,502 | B2 | 5/2017 | Chen et al. |
| 9,735,131 | B2 | 8/2017 | Su et al. |
| 10,867,955 | B2* | 12/2020 | Cheng ............ H01L 24/92 |
| 2004/0212030 | A1* | 10/2004 | Asai ............ H05K 1/0274 257/432 |
| 2006/0012967 | A1* | 1/2006 | Asai ............ H05K 1/0274 361/764 |
| 2006/0198570 | A1* | 9/2006 | Ogawa ............ H01L 24/24 257/E25.032 |
| 2012/0119346 | A1 | 5/2012 | Im et al. |
| 2015/0255500 | A1 | 9/2015 | Akahoshi et al. |
| 2019/0181275 | A1* | 6/2019 | Tsuchiya ............ H01L 24/81 |
| 2020/0003975 | A1 | 1/2020 | Yu et al. |
| 2020/0006088 | A1 | 1/2020 | Yu et al. |
| 2020/0105705 | A1* | 4/2020 | Cheng ............ H01L 25/50 |
| 2020/0111729 | A1 | 4/2020 | Pan et al. |
| 2022/0155539 | A1* | 5/2022 | Pietambaram ...... G02B 6/4248 |
| 2022/0196943 | A1* | 6/2022 | Li ............ G02B 6/4243 |
| 2023/0207412 | A1* | 6/2023 | Spreitzer ............ H01L 21/563 257/668 |
| 2023/0420391 | A1* | 12/2023 | Kao ............ H01L 23/564 |

FOREIGN PATENT DOCUMENTS

| | | |
|---|---|---|
| KR | 20200001552 A | 1/2020 |
| KR | 20200034932 A | 4/2020 |
| WO | 2014083750 A1 | 6/2014 |

* cited by examiner

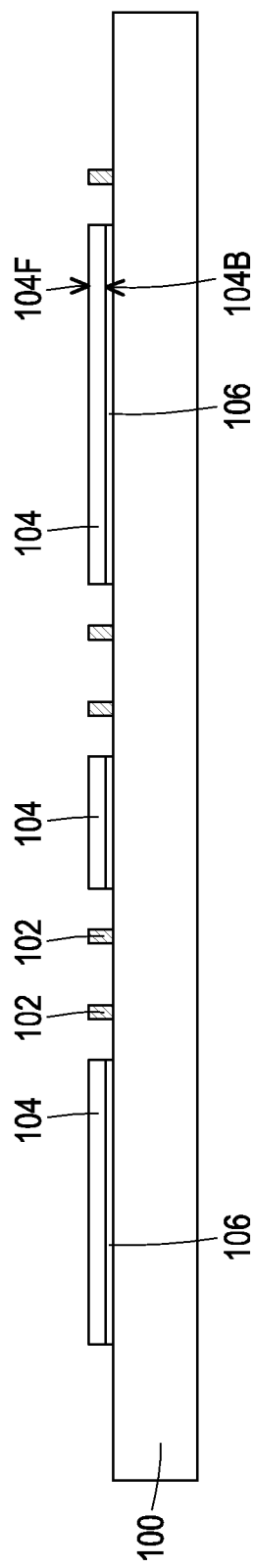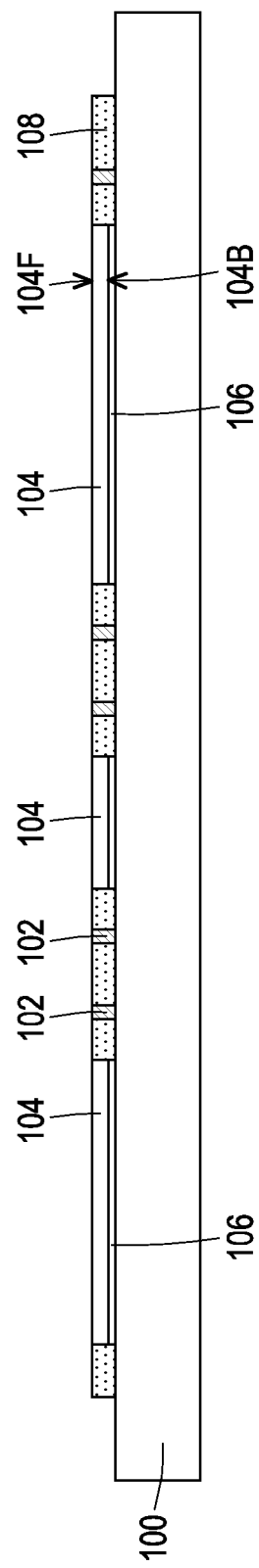

INTEGRATED CIRCUIT PACKAGE AND METHOD OF FORMING SAME

PRIORITY CLAIM AND CROSS-REFERENCE

This application claims the benefit of U.S. Provisional Application No. 63/364,435, filed on May 10, 2022, which application is hereby incorporated herein by reference.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 4-7, 8A, 8B, 9, 10, 11A and 11B illustrate top and cross-sectional views of intermediate stages in the manufacturing of package components, in accordance with some embodiments.

DETAILED DESCRIPTION

Figure 1:
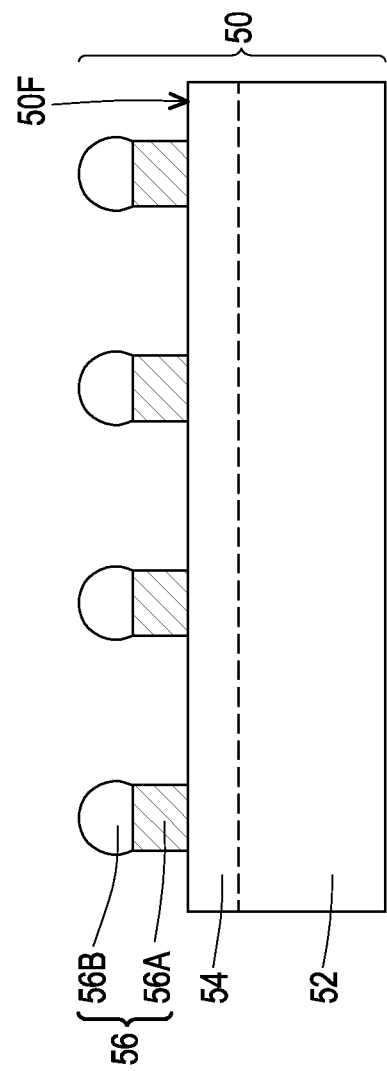
FIG. 1 illustrates a cross-sectional view of an integrated circuit die, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will be described with respect to embodiments in a specific context, namely integrated circuit packages and methods of forming the same. In various embodiments presented herein, a package comprises a package component mounted on a package substrate. The package component may comprise an optical integrated circuit die attached to a redistribution structure or an interposer. The optical integrated circuit die may comprise an optical coupler, such as an edge coupler. A dam structure may be formed on the redistribution structure or the interposer near an edge of the package component, such that the dam is near the edge coupler of the optical integrated circuit die. The dam prevents an underfill that is formed between the package component and the redistribution structure or the interposer from extending along a sidewall of the optical integrated circuit die and from shielding the edge coupler. An optical glue layer may be formed over the dam and may cover the sidewall of the optical integrated circuit die near the edge coupler. The optical glue layer prevents an encapsulant that encapsulates the optical integrated circuit die from extending along the sidewall of the optical integrated circuit die and from shielding the edge coupler. A solder resist trench may be formed in a solder resist layer over the package substrate near an edge of the package component. The solder resist trench allows an underfill that is formed between the package component and the package substrate to at least partially fill the solder resist trench and prevents the underfill from extending along a sidewall of the package component and from shielding the edge coupler of the optical integrated circuit die that is disposed near the sidewall of the package component. Various embodiments presented herein allow for integration of optical integrated circuit dies comprising edge couplers or grating couplers, achieving high bandwidth with ultra-low power consumption through the edge coupler, extensive integration for co-package optics, and no extra cost for adding the dam.

FIG. 1 illustrates a cross-sectional view of an integrated circuit die 50, in accordance with some embodiments. Integrated circuit dies 50 will be packaged in subsequent processing to form integrated circuit packages. Each integrated circuit die 50 may be a logic device (e.g., application-specific integrated circuit (ASIC) die, central processing unit (CPU), graphics processing unit (GPU), microcontroller, etc.), a memory device (e.g., dynamic random access memory (DRAM) die, static random access memory (SRAM) die, etc.), a power management device (e.g., power management integrated circuit (PMIC) die), a radio frequency (RF) device, a sensor device, a micro-electro-mechanical-system (MEMS) device, a signal processing device (e.g., digital signal processing (DSP) die), a front-end device (e.g., analog front-end (AFE) dies), the like, or a combination thereof (e.g., a system-on-a-chip (SoC) die). The integrated circuit die 50 may be formed in a wafer, which may include different die regions that are singulated in subsequent steps to form a plurality of integrated circuit dies 50. The integrated circuit die 50 includes a semiconductor substrate 52, an interconnect structure 54, and conductive connectors 56.

The semiconductor substrate 52 may be a substrate of silicon, doped or undoped, or an active layer of a semiconductor-on-insulator (SOI) substrate. The semiconductor substrate 52 may include other semiconductor materials, such as germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof. Other substrates, such as multi-layered or gradient substrates, may also be used. The semiconductor substrate 52 has an active or a front-side surface (e.g., the surface facing upward) and an inactive or a backside surface (e.g., the surface facing downward). Devices are at the active surface of the semiconductor substrate 52. The devices may be active devices (e.g., transistors, diodes, etc.) and/or passive devices (capacitors, resistors, inductors, etc.). The inactive surface may be free from devices.

The interconnect structure 54 is over the active surface of the semiconductor substrate 52, and is used to electrically connect the devices of the semiconductor substrate 52 to form an integrated circuit. The interconnect structure 54 may include one or more dielectric layer(s) and respective metallization layer(s) in the dielectric layer(s). Acceptable dielectric materials for the dielectric layers include low-k dielectric materials such as phospho-silicate glass (PSG), boro-silicate glass (BSG), boron-doped phospho-silicate glass (BPSG), undoped silicate glass (USG), or the like. Acceptable dielectric materials for the dielectric layers further include oxides such as silicon oxide or aluminum oxide; nitrides such as silicon nitride; carbides such as silicon carbide; the like; or combinations thereof such as silicon oxynitride, silicon oxycarbide, silicon carbonitride, silicon oxycarbonitride or the like. Other dielectric materials may also be used, such as a polymer such as polybenzoxazole (PBO), polyimide, a Benzocyclobutene (BCB) based polymer, or the like. The metallization layers may include conductive vias and/or conductive lines to interconnect the devices of the semiconductor substrate 52. The metallization layers may be formed of a conductive material, such as a metal, such as copper, cobalt, aluminum, gold, combinations thereof, or the like. The interconnect structure 54 may be formed by a damascene process, such as a single damascene process, a dual damascene process, or the like.

Conductive connectors 56 are formed at the front-side 50F of the integrated circuit die 50. The conductive connectors 56 may comprise underbump metallizations (UBMs) 56A and solder regions 56B over the UBMs 56A. The UBMs 56A may be conductive pillars, pads, or the like. In some embodiments, the UBMs 56A may be formed by forming a seed layer over the interconnect structure 54. The seed layer may be a metal layer, which may be a single layer or a composite layer including a plurality of sub-layers formed of different materials. In some embodiments, the seed layer includes a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the UBMs 56A. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may include a metal, such as copper, titanium, tungsten, aluminum, nickel, or the like. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process. The remaining portions of the seed layer and conductive material form the UBMs 56A.

In some embodiments, the UBMs 56A may include three layers of conductive materials, such as a layer of titanium, a layer of copper, and a layer of nickel. Other arrangements of materials and layers, such as an arrangement of chrome/chrome-copper alloy/copper/gold, an arrangement of titanium/titanium tungsten/copper, or an arrangement of copper/nickel/gold, may be utilized for the formation of the UBMs 56A. Any suitable materials or layers of material that may be used for the UBMs 56A are fully intended to be included within the scope of the current application.

The solder regions 56B may comprise a solder material and may be formed over the UBMs 56A by dipping, printing, plating, or the like. The solder material may comprise, for example, lead-based and lead-free solders, such as Pb-Sn compositions for lead-based solder; lead-free solders including InSb; tin, silver, and copper (SAC) compositions; and other eutectic materials that have a common melting point and form conductive solder connections in electrical applications. For lead-free solder, SAC solders of varying compositions may be used, such as SAC 105 (Sn 98.5%, Ag 1.0%, Cu 0.5%), SAC 305, and SAC 405, as examples. Lead-free solders may further include SnCu compounds as well, without the use of silver (Ag). Lead-free solders may also include tin and silver, Sn—Ag, without the use of copper. In some embodiments, a reflow process may be performed, giving the solder regions 56B a shape of a partial sphere in some embodiments. In other embodiments, the solder regions 56B may have other shapes, such as non-spherical shapes.

In some embodiments, the solder regions 56B may be used to perform chip probe (CP) testing on the integrated circuit die 50. For example, the solder regions may be solder balls, solder bumps, or the like, which are used to attach a chip probe to the conductive connectors 56. Chip probe testing may be performed on the integrated circuit die 50 to ascertain whether the integrated circuit die 50 is a known good die (KGD). Thus, only integrated circuit dies 50, which are KGDs, undergo subsequent processing and are packaged, and dies which fail the chip probe testing are not packaged. In some embodiments, after testing, the solder regions 56B may be removed in subsequent processing steps.

Figure 2:
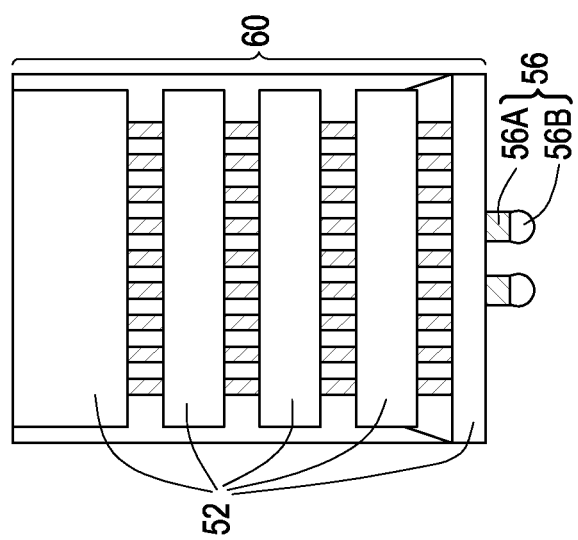
FIG. 2 illustrates a cross-sectional view of an integrated circuit die, in accordance with some embodiments.

FIG. 2 illustrates a cross-sectional view of an integrated circuit die 60, in accordance with some embodiments. The integrated circuit die 60 is a stacked device that includes multiple semiconductor substrates 52. For example, the integrated circuit die 60 may be a memory device that includes multiple memory dies such as a hybrid memory cube (HMC) device, a high bandwidth memory (HBM) device, or the like. In such embodiments, the integrated circuit die 60 includes multiple semiconductor substrates 52 interconnected by through-substrate vias (TSVs) such as through-silicon vias (not shown). Each of the semiconductor substrates 52 may (or may not) have a separate interconnect structure.

Figure 3:
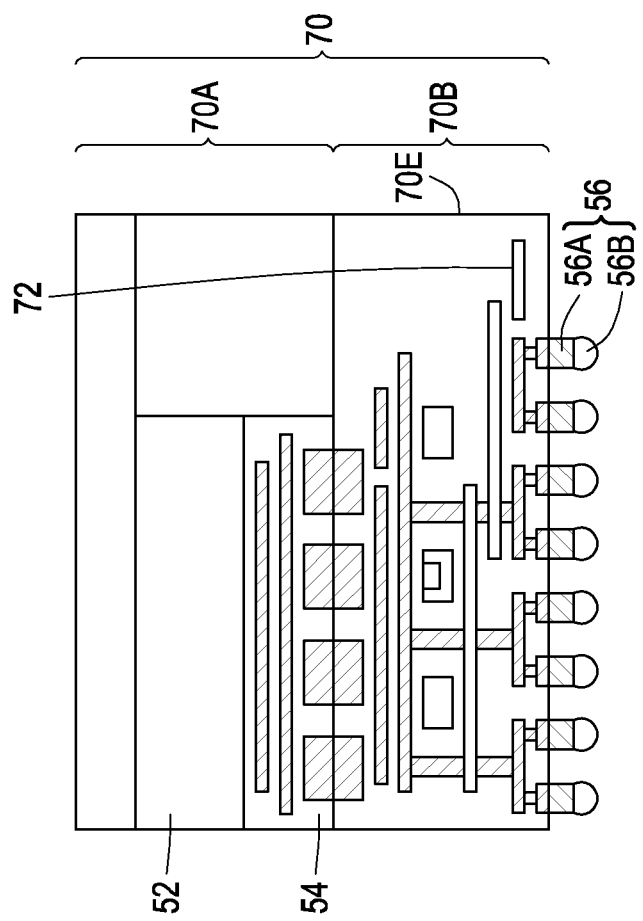
FIG. 3 illustrates a cross-sectional view of an integrated circuit die, in accordance with some embodiments.

FIG. 3 illustrates a cross-sectional view of an integrated circuit die 70, in accordance with some embodiments. The integrated circuit die 70 may be an optical integrated circuit die, such as an optical engine die. The integrated circuit die 70 may include an electrical integrated circuit (EIC) 70A bonded to a photonic integrated circuit (PIC) 70B. The EIC 70A may comprise a semiconductor substrate 52, active and/or passive electric devices on the active side of the semiconductor substrate 52, and an interconnect structure 54 on the active side of the semiconductor substrate 52. The EIC 70A may be formed in a similar manner as the integrated circuit die 50 described above with reference to FIG. 1, and the description is not repeated herein. The PIC 70B may comprise optical devices, such as waveguides, modulators, or the like. The PIC 70B may also include an optical coupler, such as an edge coupler 72. In some embodiments, the edge coupler 72 may comprise a dielectric material (such as, silicon nitride, or the like) and may be formed using physical vapor deposition (PVD), chemical vapor deposition (CVD), or the like. In other embodiments, the edge coupler 72 may comprise a semiconductor layer (such as, a silicon layer, or the like) and may be formed from an SOI substrate. The edge coupler 72 may be disposed within the PIC 70B and near a sidewall (or an edge) 70E of the integrated circuit die 70. As described below with greater detail, the edge coupler 72 provides optical coupling between the integrated circuit die 70 and an optical fiber coupled to the integrated circuit die 70.

The integrated circuit die 70 may be formed in a wafer, which may include different die regions that are singulated in subsequent steps to form a plurality of integrated circuit dies 70. In some embodiments, the wafer may be formed by hybrid bonding an EIC wafer (comprising a plurality of EICs 70A) to a PIC wafer (comprising a plurality of PICs 70B).

Figure 9:
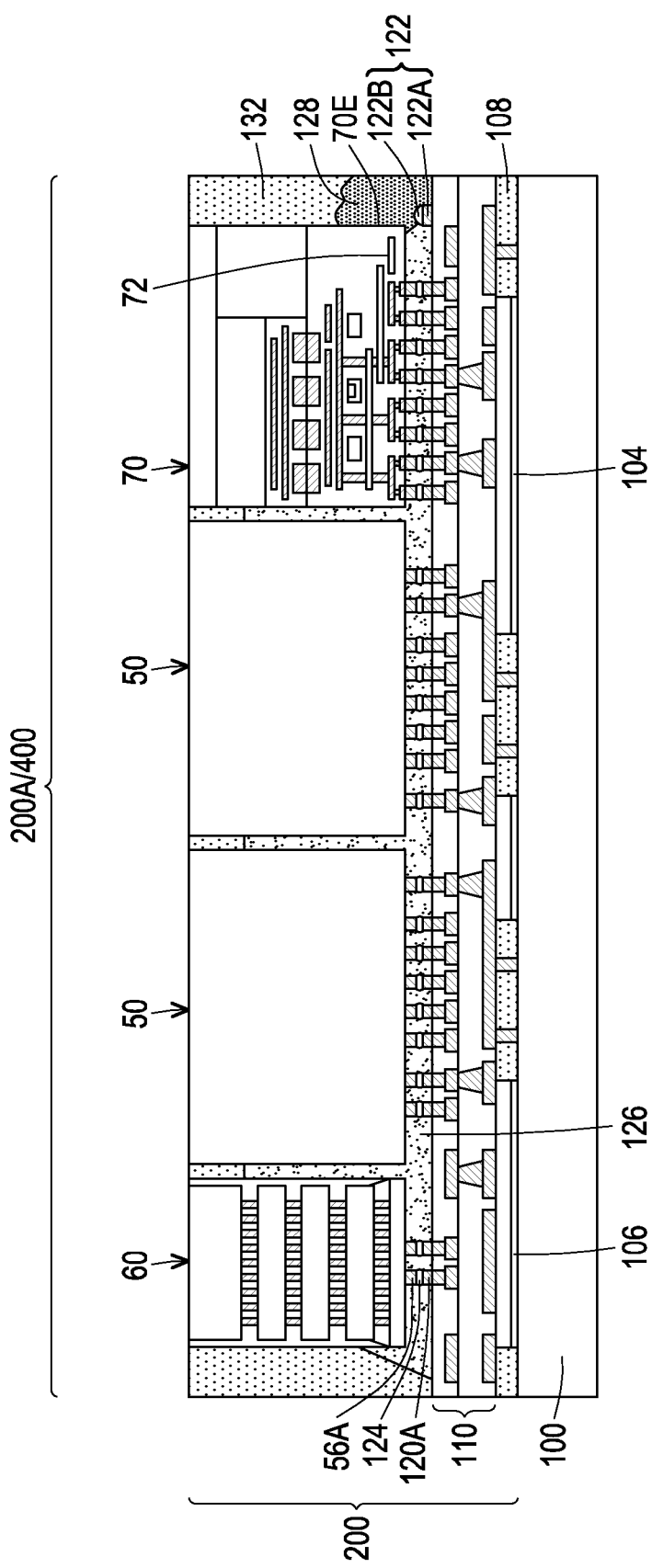
Figure 10:
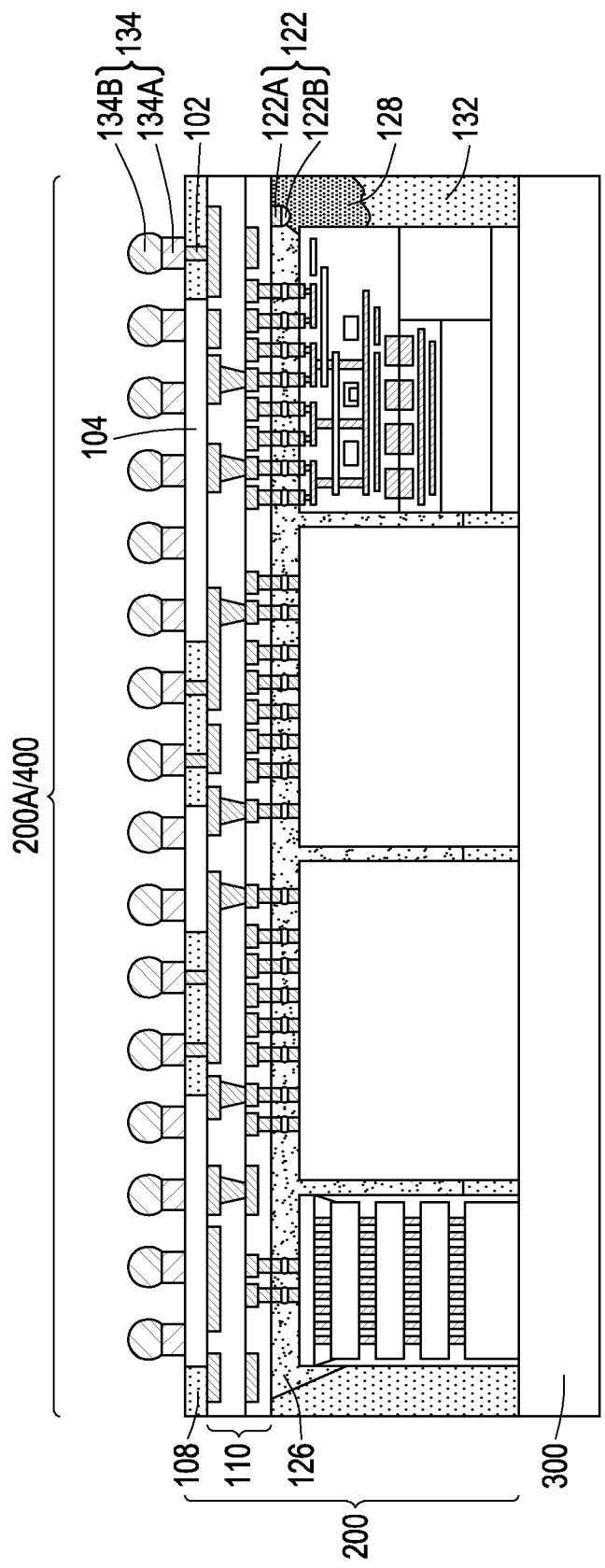
Figure 11A:
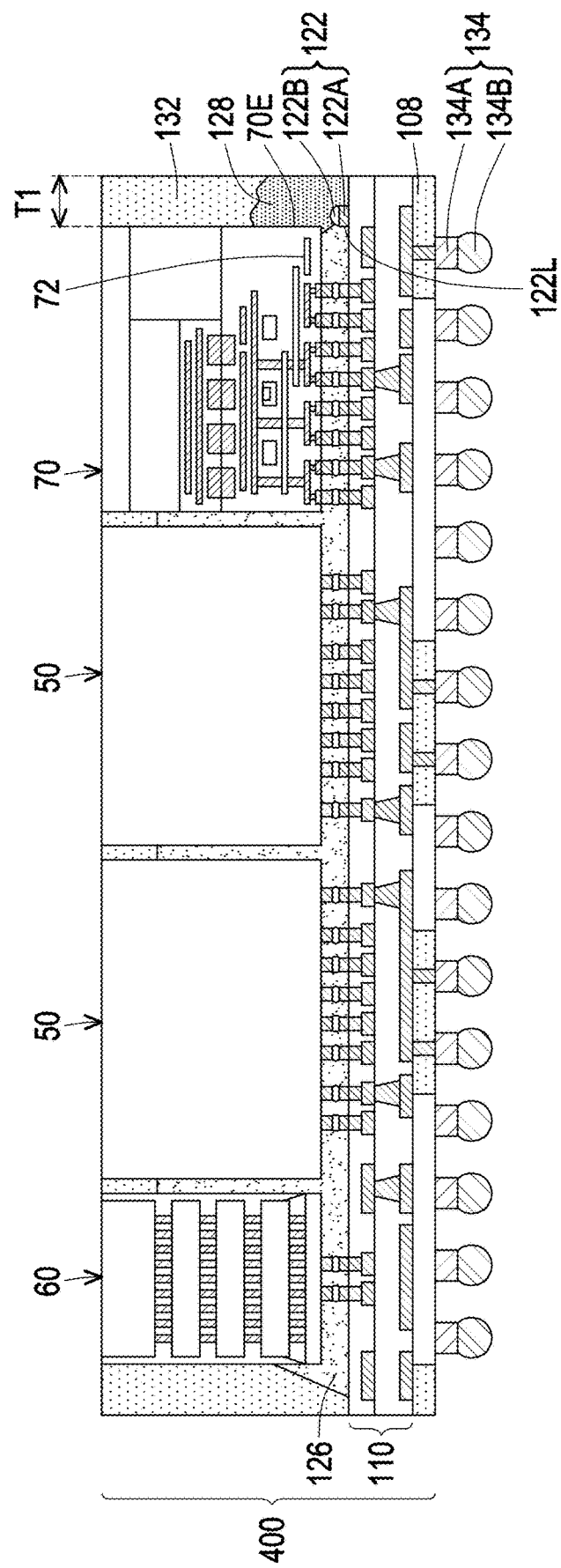
Figure 11B:
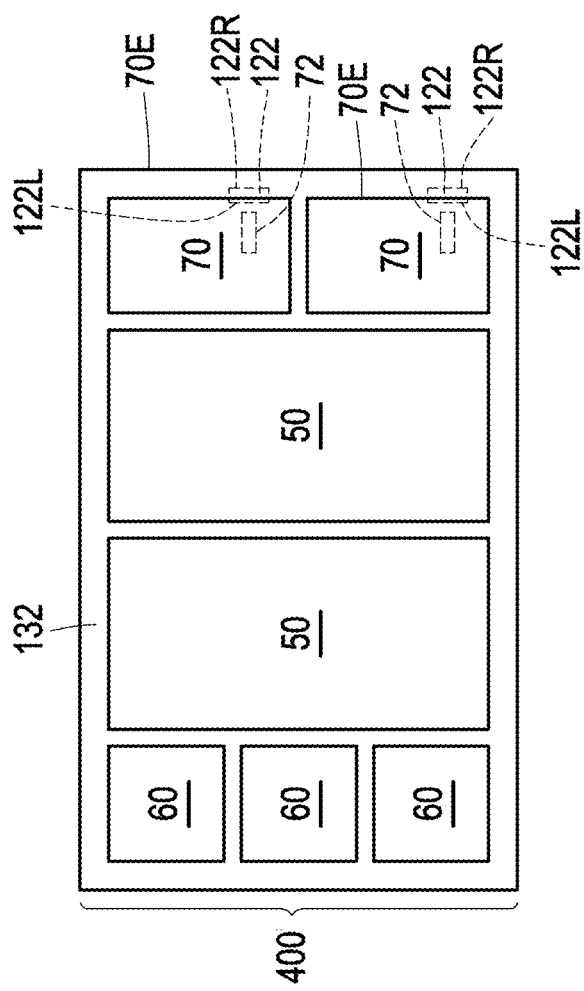

FIGS. 4-7, 8A, 8B, 9, 10, 11A and 11B illustrate top and cross-sectional views of intermediate stages in the manufacturing of package components 400, in accordance with some embodiments. FIGS. 4-7, 8A, 8B, 9, 10, and 11A illustrate cross-sectional views, and FIG. 11B illustrates a top view. In particular, FIGS. 4-7, 8A, 8B, 9, and 10 illustrate formation of a wafer-level package component 200, in accordance with some embodiments. In some embodiments, the wafer-level package component 200 comprises a plurality of die-level regions (such as a region 200A) that correspond to die-level package components (such as package components 400). The plurality of die-level regions of the wafer-level package component 200 are singulated to form individual die-level packaged components 400 as described below in FIGS. 11A and 11B.

In FIG. 4, a carrier wafer 100 is provided or formed. The carrier wafer 100 is used as a platform or a support for a packaging process described below. In some embodiments, the carrier wafer 100 comprises a semiconductor material (such as silicon, or the like), a dielectric material (such as glass, a ceramic material, quartz, or the like), a combination thereof, or the like.

In some embodiments, conductive vias 102 are formed on the carrier wafer 100. The conductive vias 102 may be also referred to as through vias, through molding vias, or through encapsulant vias. As an example to form the conductive vias 102, a seed layer (not shown) is formed over the carrier wafer 100. In some embodiments, the seed layer is a metal layer, which may be a single layer or a composite layer comprising a plurality of sub-layers formed of different materials. In a particular embodiment, the seed layer comprises a titanium layer and a copper layer over the titanium layer. The seed layer may be formed using, for example, PVD or the like. A photoresist is formed and patterned on the seed layer. The photoresist may be formed by spin coating or the like and may be exposed to light for patterning. The pattern of the photoresist corresponds to conductive vias. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the conductive vias 102.

In some embodiments, the integrated circuit dies 104 are attached to the carrier wafer. The integrated circuit dies 104 may be embedded local interconnect (eLSI) dies. The integrated circuit dies 104 may have a similar structure as the integrated circuit die 50 described above with reference to FIG. 1, and the description is not repeated herein. In some embodiments, the integrated circuit dies 104 comprise passive electrical devices and do not comprise active electrical devices. In some embodiments, the integrated circuit dies 104 comprise both active and passive electrical devices.

In some embodiments, backsides 104B of the integrated circuit dies 104 are attached to the carrier wafer 100, such that front sides 104F (such as sides on which electrical device and conducive interconnects are formed) of the integrated circuit dies 104 face away from the carrier wafer 100. In some embodiments, the integrated circuit dies 104 are attached to the carrier wafer 100 using adhesives 106. The adhesives 106 may be any suitable adhesive, epoxy, die attach film (DAF), or the like. The adhesives 106 may be applied to the backsides 104B of the integrated circuit dies 104 or may be applied over a surface of the carrier wafer 100.

In FIG. 5, an encapsulant 108 is formed on and around the integrated circuit dies 104 and the conductive vias 102. After formation, the encapsulant 108 encapsulates the integrated circuit dies 104 and the conductive vias 102. The encapsulant 108 may be a molding compound, epoxy, or the like. The encapsulant 108 may be applied by compression molding, transfer molding, or the like, and is formed over the carrier wafer 100 such that the integrated circuit dies 104 and the conductive vias 102 are buried or covered. The encapsulant 108 may be applied in liquid or semi-liquid form and then subsequently cured. The encapsulant 108 may be thinned to expose the integrated circuit dies 104. The thinning process may be a grinding process, a chemical mechanical polishing (CMP), an etch-back, combinations thereof, or the like. After the thinning process, the front side surfaces 104F of the integrated circuit dies 104, top surfaces of the conductive vias 102, and a top surface of the encapsulant 108 are coplanar (within process variations), such that they are level with one another. The thinning is performed until a desired amount of the integrated circuit dies 104, the encapsulant 108, and/or the conductive vias 102 has been removed.

Figure 6:
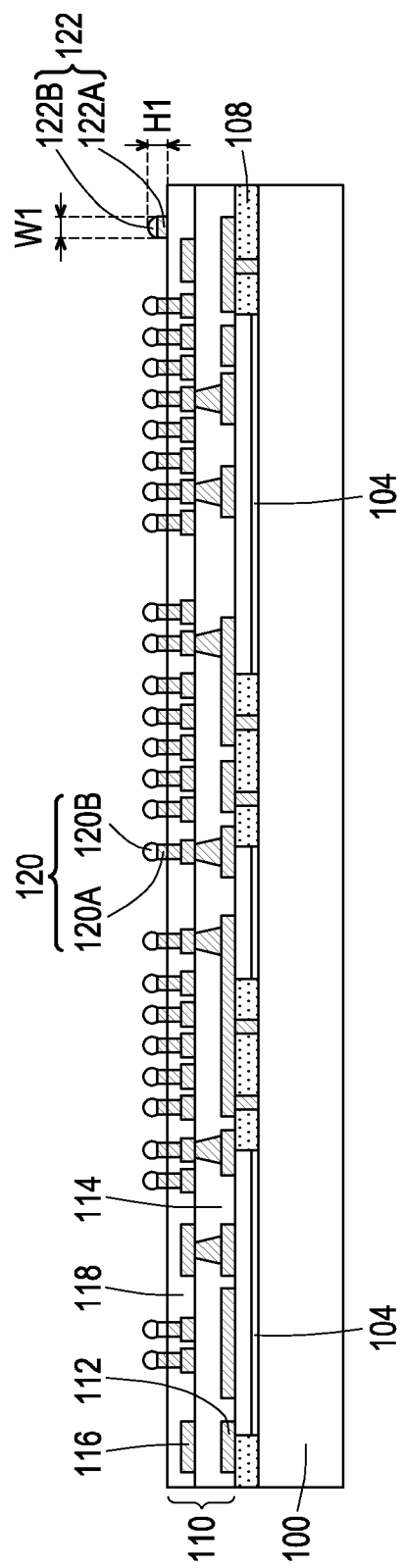

In FIG. 6, a redistribution structure 110 is formed over the integrated circuit dies 104, the encapsulant 108, and the conductive vias 102. In the embodiment shown, the redistribution structure 110 includes metallization patterns 112 and 116 (sometimes referred to as redistribution layers or redistribution lines) and insulating layers 114 and 118.

The metallization pattern 112 may be formed on the integrated circuit dies 104, the encapsulant 108, and the conductive vias 102. As an example to form the metallization pattern 112, a seed layer is formed over the integrated circuit dies 104, the encapsulant 108, and the conductive vias 102. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist (not shown) is then formed and patterned on the seed layer. The photoresist may be formed by spin coating or the like and may be exposed to light for patterning. The pattern of the photoresist corresponds to the metallization pattern 112. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the metallization pattern 112.

The insulating layer 114 may be formed on the metallization pattern 112. In some embodiments, the insulating layer 114 is formed of a polymer, which may be a photo-sensitive material such as PBO, polyimide, BCB, or the like, that may be patterned using a lithography mask. In other embodiments, the insulating layer 114 is formed of a nitride such as silicon nitride; an oxide such as silicon oxide, PSG, BSG, BPSG; or the like. The insulating layer 114 may be formed by spin coating, lamination, CVD, the like, or a combination thereof. The insulating layer 114 is then patterned to form openings exposing portions of the metallization pattern 112. The patterning may be performed by an acceptable process, such as by exposing the insulating layer 114 to light when the insulating layer 114 is a photo-sensitive material or by etching using, for example, an anisotropic etch. If the insulating layer 114 is a photo-sensitive material, the insulating layer 114 can be developed after the exposure.

The metallization pattern 116 is then formed. The metallization pattern 116 includes conductive elements extending along the major surface of the insulating layer 114 and extending through the insulating layer 114 to physically and electrically couple to the metallization pattern 112. As an example to form the metallization pattern 116, a seed layer is formed over the insulating layer 114 and in the openings extending through the insulating layer 114. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the metallization pattern 116. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The combination of the conductive material and underlying portions of the seed layer form the metallization pattern 116. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching.

After forming the metallization pattern 116, an insulating layer 118 is formed over the metallization pattern 116 and the insulating layer 114. The insulating layer 118 may be formed using similar materials and methods as the insulating layer 114. In the illustrated embodiment, the redistribution structure 110 includes two metallization patterns (such as metallization patterns 112 and 116) and two insulating layers (such as the insulating layers 114 and 118). In some embodiments, the redistribution structure 110 may include any number of insulating layers and metallization patterns. If more insulating layers and metallization patterns are to be formed, steps and processes discussed above may be repeated.

Further in FIG. 6, conductive connectors 120 are formed on and in electrical contact with the redistribution structure 110. The conductive connectors 120 may be ball grid array (BGA) connectors, solder balls, metal pillars, controlled collapse chip connection (C4) bumps, micro bumps, electroless nickel-electroless palladium-immersion gold (ENEPIG) technique formed bumps, or the like. The conductive connectors 120 may include a conductive material such as solder, copper, aluminum, gold, nickel, silver, palladium, tin, the like, or a combination thereof. In some embodiments, the conductive connectors 120 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 120 comprise metal pillars (such as copper pillars) formed by a sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

In some embodiments, the conductive connectors 120 comprise UBMs 120A and solder regions 120B over the UBMs 120A. The UBMs 120A may be formed using similar materials and methods as the UBMs 56A described above with reference to FIG. 1, and the description is not repeated herein. The solder regions 120B may be formed using similar materials and methods as the solder regions 56B described above with reference to FIG. 1, and the description is not repeated herein.

In some embodiments, one or more dam structures 122 are formed over the redistribution structure 110, such as over the insulating layer 118. The dam structure 122 may comprise a lower portion 122A, and an upper portion 122B over the lower portion 122A. In some embodiments, the conductive connectors 120 and the one or more dam structures 122 are formed in a same process, such that the lower portions 122A of the dam structure 122 are formed in a same process as the UBMs 120A, and the upper portions 122B of the dam structure 122 are formed in a same process as the solder regions 120B. In such embodiments, the lower portions 122A of the dam structures 122 and the UBMs 120A comprise a same material, and the upper portions 122B of the dam structures 122 and the solder regions 120B comprise a same material. In some embodiments, the lower portions 122A of the dam structures 122 and the UBMs 120A have a same width. In other embodiments, lower portions 122A of the dam structures 122 and the UBMs 120A have different widths. In some embodiments, the dam structures 122 and the conductive connectors 120 have a same height. In other embodiments, the dam structures 122 and the conductive connectors 120 have different heights. The dam structures 122 have a height H1 and a width W1. The height H1 may be between about 5 μm and about 80 μm. The width W1 may be between about 20 μm and about 1.0 mm. A ratio of the height H1 to the width W1 (H1/W1) may be between about 0.1 and about 1.5.

In some embodiments, the one or more dam structures 122 may be electrically dummy or electrically non-fictional structures. In such embodiments, the one or more dam structures 122 may be electrically isolated from the conductive connectors 120 and the metallization patterns 112 and 116 of the redistribution structure 110 by the insulating layers 114 and 118 of the redistribution structure 110.

Figure 7:
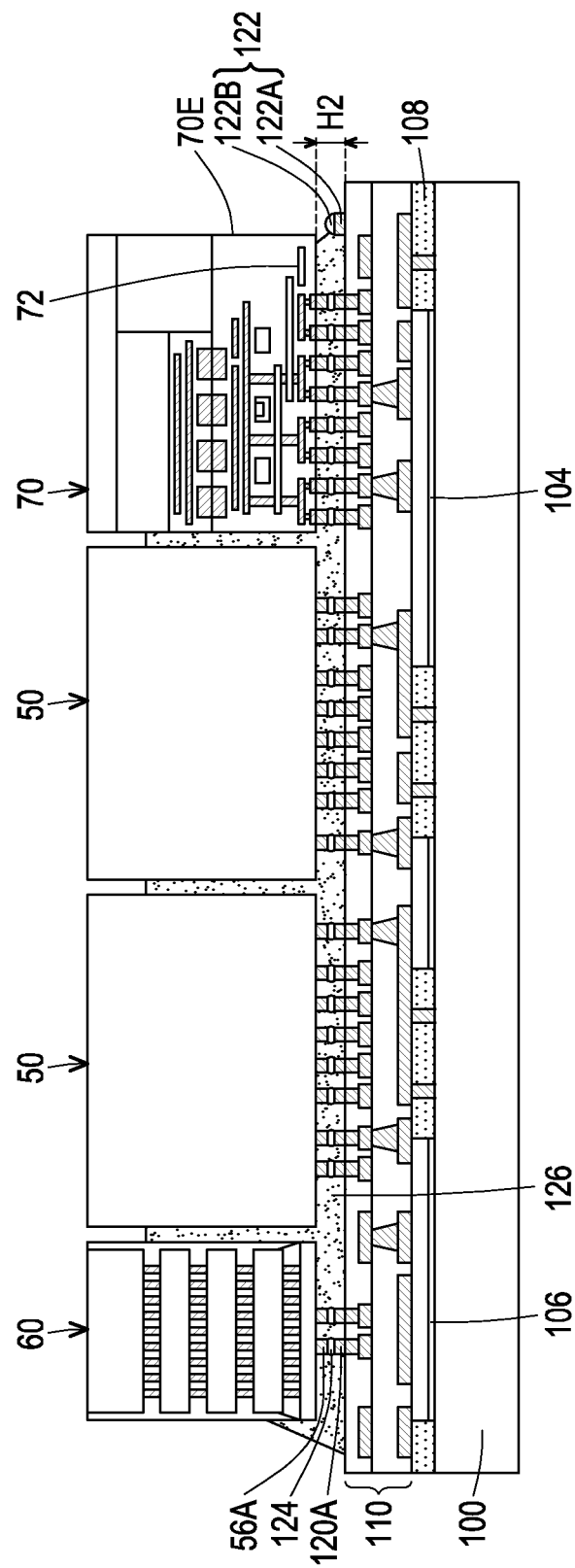

In FIG. 7, integrated circuit dies 50, 60 and 70 are attached to the redistribution structure 110. In the illustrated cross-sectional view, each die-level region (such as the region 200A illustrated in FIG. 9) of the wafer-level package component 200 (see FIG. 9) comprises two integrated circuit dies 50, a single integrated circuit die 60 and a single integrated circuit die 70. The first one of the integrated circuit dies 50 may be a logic device, such as an application-specific integrated circuit (ASIC) die, a central processing unit (CPU), a graphics processing unit (GPU), a system-on-a-chip (SoC), a microcontroller, or the like. The second one of the integrated circuit dies 50 may be a memory device, such as a dynamic random access memory (DRAM) die, a static random access memory (SRAM) die, or the like. In some embodiments, the integrated circuit dies 50 may be the same type of dies, such as SoC dies, ASIC dies, or the like. Although a single integrated circuit die 60 and a single integrated circuit die 70 are shown in the cross-sectional view in FIG. 7, there may be a plurality of integrated circuit dies 60 and a plurality of single integrated circuit dies 70 in each die-level region (such as the region 200A illustrated in FIG. 9) of the wafer-level package component 200 (see FIG. 9) as shown in FIG. 11B, as an example.

In some embodiments, the integrated circuit dies 50, 60 and 70 are attached to the redistribution structure 110 using the conductive connectors 56 (see FIGS. 1-3) and 120 (see FIG. 6). The integrated circuit dies 50, 60 and 70 may be placed on the redistribution structure 110 using, e.g., a pick-and-place tool. After placing the integrated circuit dies 50, 60 and 70 on the redistribution structure 110, the solder regions 56B of the conductive connectors 56 (see FIGS. 1-3) are in physical contact with respective solder regions 120B of respective conductive connectors 120 (see FIG. 6). After placing the integrated circuit dies 50, 60 and 70 on the redistribution structure 110, a reflow process in performed on the conductive connectors 56 and 120 (see FIGS. 1-3 and 6). The reflow process melts and merges the solder regions 56B and 120B into solder joints 124. The solder joints 124 electrically and mechanically couple the integrated circuit dies 50, 60 and 70 to the redistribution structure 110.

Further in FIG. 7, an underfill 126 may be formed around the solder joints 124, and in a gap between the redistribution structure 110 and the integrated circuit dies 50, 60 and 70. The gap may have a height H2 between about 5 μm and about 55 μm. The height H2 of the gap may be greater than the height H1 (see FIG. 6) of the dam structures 122. A ratio of the height H1 to the height H2 (H1/H2) may be between about 0.1 and about 0.95. The underfill 126 may reduce stress and protect the solder joints 124. The underfill 126 may be formed of an underfill material such as a molding compound, epoxy, or the like. The underfill 126 may be formed by a capillary flow process after the integrated circuit dies 50, 60 and 70 are attached to the redistribution structure 110, or may be formed by a suitable deposition method before the integrated circuit dies 50, 60 and 70 are attached to the redistribution structure 110. The underfill 126 may be applied in liquid or semi-liquid form and then subsequently cured. In some embodiments, the underfill 126 partially or fully fills gaps between adjacent ones of the integrated circuit dies 50, 60 and 70, such that the underfill 126 extends along sidewalls of the integrated circuit dies 50, 60 and 70. In some embodiments, the dam structure 122 prevents the underfill 126 from physically contacting and extending along the sidewall 70E of the integrated circuit die 70. In such embodiments, the dam structure 122 is in physical contact with the underfill 126. Accordingly, the underfill 126 does not shield the edge coupler 72 of the integrated circuit die 70.

Figure 8A:
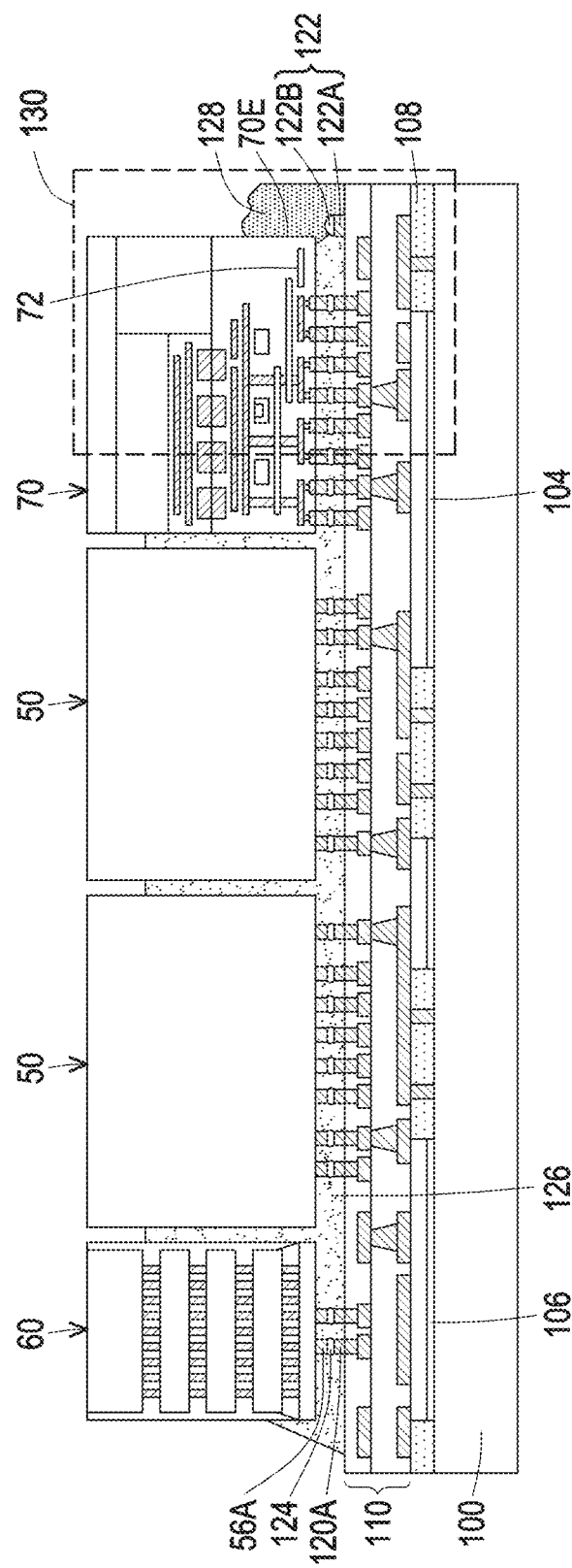
Figure 8B:
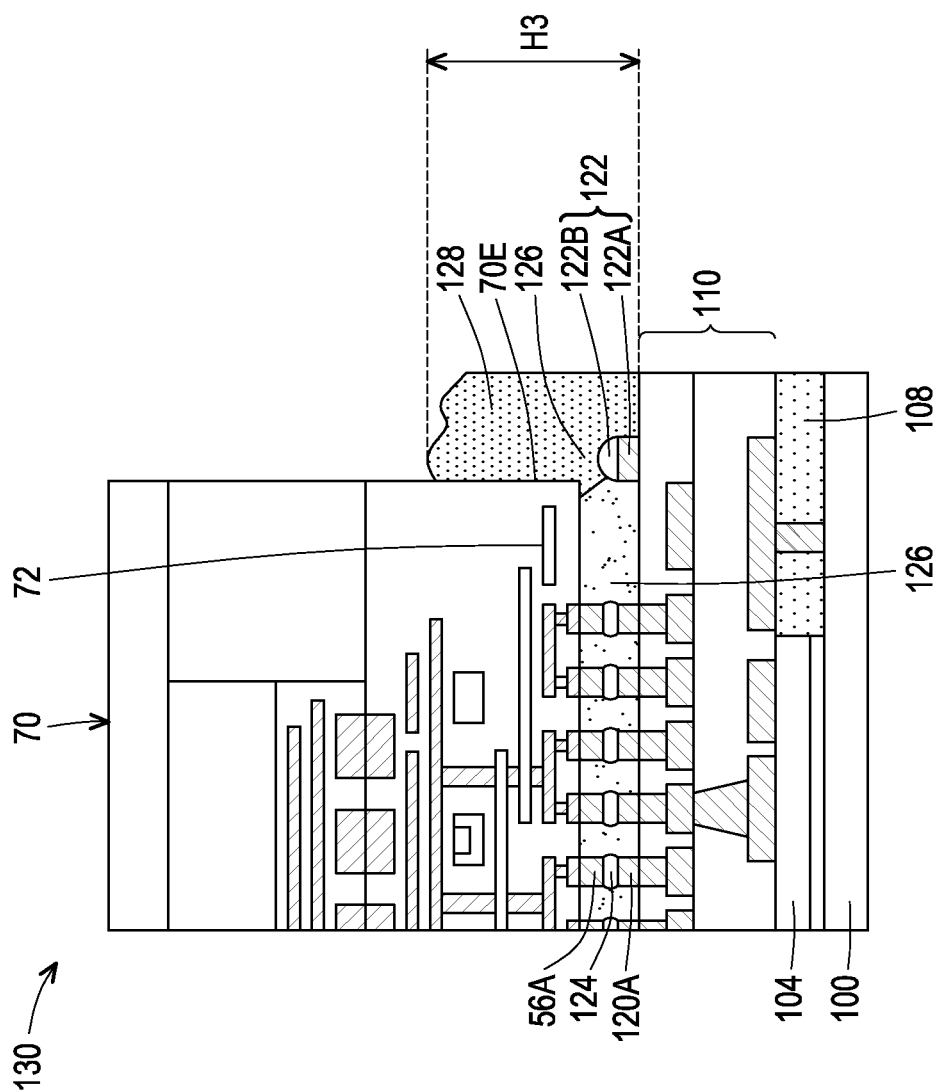

FIGS. 8A and 8B illustrate the structure of FIG. 7 after formation an optical glue 128, in accordance with some embodiments. FIG. 8A illustrates a cross-sectional view, and FIG. 8B illustrates a magnified view of a region 130 of FIG. 8A. In some embodiment, the optical glue 128 comprises a polymer material such as epoxy-acrylate oligomers. The polymer material may have a refractive index between about 1 and about 3. In some embodiments, the optical glue 128 is formed over the redistribution structure 110 near the sidewall 70E of the integrated circuit die 70, such that the optical glue 128 covers the dam structure 122. The optical glue 128 is in physical contact with the dam structure 122 and the underfill 126. Furthermore, the optical glue 128 extends along and is in physical contact with the sidewall 70E of the integrated circuit die 70. The optical glue 128 may have a height H3 between about 6 µm and about 787 µm. In some embodiments, the height H3 of the optical glue 128 is less than a height of the integrated circuit die 70.

In FIG. 9, an encapsulant 132 is formed on and around the integrated circuit dies 50, 60 and 70. After formation, the encapsulant 132 encapsulates the integrated circuit dies 50, 60 and 70, the underfill 126, and the optical glue 128. The optical glue 128 prevents the encapsulant 132 from shielding the edge coupler 72 of the integrated circuit die 70. The encapsulant 132 may be a molding compound, epoxy, or the like. The encapsulant 132 may not include fillers therein. The encapsulant 132 may be applied by compression molding, transfer molding, or the like, and is formed over the carrier wafer 100 such that the integrated circuit dies 50, 60 and 70 are buried or covered. The encapsulant 132 may be applied in liquid or semi-liquid form and then subsequently cured. The encapsulant 132 may be thinned to expose the integrated circuit dies 50, 60 and 70. The thinning process may be a grinding process, a CMP, an etch-back, combinations thereof, or the like. After the thinning process, top surfaces of the integrated circuit dies 50, 60 and 70, and the encapsulant 132 are coplanar (within process variations), such that they are level with one another. The thinning is performed until a desired amount of the integrated circuit dies 50, 60 and 70, and/or the encapsulant 132 has been removed. In some embodiments, the encapsulants 108 and 132 comprise a same material. In some embodiments, the encapsulants 108 and 132 comprise different materials. A refractive index of the encapsulant 132 may be between about 1.5 and about 3.0. In some embodiments, a difference between the refractive index of the optical glue 128 and the refractive index of the encapsulant 132 is between about 0.2 and about 0.3.

In FIG. 10, the carrier wafer 100 (see FIG. 9) is de-bonded from the wafer-level package component 200, such that the carrier wafer 100 is de-bonded from the encapsulant 108 and the integrated circuit dies 104. In some embodiments, the de-bonding process may also remove adhesives 106 from the integrated circuit dies 104. Subsequently, the wafer-level package component 200 is flipped over and attached to a carrier wafer 300. The carrier wafer 300 may be formed using similar materials and methods as the carrier wafer 100 described above with reference to FIG. 4, and the description is not repeated herein. In some embodiments, the wafer-level package component 200 is attached to the carrier wafer 300 using an adhesive (not shown).

After attaching the wafer-level package component 200 to the carrier wafer 300, conductive connectors 134 are formed over the integrated circuit dies 104 and the encapsulant 108. The conductive connectors 134 are electrically coupled to the conductive vias 102 and/or integrated circuit dies 104. The conductive connectors 134 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 134 may be formed using similar materials and methods as the conductive connectors 120 described above with reference to FIG. 6, and the description is not repeated herein. In the illustrated embodiment, the conductive connectors 134 comprise UBMs 134A, and solder regions 134B over the UBMs 134A. The UBMs 134A and the solder regions 134B may be formed using similar material and methods as the UBMs 120A and the solder regions 120B, respectively, described above with reference to FIG. 6, and the description is not repeated herein.

Further, a singulation process is performed on the wafer-level package component 200 by cutting along scribe line regions, e.g., around the region 200A. The singulation process may include sawing, etching, dicing, a combination thereof, or the like. For example, the singulation process can include sawing the encapsulants 108 and 132, the redistribution structure 110 and the optical glue 128. The singulation process singulates the region 200A from adjacent regions to form a singulated package component 400 illustrated in FIGS. 11A and 11B. The singulated package component 400 is from the region 200A.

FIGS. 11A and 11B illustrate top and cross-sectional views of the package component 400, in accordance with some embodiments. In particular, FIG. 11A illustrates a cross-sectional view and FIG. 11B illustrates a top view. Furthermore, not all features of the package component 400 are illustrated in the top view of FIG. 11B for clarity of presentation. As a result of the singulation process described above with reference to FIG. 10, the outer sidewalls of the encapsulants 108 and 132, the redistribution structure 110, and the optical glue 128 are laterally coterminous (within process variations) as illustrated in FIG. 11A. After the singulation process, the encapsulant 132 has a thickness T1 on the sidewall 70E of the integrated circuit die 70. The thickness T1 may be between about 5 mm to about 10 mm. In some embodiments, the dam structures 122 have a rectangular shape in a plan view as illustrated in FIG. 11B. In other embodiments, the dam structures 122 may have any desired shape in the plan view based on design requirement of the package component 400. In the illustrated embodiment, the dam structures 122 overlap with respective integrated circuit dies 70, such that sidewalls 122L of the dam structures 122 are covered by the respective integrated circuit dies 70, while sidewalls 122R (opposite to the sidewalls 122L) of the dam structures 122 are not covered by the respective integrated circuit dies 70 as shown in FIG. 11B.

Figure 12A:
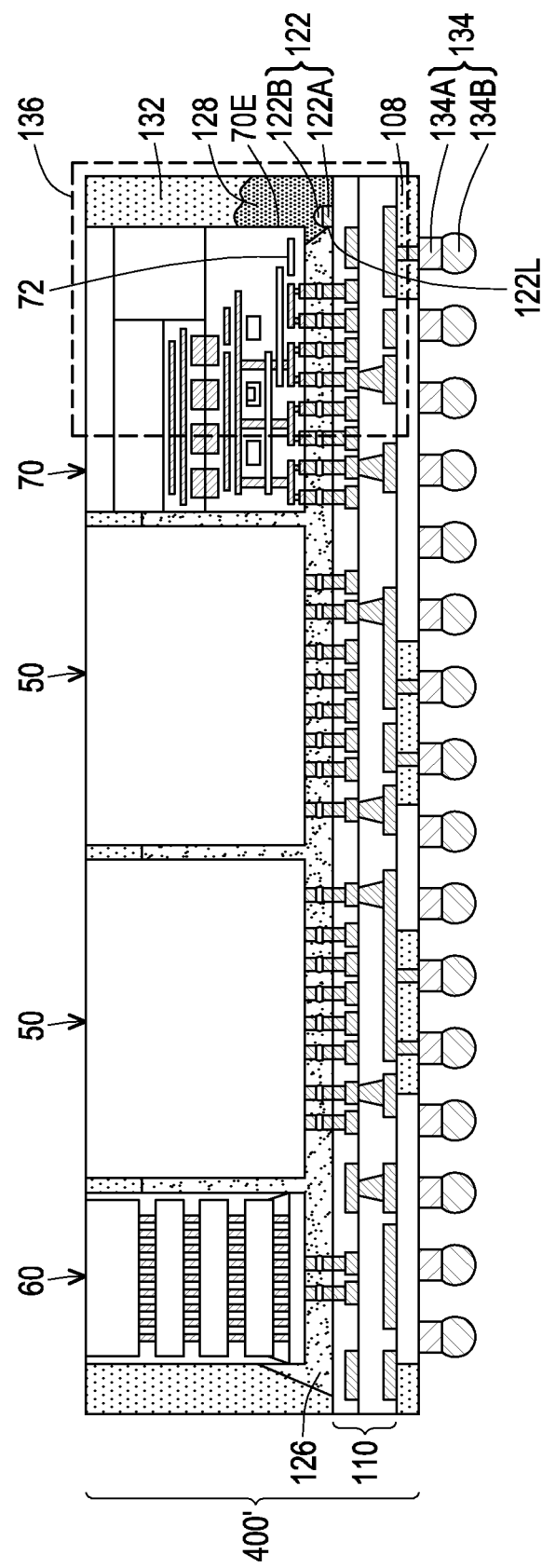
FIGS. 12A, 12B and 12C illustrate top and cross-sectional views of a package component, in accordance with some embodiments.
Figure 12B:
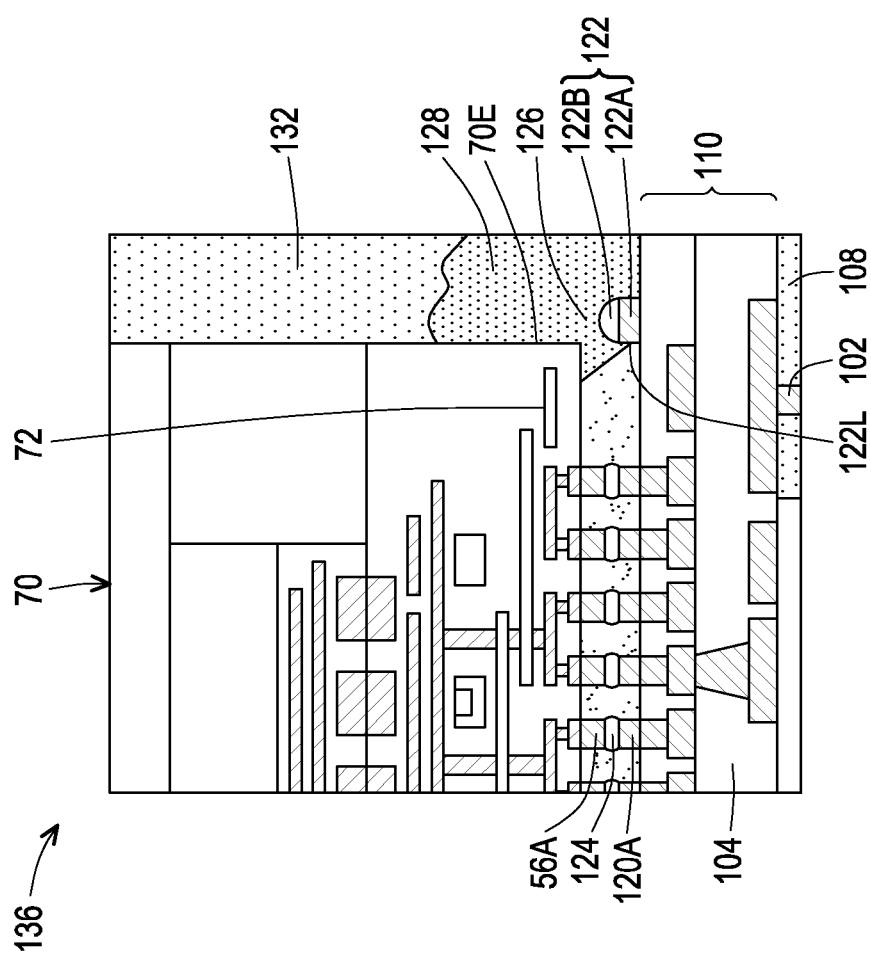
Figure 12C:
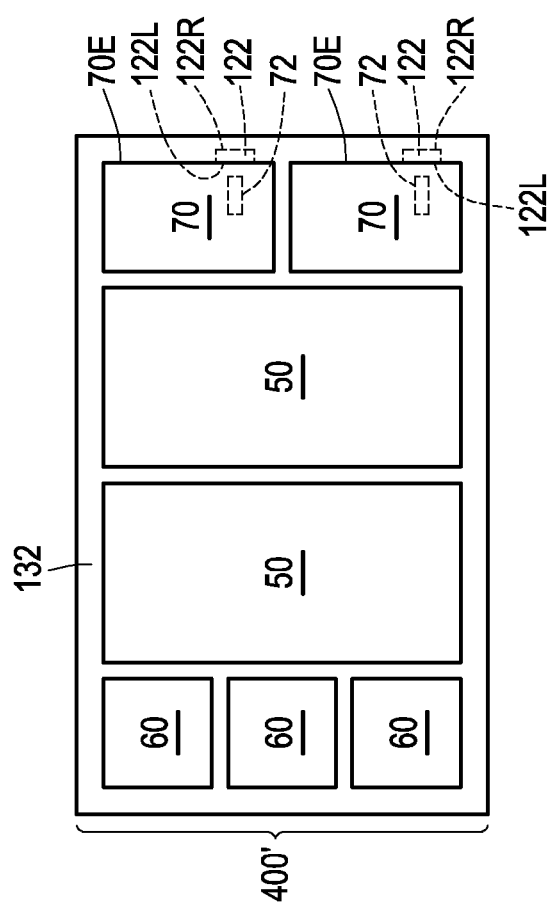

FIGS. 12A, 12B and 12C illustrate top and cross-sectional views of a package component 400', in accordance with some embodiments. In particular, FIG. 12A illustrates a cross-sectional view, FIG. 12B illustrates a magnified view of a region 136 of FIG. 12A, and FIG. 12C illustrates a top view. Furthermore, not all features of the package component 400' are illustrated in the top view of FIG. 12C for clarity of presentation. The package component 400' is similar to the package component 400, with similar features being labeled by similar numerical references, and descriptions of the similar features are not repeated herein. The package component 400' may be formed using process steps that are similar to the process steps described above with reference to FIGS. 4-7, 8A, 8B, 9, 10, 11A and 11B, and the description is not repeated herein. The dam structures 122 of the package component 400' are formed such that the dam structures 122 do not overlap with respective integrated circuit dies 70 in a plan view as shown in FIG. 12C. In illustrated embodiment, sidewalls 122L of the dam structures 122 are vertically aligned with sidewalls 70E of respective integrated circuit dies 70. Accordingly, sidewalls 122L of the dam structures 122 are illustrated as collinear with the sidewalls 70E of the respective integrated circuit dies 70 in the top view shown in FIG. 12C. Sidewalls 122R (opposite to the sidewalls 122L) of the dam structures 122 are not covered by the respective integrated circuit dies 70 as shown in FIG. 12C.

Figure 13:
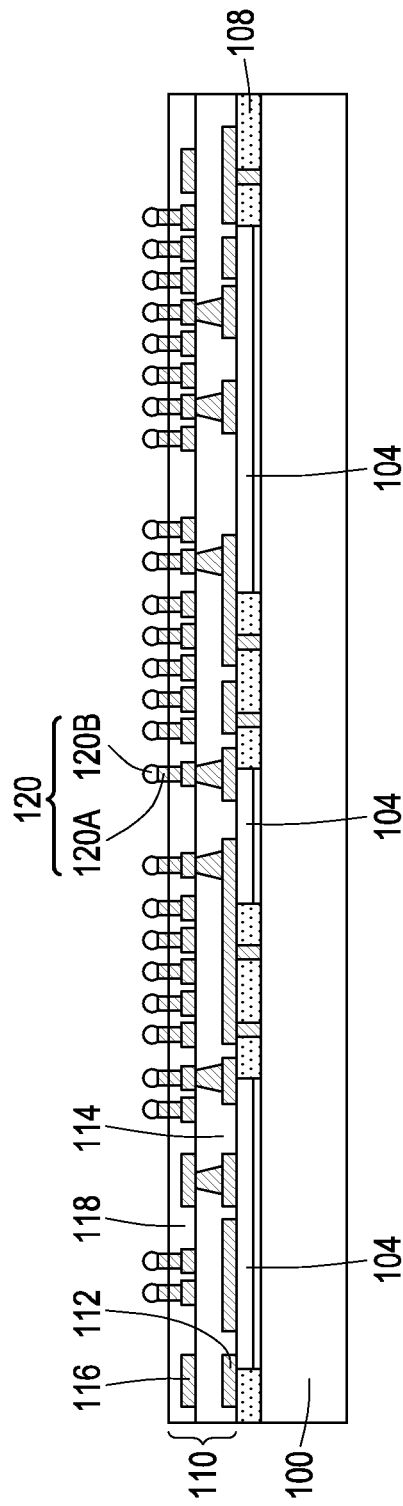
FIGS. 13-16 illustrate cross-sectional views of intermediate stages in the manufacturing of package components, in accordance with some embodiments.
Figure 14:
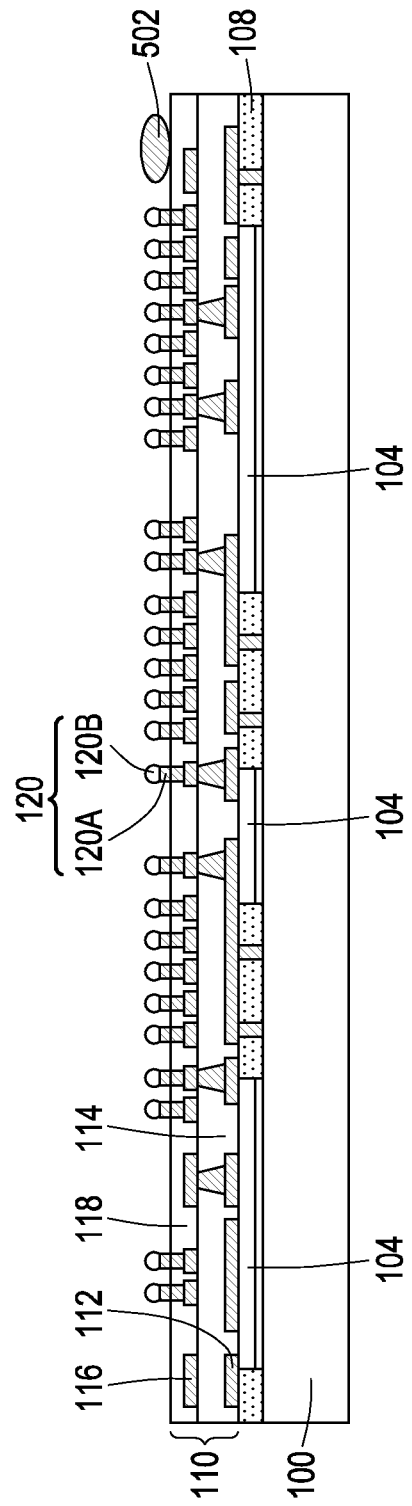
Figure 15:
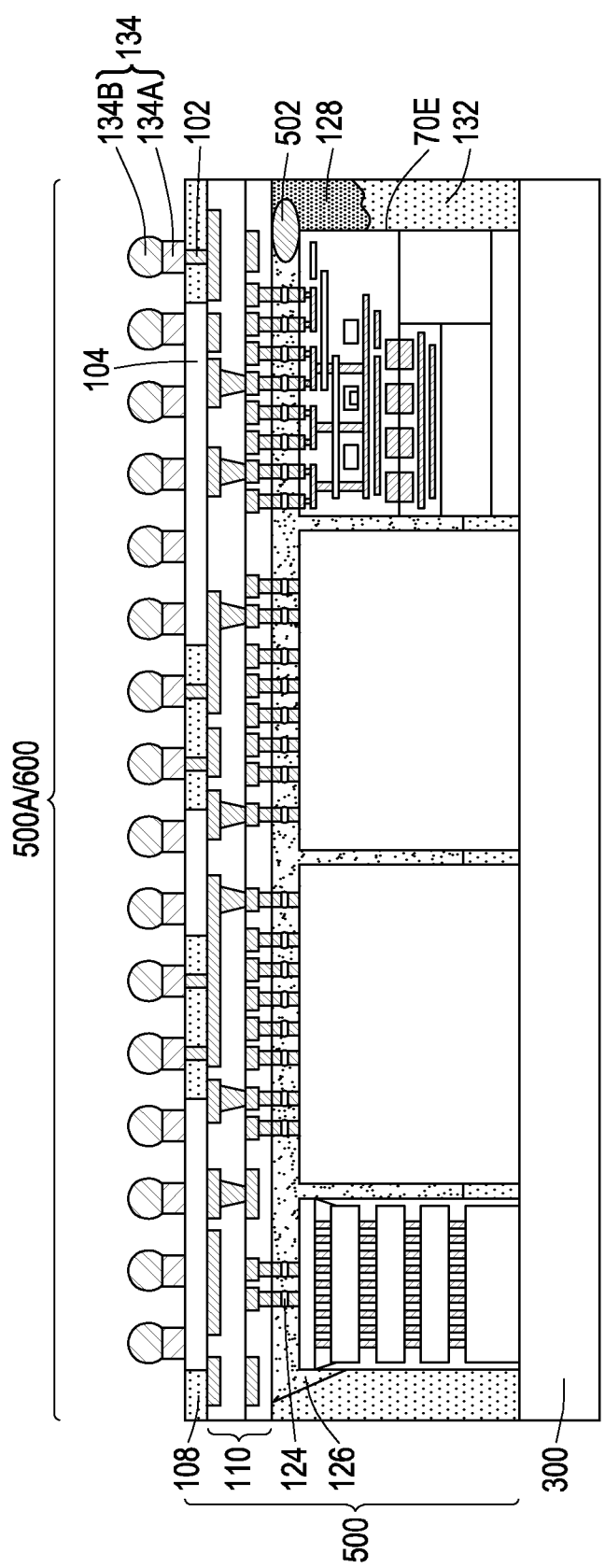

FIGS. 13-16 illustrate cross-sectional views of intermediate stages in the manufacturing of package components 600, in accordance with some embodiments. FIGS. 13-15 illustrate formation of a wafer-level package component 500, in accordance with some embodiments. In some embodiments, the wafer-level package component 500 comprises a plurality of die-level regions (such as a region 500A) that correspond to die-level package components (such as package components 600). The plurality of die-level regions of the wafer-level package component 500 are singulated to form individual die-level packaged components 600 as described below in FIG. 16. Process steps described below with reference to FIGS. 13-16 are similar to the process steps described above with reference to FIGS. 4-7, 8A, 8B, 9, 10, 11A and 11B, and descriptions of the similar processes and structures are not repeated. In distinction with the package component 400 (see FIGS. 11A and 11B), the package component 600 comprises one or more dam structures 502 instead of the one or more dam structures 122 (see FIGS. 11A and 11B).

In FIG. 13, a carrier wafer 100 is provided or formed. The carrier wafer 100 is used as a platform or a support for a packaging process described below. In some embodiments, the carrier wafer 100 comprises a semiconductor material (such as silicon, or the like), a dielectric material (such as glass, a ceramic material, quartz, or the like), a combination thereof, or the like.

In some embodiments, conductive vias 102 are formed on the carrier wafer 100 as described above with reference to FIG. 4, and the description is not repeated herein. Subsequently, integrated circuit dies 104 are attached to the carrier wafer 100 as described above with reference to FIG. 4, and the description is not repeated herein. The integrated circuit dies 104 may be embedded local interconnect (eLSI) dies.

In some embodiments, an encapsulant 108 is formed on and around the integrated circuit dies 104 and the conductive vias 102 as described above with reference to FIG. 5, and the description is not repeated herein. The encapsulant 108 may be thinned to expose the integrated circuit dies 50. The thinning process may be a grinding process, a CMP, an etch-back, combinations thereof, or the like. After the thinning process, front side surfaces 104F of the integrated circuit dies 104, top surfaces of the conductive vias 102, and a top surface of the encapsulant 108 are coplanar (within process variations), such that they are level with one another. The thinning is performed until a desired amount of the integrated circuit dies 104, the encapsulant 108, and/or the conductive vias 102 has been removed.

After forming the encapsulant 108, a redistribution structure 110 is formed over the integrated circuit dies 104, the encapsulant 108, and the conductive vias 102 as described above with reference to FIG. 6, and the description is not repeated herein. Subsequently, conductive connectors 120 are formed on and in electrical contact with the redistribution structure 110 as described above with reference to FIG. 6, and the description is not repeated herein.

In FIG. 14, after forming the conductive connectors 120, one or more dam structures 502 are formed on the redistribution structure 110. The dam structures 502 may comprise a metallic material, an underfill material, a polymer material, a dielectric material, or the like, and may be formed using a suitable deposition process. In some embodiments, the dam structures 502 have a rectangular shape in a plan view. In other embodiments, the dam structures 502 may have any desired shape in the plan view based on design requirement of the package component 600. In the illustrated embodiments, the dam structures 502 are formed after forming the conductive connectors 120. In other embodiments, the dam structures 502 may be formed prior to forming the conductive connectors 120.

In FIG. 15, process steps described above with reference to FIGS. 7, 8A, 8B, 9, and 10 are performed on the structure of the FIG. 14 to form the wafer-level package component 500. In some embodiments, the dam structure 502 prevents the underfill 126 from physically contacting and extending along the sidewall 70E of the integrated circuit die 70. In such embodiments, the dam structure 502 is in physical contact with the underfill 126. Accordingly, the underfill 126 does not shield the edge coupler 72 of the integrated circuit die 70. In the illustrated embodiments, the dam structure 502 overlaps with the integrated circuit die 70 (similar to the dam structure 122 illustrated in FIGS. 11A and 11B), such that a first sidewall of the dam structure 502 is covered by the integrated circuit die 70 and a second sidewall (opposite to the first sidewall) of the dam structure 502 is not covered by the integrated circuit die 70. In other embodiments, the dam structure 502 does not overlap with the integrated circuit die 70 (similar to the dam structure 122 illustrated in FIGS. 12A-12C), such that the first sidewall of the dam structure 502 is vertically aligned to the sidewall of the integrated circuit die 70 and the second sidewall (opposite to the first sidewall) of the dam structure 502 is not covered by the integrated circuit die 70.

Figure 16:
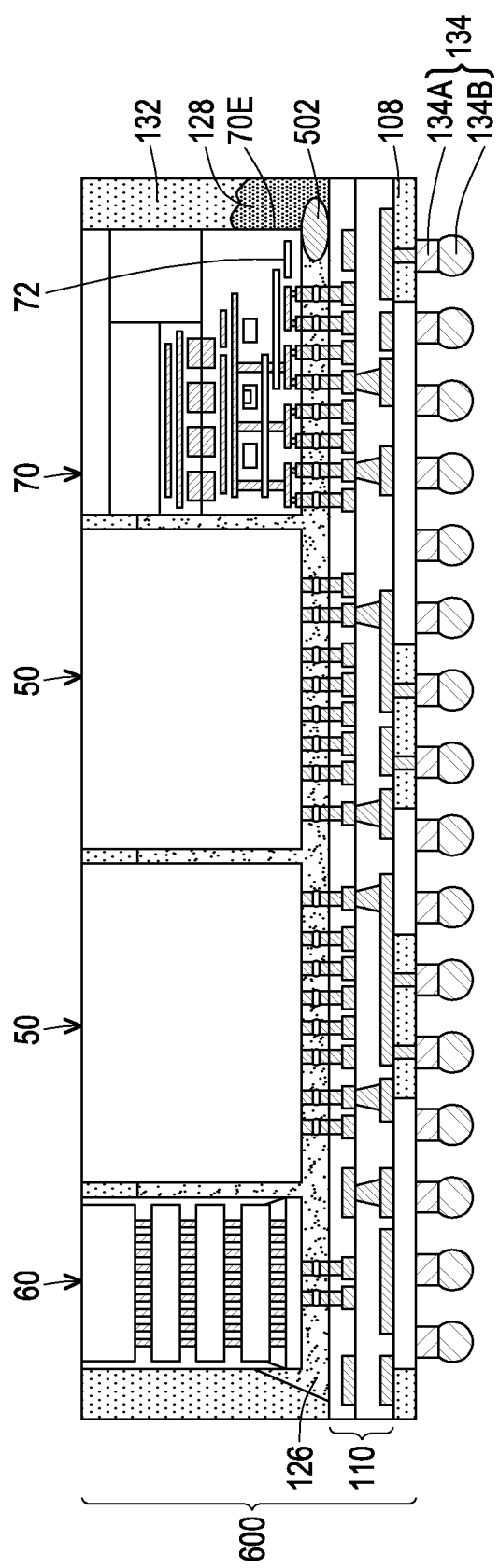

Further, a singulation process is performed on the wafer-level package component 500 by cutting along scribe line regions, e.g., around the region 500A. The singulation process may include sawing, etching, dicing, a combination thereof, or the like. For example, the singulation process can include sawing the encapsulants 108 and 132, the redistribution structure 110 and the optical glue 128. The singulation process singulates the region 500A from adjacent regions to form a singulated package component 600 as illustrated in FIG. 16. The singulated package component 600 is from the region 500A.

Figure 17:
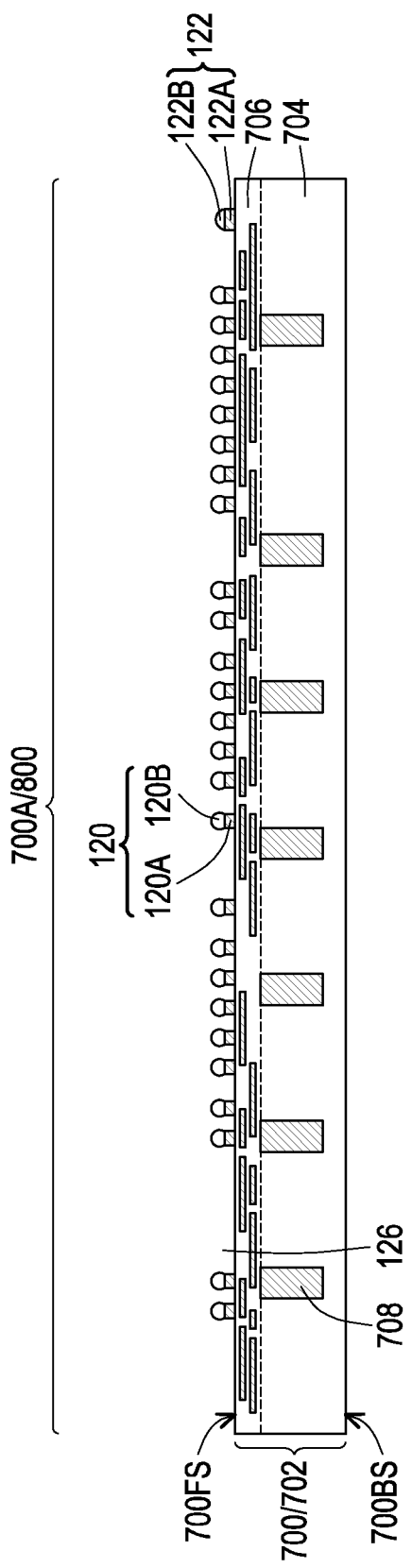
FIGS. 17-20 illustrate cross-sectional views of intermediate stages in the manufacturing of package components, in accordance with some embodiments.

FIGS. 17-20 illustrate cross-sectional views of intermediate stages in the manufacturing of package components 800, in accordance with some embodiments. The package components 800 may be chip-on-wafer (CoW) package components. In FIG. 17, an interposer wafer 700 is obtained or formed. The interposer wafer 700 comprises a plurality of package regions, such as the package region 700A. The interposer wafer 700 comprises an interposer 702 in a package region (such as the package region 700A), which will be singulated in subsequent processing to be included in the package component 800. In some embodiments, the interposers 702 include a substrate 704, an interconnect structure 706, and conductive vias 708.

The substrate 704 may be formed using similar materials and methods as the semiconductor substrate 52 described above with reference to FIG. 1, and the description is not repeated herein. In some embodiments, the substrate 704 generally does not include active devices therein, although the interposers 702 may include passive devices formed in and/or on an active or a front surface (e.g., the surface facing upward in FIG. 17) of the substrate 704. In other embodiments, active devices such as transistors, capacitors, resistors, diodes, and the like, may be formed in and/or on the front surface of the substrate 704.

The interconnect structure 706 is formed over the front surface of the substrate 704, and is used to electrically connect the devices (if any) of the substrate 704. The interconnect structure 706 may include one or more dielectric layer(s) and respective metallization layer(s) in the dielectric layer(s). The interconnect structure 706 may be formed using similar materials and methods as the interconnect structure 54 described above with reference to FIG. 1, and the description is not repeated herein. In some embodiments, conductive connectors 120 and one or more dam structures 122 are formed at the front-side 700FS of the interposer wafer 700 as described above with reference to FIG. 6, and the description is not repeated herein.

The conductive vias 708 extend into the interconnect structure 706 and/or the substrate 704. The conductive vias 708 are electrically connected to metallization layer(s) of the interconnect structure 706. The conductive vias 708 are also sometimes referred to as through substrate vias (TSVs). As an example to form the conductive vias 708, recesses can be formed in the interconnect structure 706 and/or the substrate 704 by, for example, etching, milling, laser techniques, a combination thereof, and/or the like. A thin dielectric material may be formed in the recesses, such as by using an oxidation technique. A thin barrier layer may be conformally deposited in the openings, such as by CVD, atomic layer deposition (ALD), physical vapor deposition (PVD), thermal oxidation, a combination thereof, and/or the like. The barrier layer may be formed of an oxide, a nitride, a carbide, combinations thereof, or the like. A conductive material may be deposited over the barrier layer and in the openings. The conductive material may be formed by an electro-chemical plating process, CVD, ALD, PVD, a combination thereof, and/or the like. Examples of conductive materials are copper, tungsten, aluminum, silver, gold, a combination thereof, and/or the like. Excess conductive material and barrier layer is removed from a surface of the interconnect structure 706 or the substrate 704 by, for example, a CMP. Remaining portions of the barrier layer and conductive material form the conductive vias 708.

Figure 18:
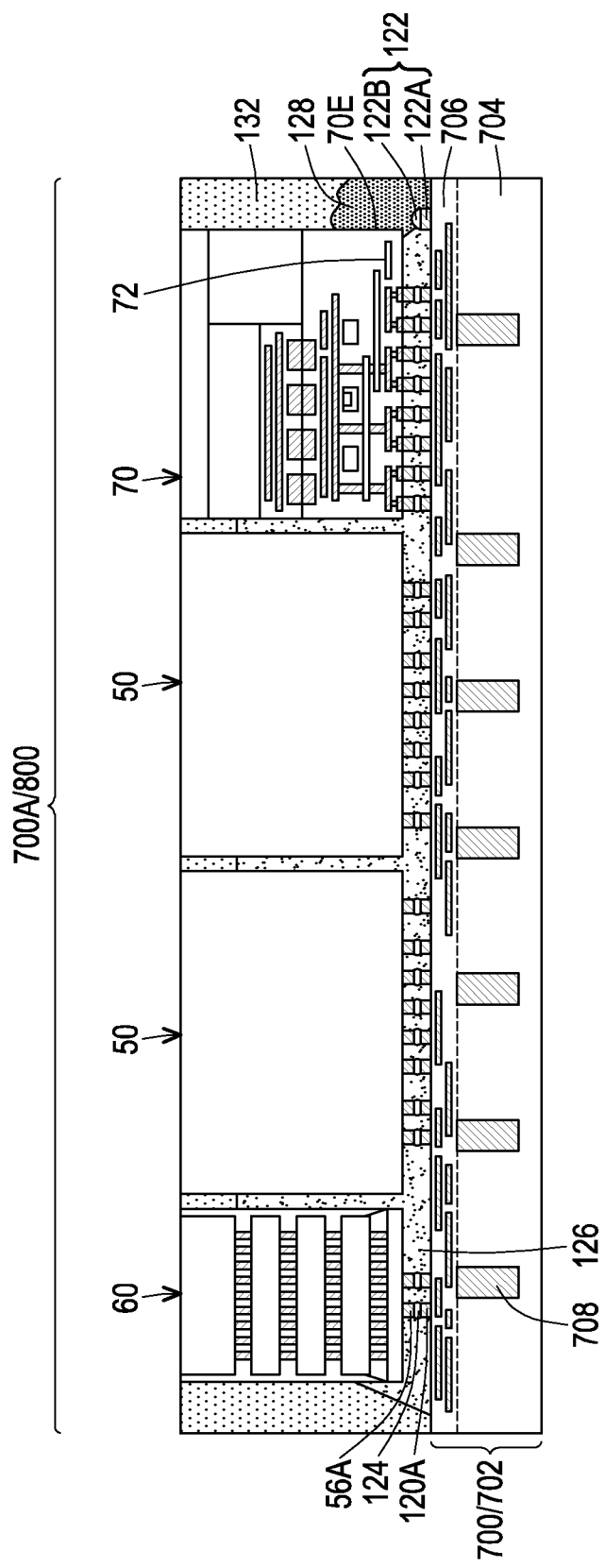

In FIG. 18, process steps described above with reference to FIGS. 7, 8A, 8B, and 9 are performed on the structure of the FIG. 17 to form a wafer-level package component. In some embodiments, the dam structure 122 prevents the underfill 126 from physically contacting and extending along the sidewall 70E of the integrated circuit die 70. Accordingly, the underfill 126 does not shield the edge coupler 72 of the integrated circuit die 70.

Figure 19:
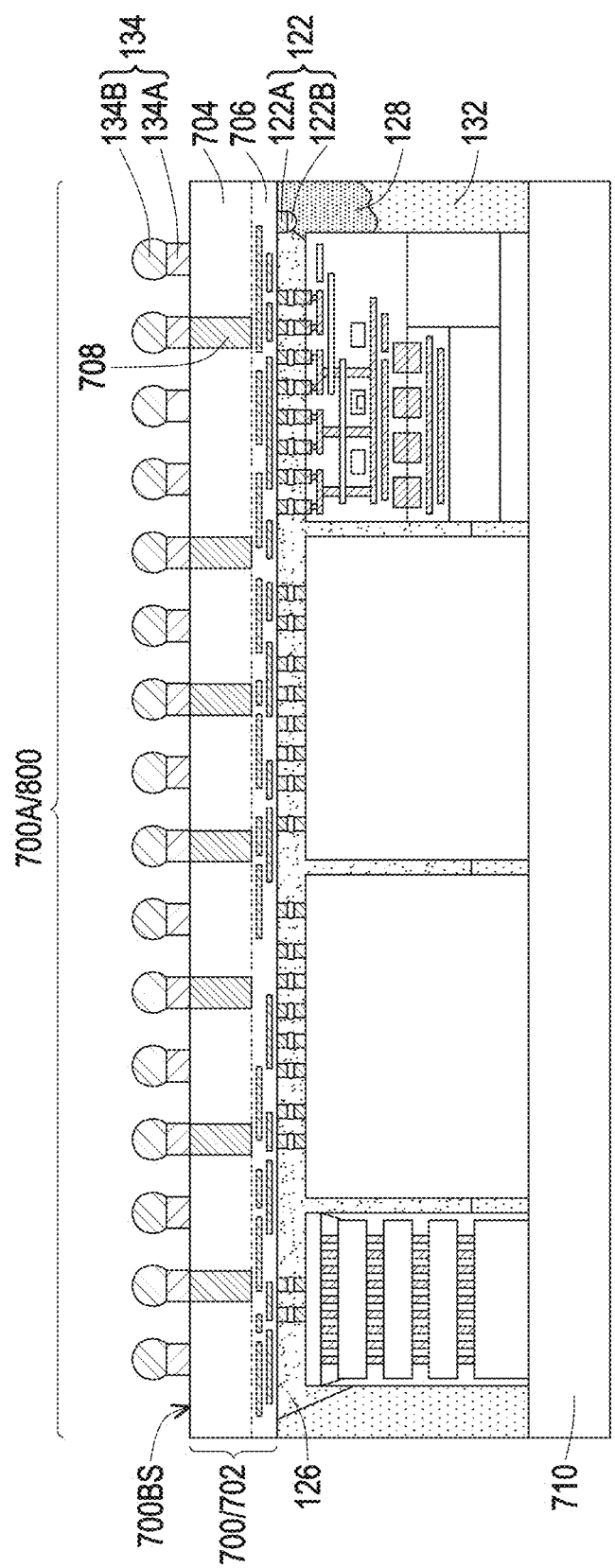

In FIG. 19, the wafer-level package component of FIG. 17 is flipped over and attached to a carrier wafer 710. The carrier wafer 710 may be formed using similar materials and methods as the carrier wafer 100 described above with reference to FIG. 4, and the description is not repeated herein. In some embodiments, the wafer-level package component is attached to the carrier wafer 710 using an adhesive (not shown).

In some embodiments, the substrate 704 is thinned to expose the conductive vias 708. Exposure of the conductive vias 708 may be accomplished by a thinning process, such as a grinding process, a CMP, an etch-back, combinations thereof, or the like. In some embodiments (not separately illustrated), the thinning process for exposing the conductive vias 708 includes a CMP, and the conductive vias 708 protrude at the back-side 700BS of the wafer 700 as a result of dishing that occurs during the CMP. In such embodiments, an insulating layer (not separately illustrated) may optionally be formed on the back surface of the substrate 704, surrounding the protruding portions of the conductive vias 708. The insulating layer may be formed of a silicon-containing insulator, such as, silicon nitride, silicon oxide, silicon oxynitride, or the like, and may be formed by a suitable deposition method such as spin coating, CVD, plasma-enhanced CVD (PECVD), high density plasma CVD (HDP-CVD), or the like. After the substrate 704 is thinned, the exposed surfaces of the conductive vias 708 and the insulating layer (if present) or the substrate 704 are coplanar (within process variations), such that they are level with one another, and are exposed at the back-side 700BS of the interposer wafer 700. Subsequently, conductive connectors 134 are formed on the back-side 700BS of the interposer wafer 700 as described above with reference to FIG. 10, and the description is not repeated herein.

Figure 20:
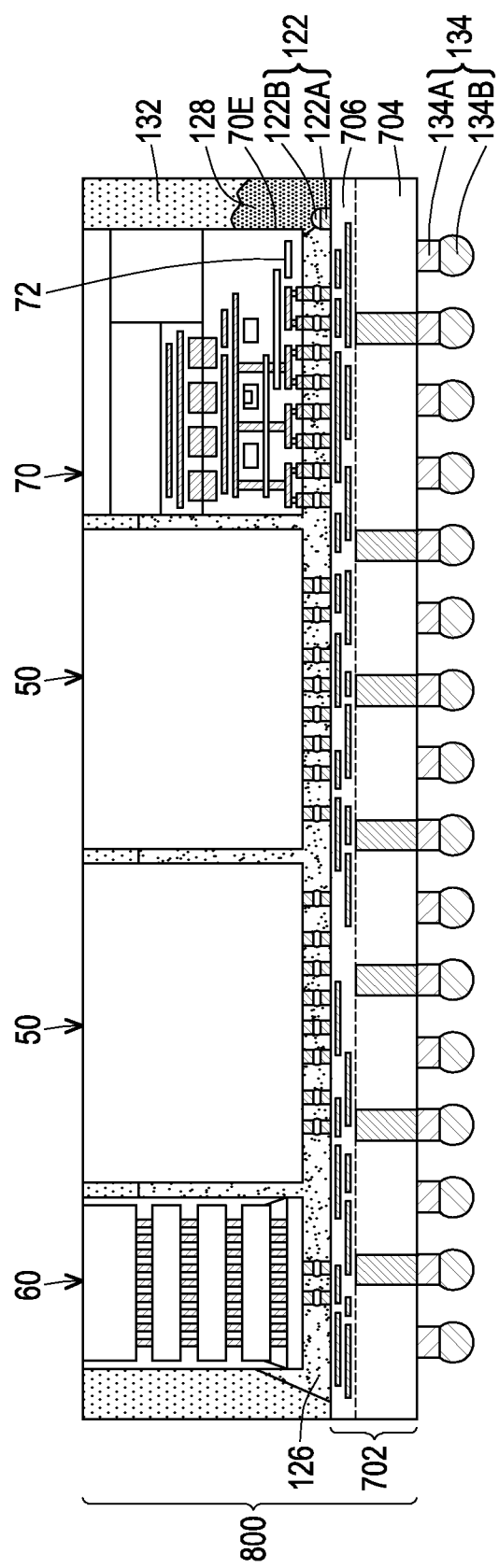

Further, a singulation process is performed by cutting along scribe line regions, e.g., around the package region 700A. The singulation process may include sawing, etching, dicing, a combination thereof, or the like. For example, the singulation process can include sawing the encapsulant 132, the optical glue 128, the interconnect structure 706, and the substrate 704. The singulation process singulates the package region 700A from adjacent package regions to form a singulated package component 800 as illustrated in FIG. 20. The singulated package component 800 is from the package region 700A.

The singulation process forms interposers 702 from the singulated portions of the interposer wafer 700. As a result of the singulation process, the outer sidewalls of the interposer 702, the encapsulant 132, and the optical glue 128 are laterally coterminous (within process variations) as illustrated in FIG. 20. In the illustrated embodiment, the dam structures 122 of the package component 800 overlap with respective integrated circuit dies 70 in a plan view as described above with reference to FIGS. 11A and 11B, and the description is not repeated herein.

Figure 21:
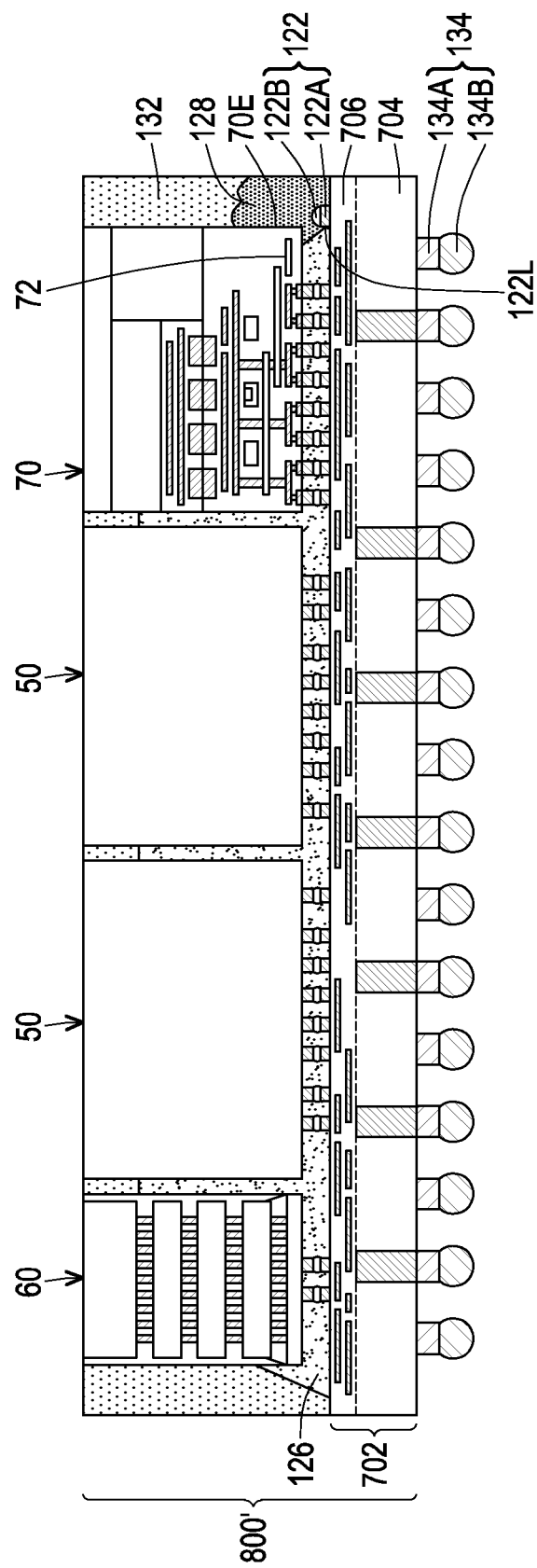
FIG. 21 illustrates a cross-sectional view of a package component, in accordance with some embodiments.

FIG. 21 illustrates a cross-sectional view of a package component 800', in accordance with some embodiments. The package component 800' is similar to the package component 800 (see FIG. 20), with similar features being labeled by similar numerical references, and descriptions of the similar features are not repeated herein. In some embodiments, the package component 800' may be formed using process steps that are similar to the process steps described above with reference to FIGS. 17-20, and the description is not repeated herein. In the illustrated embodiment, the dam structures 122 of the package component 800' do not overlap with respective integrated circuit dies 70 in a plan view as described above with reference to FIGS. 12A-12C, and the description is not repeated herein.

Figure 22:
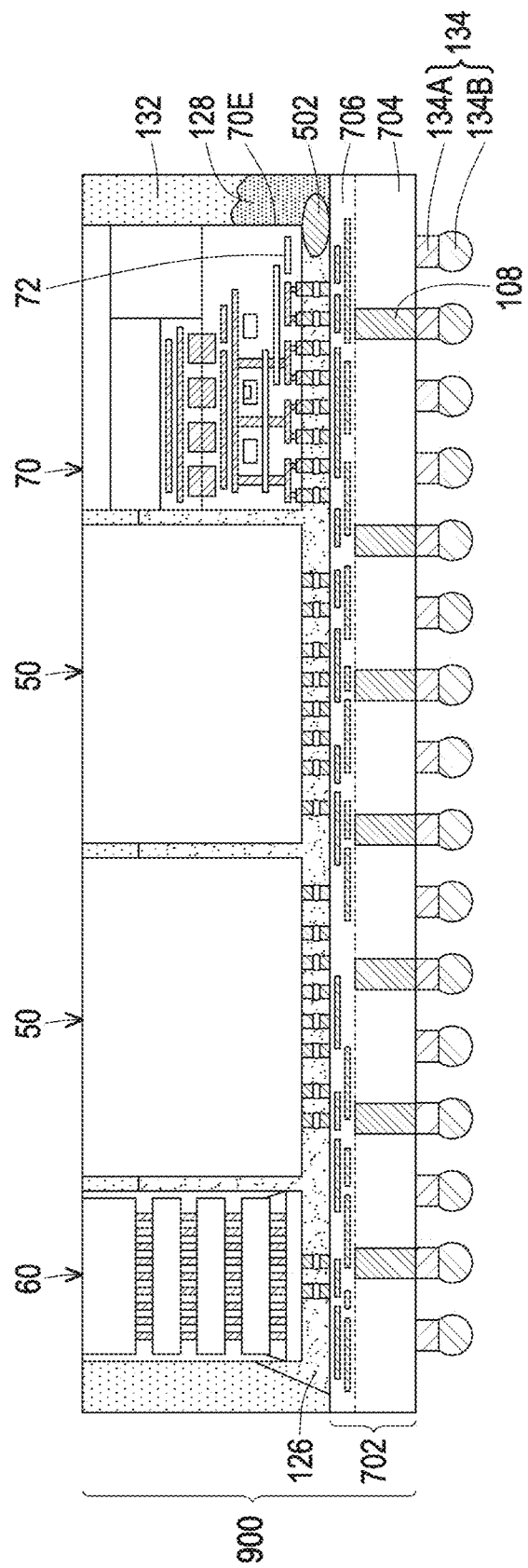
FIG. 22 illustrates a cross-sectional view of a package component, in accordance with some embodiments.

FIG. 22 illustrates a cross-sectional view of a package component 900, in accordance with some embodiments. The package component 900 is similar to the package component 800 (see FIG. 20), with similar features being labeled by similar numerical references, and descriptions of the similar features are not repeated herein. In distinction with package component 800 (see FIG. 20), the package component 900 comprises the one or more dam structures 502 instead of the one or more dam structures 122. In some embodiments, the package component 900 may be formed using process steps that are similar to the process steps described above with reference to FIGS. 17-20, where, instead of the one or more dam structures 122, the one or more dam structures 502 are formed as described above with reference to FIG. 14.

Figure 23:
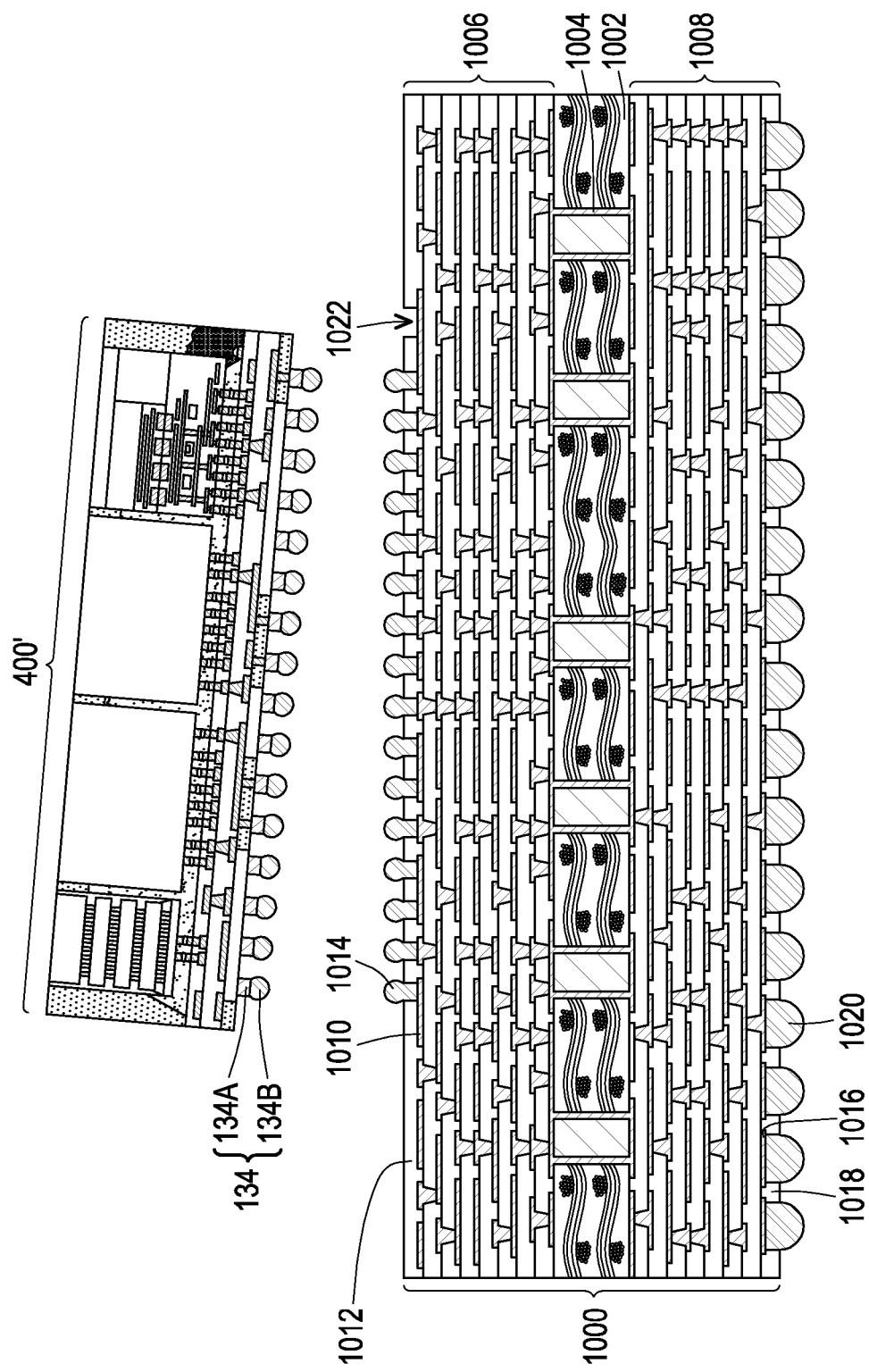
FIGS. 23, 24A, 24B, 24C, 25A and 25B illustrate top and cross-sectional views of intermediate stages in the manufacturing of a package, in accordance with some embodiments.
Figure 24A:
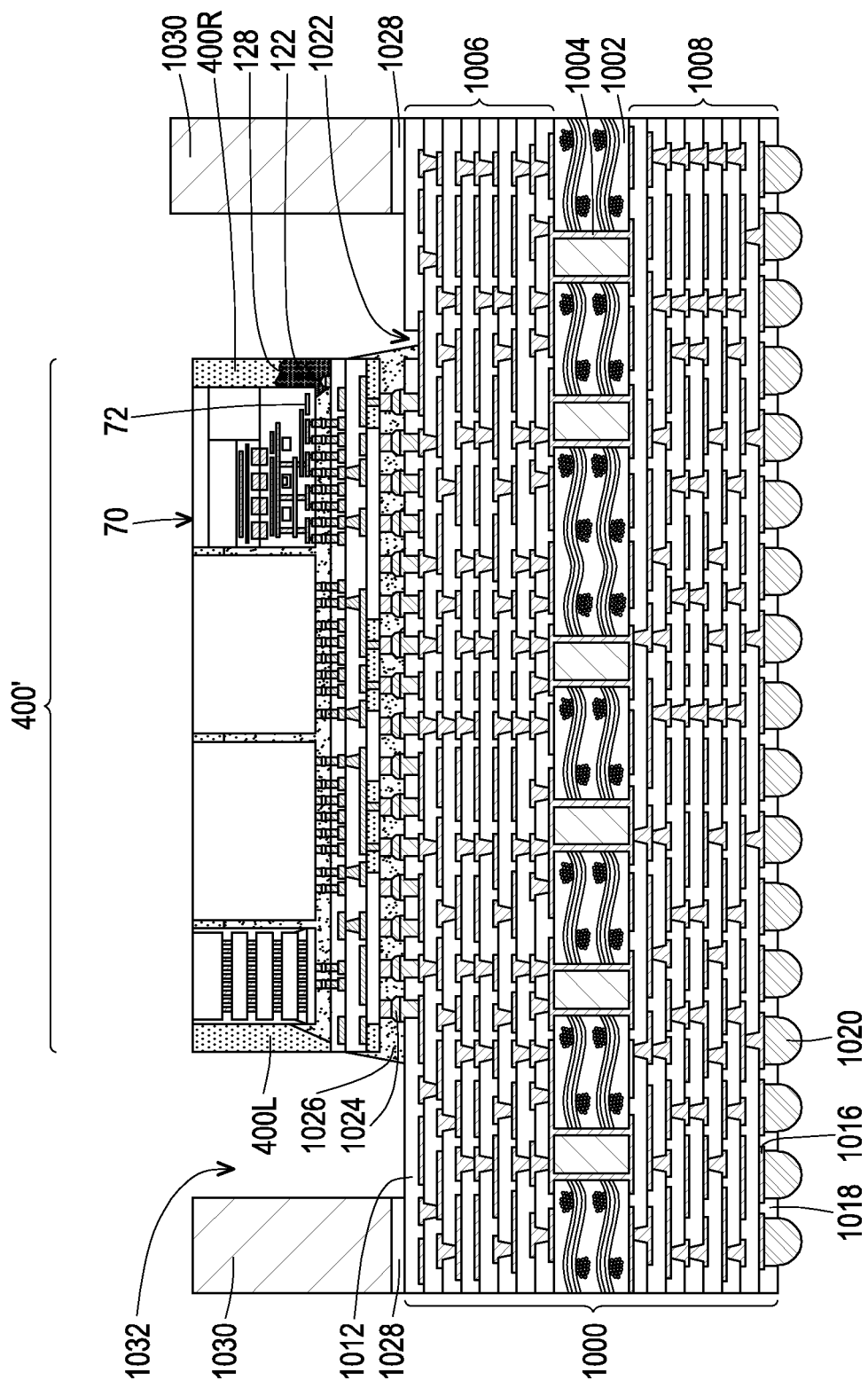
Figure 24B:
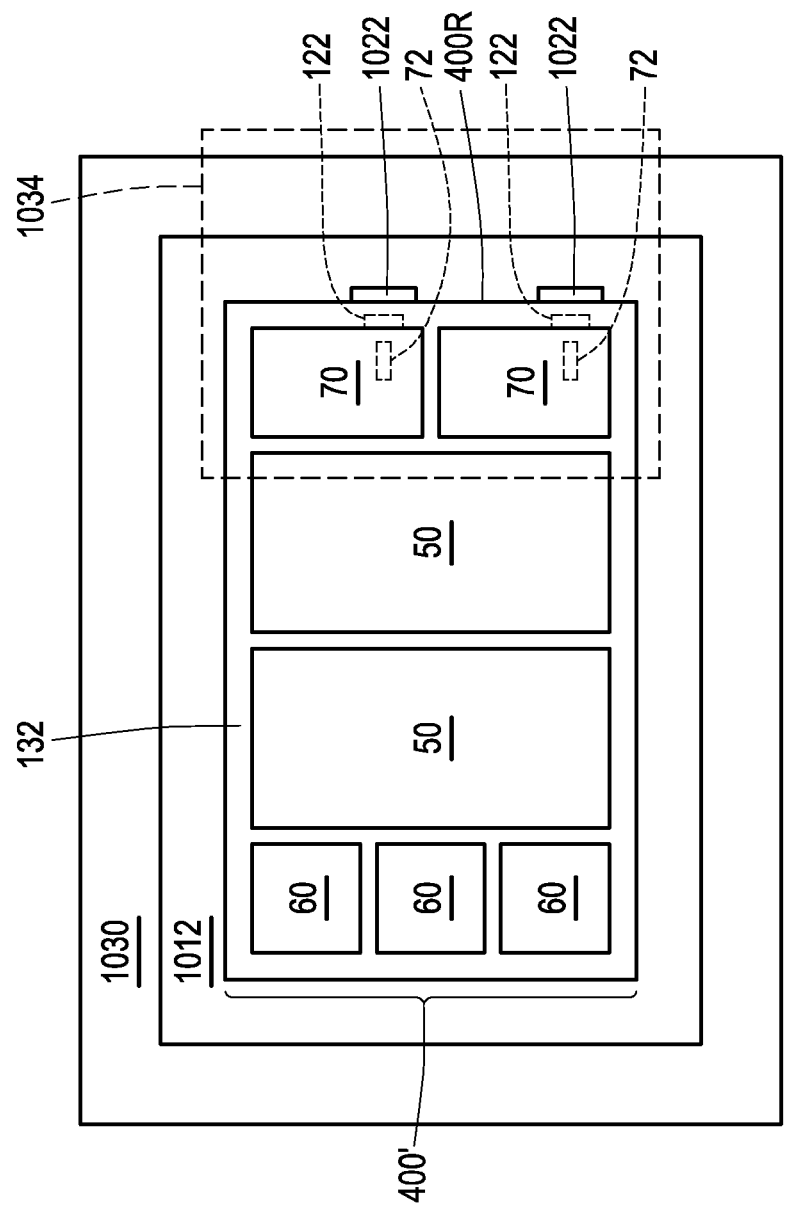
Figure 24C:
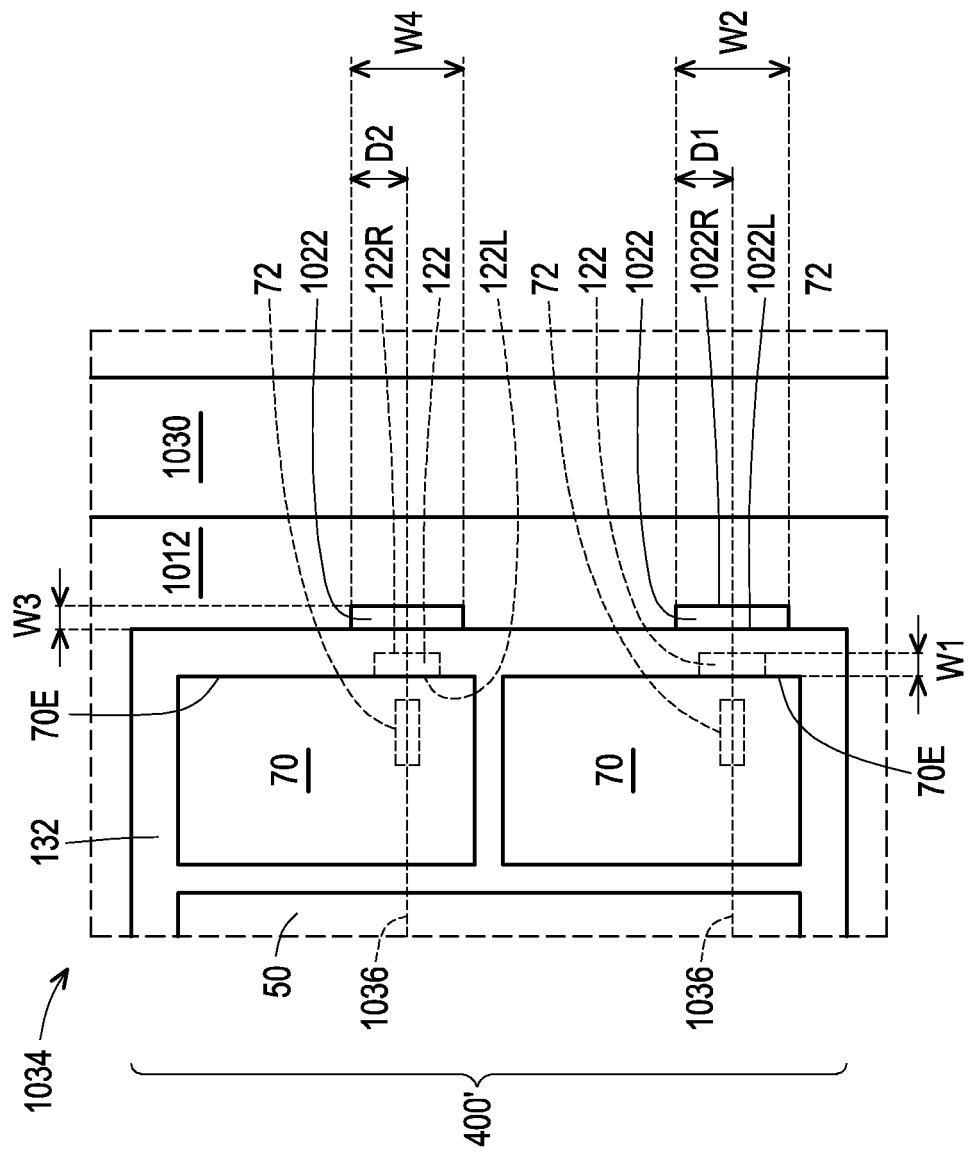
Figure 25A:
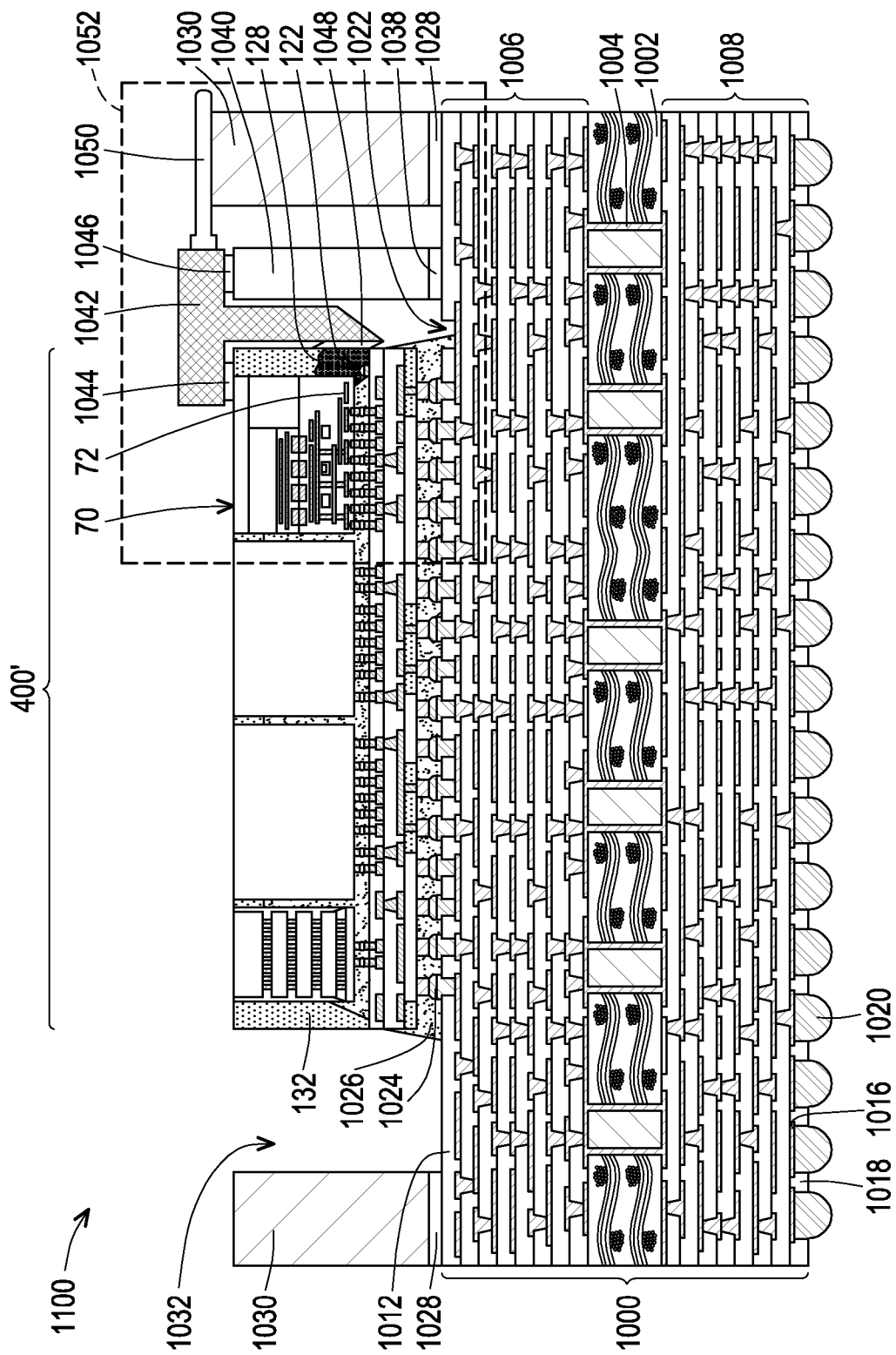
Figure 25B:
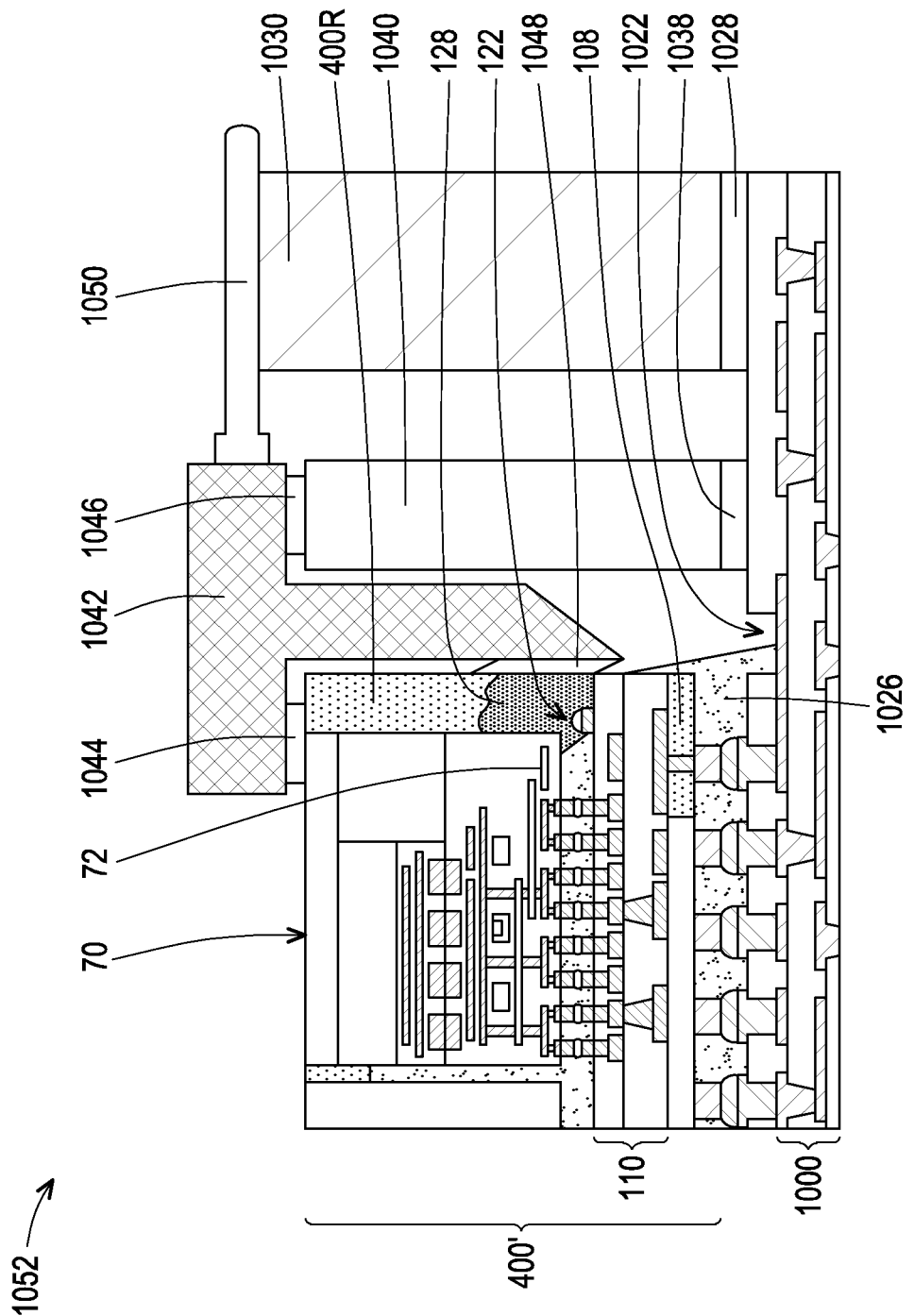

FIGS. 23, 24A, 24B, 24C, 25A and 25B illustrate top and cross-sectional views of intermediate stages in the manufacturing of a package 1100, in accordance with some embodiments. In particular, FIGS. 23, 24A and 25A illustrate cross-sectional views, FIG. 24B illustrates a top view, FIG. 24C illustrates a magnified view of a region 1034 of FIG. 24B, and FIG. 25B illustrates a magnified view of a region 1052 of FIG. 25A.

In FIGS. 23, a package component 400' is placed on a package substrate 1000. The package substrate 1000 includes a substrate core 1002, which may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations thereof, or the like, may also be used. Additionally, the substrate core 1002 may be a SOI substrate. Generally, an SOI substrate includes a layer of a semiconductor material such as epitaxial silicon, germanium, silicon germanium, SOI, SGOI, or combinations thereof. In another embodiment, the substrate core 1002 is an insulating core such as a fiberglass reinforced resin core. One example core material is fiberglass resin such as FR4. Alternatives for the core material include bismaleimide-triazine (BT) resin, or alternatively, other printed circuit board (PCB) materials or films.

In some embodiments, the substrate core 1002 may include active and passive devices (not separately illustrated). Devices such as transistors, capacitors, resistors, combinations thereof, and the like may be used to generate the structural and functional requirements of the design for the system. The devices may be formed using any suitable methods. In some embodiments, the substrate core 1002 is substantially free of active and passive devices. In some embodiments, the substrate core 1002 further includes conductive vias 1004, which may be also referred to as TSVs. In some embodiments, the conductive vias 1004 may be formed using similar materials and methods as the conductive vias 708 described above with reference to FIG. 17, and the description is not repeated herein.

The package substrate 1000 may also include a redistribution structure. In some embodiments, the redistribution structure may be formed of alternating layers of dielectric material (e.g., low-k dielectric material) and conductive material (e.g., copper) with vias interconnecting the layers of conductive material, and may be formed through any suitable process (such as deposition, damascene, or the like). In other embodiments, the redistribution structure may be formed of alternating layers of dielectric material (e.g., build up films such as Ajinomoto build-up film (ABF) or other laminates) and conductive material (e.g., copper) with vias interconnecting the layers of conductive material, and may be formed through any suitable process (such as lamination, plating, or the like).

In the illustrated embodiment, the package substrate 1000 comprises redistribution structures 1006 and 1008 formed on opposing surfaces of the substrate core 1002, such that the substrate core 1002 is interposed between the redistribution structure 1006 and the redistribution structure 1008. The conductive vias 1004 electrically couple the redistribution structure 1006 to the redistribution structure 1008. In some embodiments, the redistribution structure 1006 or the redistribution structure 1008 may be omitted.

In some embodiments, bond pads 1010 and a solder resist layer 1012 are formed on the redistribution structure 1006, with the bond pads 1010 being exposed by openings formed in the solder resist layer 1012. The bond pads 1010 may be a part of the redistribution structure 1006 and may be formed together with other conductive features of the redistribution structure 1006. The solder resist layer 1012 may comprise a suitable insulating material (such as a dielectric material, a polymer material, or the like) and may be formed using any suitable deposition methods.

In some embodiments, conductive connectors 1014 extend through the opening in the solder resist layer 1012 and contact the bond pads 1010. The conductive connectors 1014 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 1014 may be formed using similar materials and methods as the conductive connectors 120 described above with reference to FIG. 6, and the description is not repeated herein. In the illustrated embodiment, the conductive connectors 1014 comprise solder balls.

In some embodiments, bond pads 1016 and a solder resist layer 1018 are formed on the redistribution structure 1008, with the bond pads 1016 being exposed by openings formed in the solder resist layer 1018. The bond pads 1016 may be a part of the redistribution structure 1008 and may be formed together with other conductive features of the redistribution structure 1008. The solder resist layer 1018 may comprise a suitable insulating material (such as a dielectric material, a polymer material, or the like) and may be formed using any suitable deposition methods.

In some embodiments, conductive connectors 1020 extend through the openings in the solder resist layer 1018 and contact the bond pads 1016. The conductive connectors 1020 may be ball grid array (BGA) connectors, solder balls, metal pillars, controlled collapse chip connection (C4) bumps, micro bumps, electroless nickel-electroless palladium-immersion gold (ENEPIG) technique formed bumps, or the like. The conductive connectors 1020 may be formed using similar materials and methods as the conductive connectors 120 described above with reference to FIG. 6, and the description is not repeated herein. In the illustrated embodiment, the conductive connectors 1020 comprise solder balls.

In some embodiment, the solder resist layer 1012 is patterned to form one or more trenches 1022 in the solder resist layer 1012. The patterning process may comprise suitable photolithography and etching methods. The suitable etching methods may include a dry etching method or a wet etching method. The etching methods may be anisotropic. In some embodiments, the trenches 1022 extend through the solder resist layer 1012 and expose conductive features of the redistribution structure 1006. In other embodiments, the trenches 1022 partially extend into the solder resist layer 1012 and do not expose conductive features of the redistribution structure 1006.

In some embodiments, the package component 400' may be placed on the package substrate 1000 using, e.g., a pick-and-place tool. After placing the package component 400' on the package substrate 1000, the conductive connectors 134 are in physical contact with respective conductive connectors 1014, such that the solder regions 134B of the conductive connectors 134 are in physical contact with the respective conductive connectors 1014.

In FIGS. 24A-24C, after placing the package component 400' on the package substrate 1000, a reflow process is performed to mechanically and electrically attach the package component 400' to the package substrate 1000. The reflow process melts and merges the solder regions 134B of the conductive connectors 134 (see FIG. 23) and respective solder materials of the conductive connectors 1014 (see FIG. 23) into solder joints 1024. The solder joints 1024 electrically and mechanically couple the package component 400' to the package substrate 1000.

In some embodiments, an underfill 1026 may be formed around the solder joints 1024, and in a gap between the package component 400' and the package substrate 1000. The underfill 1026 may be formed using similar materials and methods as the underfill 126 described above with reference to FIG. 7, and the description is not repeated herein. In some embodiments, the underfill 1026 extends into and at least partially fills the trenches 1022. The trenches 1022 prevent the underfill 1026 from extending along a sidewall 400R of the package component 400' that is proximate to the edge coupler 72 of the integrated circuit die 70. Accordingly, the edge coupler 72 of the integrated circuit package 70 is not shielded by the underfill 1026. In some embodiments, the underfill 1026 extends along and physically contacts a sidewall 400L of the package component 400', with the sidewall 400L being opposite to the sidewall 400R.

In some embodiments, a warpage control structure 1030 is attached to the package substrate 1000. The warpage control structure 1030 may be attached to the package substrate 1000 by an adhesive 1028, such that the adhesive 1028 is interposed between the warpage control structure 1030 and the solder resist layer 1012. The adhesive 1028 may be any suitable adhesive, epoxy, or the like. The warpage control structure 1030 may be an annular structure (see FIG. 24B) and may comprise a hole 1032. The package component 400' may be disposed in the hole 1032 of the warpage control structure 1030. The warpage control structure 1030 may comprise a metal, a metal alloy, a dielectric material, a semiconductor material, or the like.

Referring to FIGS. 24B and 24C, in the illustrated embodiment, each of the trenches 1022 has a first sidewall 1022L that is vertically aligned to a sidewall 400R of the package component 400' and a second sidewall 1022R (opposite to the first sidewall 1022L) that is laterally spaced apart from sidewall 400R of the package component 400'. In other embodiments, the trenches 1022 may partially or fully overlap with the package component 400' in a plan view.

In some embodiment, a center of an edge coupler 72, a center of a respective dam structure 122, and a center of a respective trench 1022 are aligned along a same line (illustrated by a dashed line 1036 in FIG. 24C). The edge of the dam structure 122 is spaced apart from the line 1036 by a distance D1 along a direction parallel to a sidewall 70E of a respective integrated circuit die 70. The distance D1 may be between about 100 μm and about 5.0 mm. A dam structure 122 has a first width W1 as measured along a first direction perpendicular to the sidewall 70E of the respective integrated circuit die 70 and a second width W2 as measured along a second direction parallel to the sidewall 70E of the respective integrated circuit die 70. The width W2 is 2 times the distance D1. The width W1 is between about 20 μm and about 1.0 mm. The width W2 is between about 200 μm and about 10.0 mm.

An edge of the trench 1022 is spaced apart from the line 1036 by a distance D2 along a direction parallel to a sidewall 70E of a respective integrated circuit die 70. The distance D2 may be between about 100 μm and about 5.0 mm. The trench 1022 has a first width W3 as measured along a first direction perpendicular to the sidewall 70E of the respective integrated circuit die 70 and a second width W4 as measured along a second direction parallel to the sidewall 70E of the respective integrated circuit die 70. The width W4 is 2 times the distance D2. The width W3 is between about 20 μm and about 1.0 mm. The width W4 is between about 200 μm and about 10.0 mm.

In FIGS. 25A and 25B, a fiber array unit 1042 is attached to the package component 400'. The fiber array unit 1042 provides an interface between the edge coupler 72 of the integrated circuit die 70 and an optical fiber 1050 that is attached to the fiber array unit 1042. In some embodiments, before attaching the fiber array unit 1042 to the package component 400', a support structure 1040 is attached to the solder resist layer 1012 of the package substrate 1000 using an adhesive 1038. The support structure 1040 may comprise a semiconductor material (such as, for example, silicon), a dielectric material, a combination thereof, or the like. The adhesive 1038 may be formed using similar materials and methods as the adhesive 1028.

The fiber array unit 1042 may be attached to a top surface of the package component 400' using an adhesive 1044, such that the adhesive 1044 is in physical contact with the top surface of the integrated circuit die 70 and the top surface of the encapsulant 132. The fiber array unit 1042 may be attached to a top surface of the support structure 1040 using an adhesive 1046. The fiber array unit 1042 may be also attached to the sidewall 400R of the package component 400' using an optical glue 1048, such that the optical glue 1048 is in physical contact with a sidewall of the optical glue 128 and is interposed between the optical glue 128 and the fiber array unit 1042. The adhesives 1044 and 1046 may be formed using similar materials and methods as the adhesive 1028. The optical glue 1048 may be formed using similar materials and methods as optical glue 128.

In the illustrated embodiment, the optical glues 128 and 1048 are interposed between the edge coupler 72 of the integrated circuit die 70 and the fiber array unit 1042. By forming the dam structure 122, the optical glue 128 and the trench 1022 as described above, materials of the underfills 126 and 1026 and the encapsulant 132 are not formed between the edge coupler 72 of the integrated circuit die 70 and the fiber array unit 1042. Accordingly, the edge coupler 72 of the integrated circuit die 70 is not shielded from the fiber array unit 1042 by the materials of the underfills 126 and 1026 and the encapsulant 132.

Figure 26:
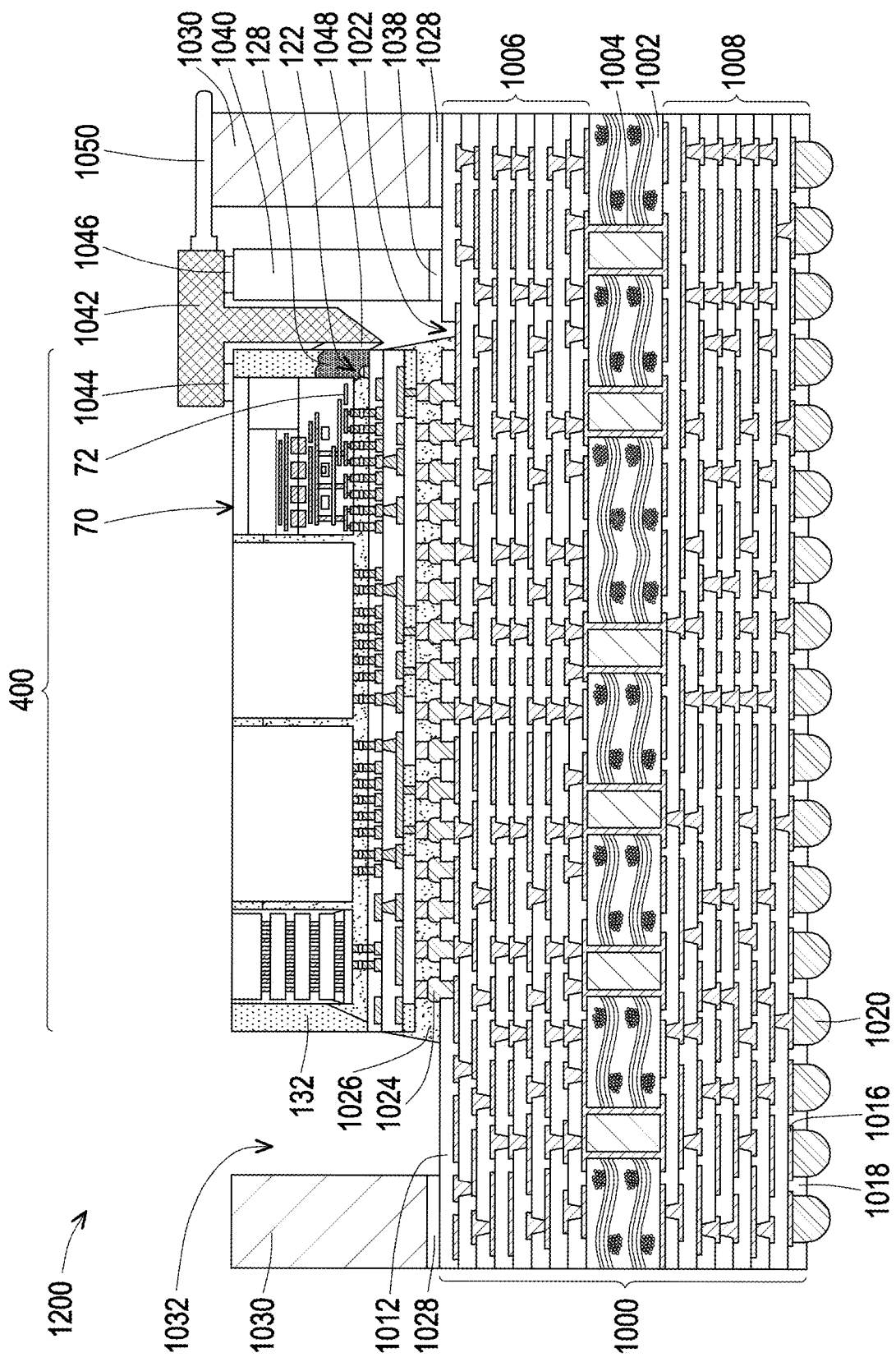
FIG. 26 illustrates a cross-sectional view of a package, in accordance with some embodiments.

FIG. 26 illustrates a cross-sectional view of a package 1200, in accordance with some embodiments. The package 1200 is similar to the package 1100 (see FIGS. 25A and 25B), with similar features being labeled by similar numerical references, and descriptions of the similar features are not repeated herein. The package 1200 may formed using the process steps described above with reference with FIGS. 23, 24A, 24B, 24C, 25A and 25B, with a distinction that the package component 400 (see FIGS. 11A and 11B) is attached to the package substrate 1000 instead of the package component 400' (see FIGS. 25A and 25B).

Figure 27:
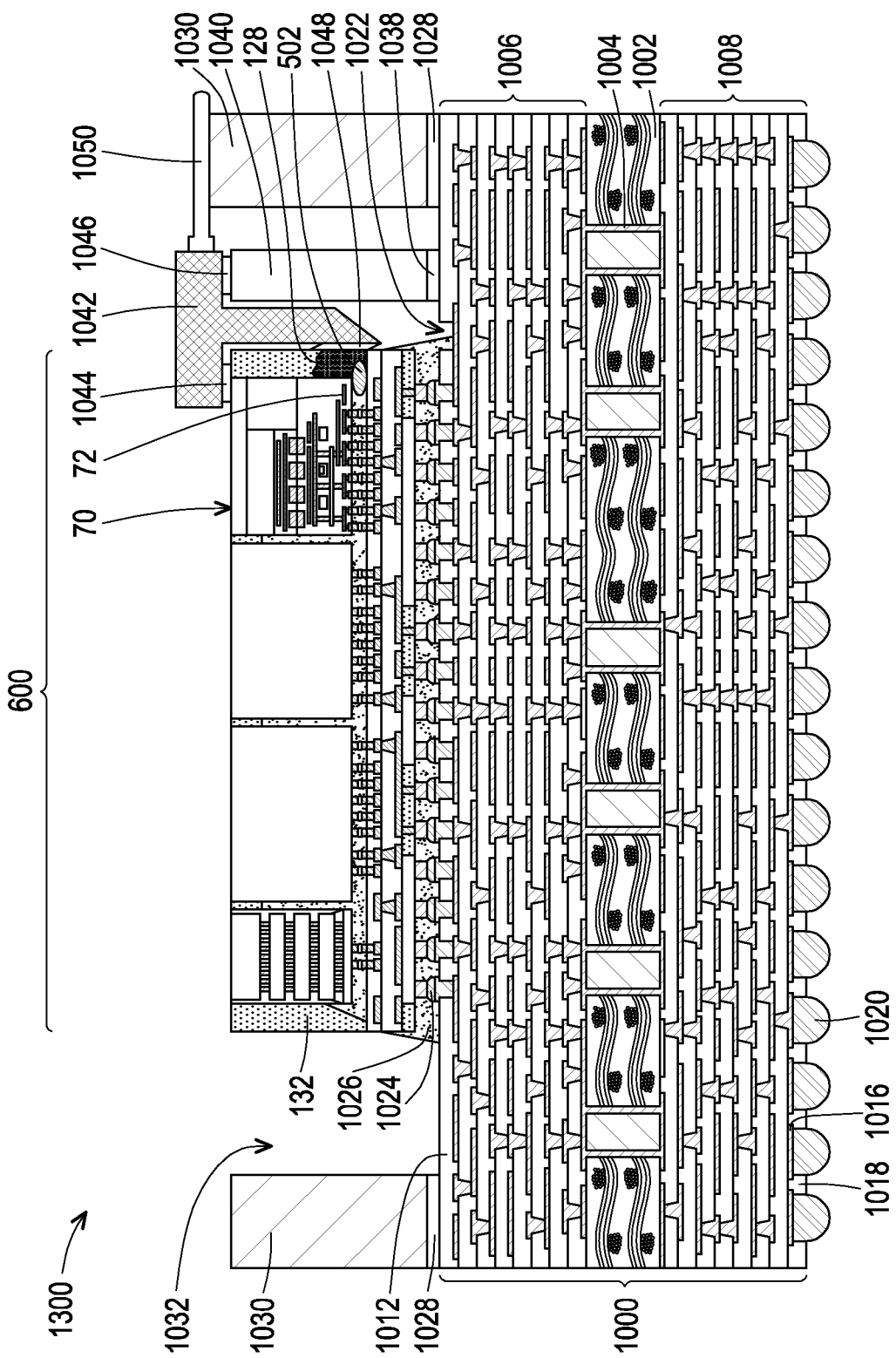
FIG. 27 illustrates a cross-sectional view of a package, in accordance with some embodiments.

FIG. 27 illustrates a cross-sectional view of a package 1300, in accordance with some embodiments. The package 1300 is similar to the package 1100 (see FIGS. 25A and 25B), with similar features being labeled by similar numerical references, and descriptions of the similar features are not repeated herein. The package 1300 may formed using the process steps described above with reference with FIGS. 23, 24A, 24B, 24C, 25A and 25B, with a distinction that the package component 600 (see FIG. 16) is attached to the package substrate 1000 instead of the package component 400' (see FIGS. 25A and 25B).

Figure 28A:
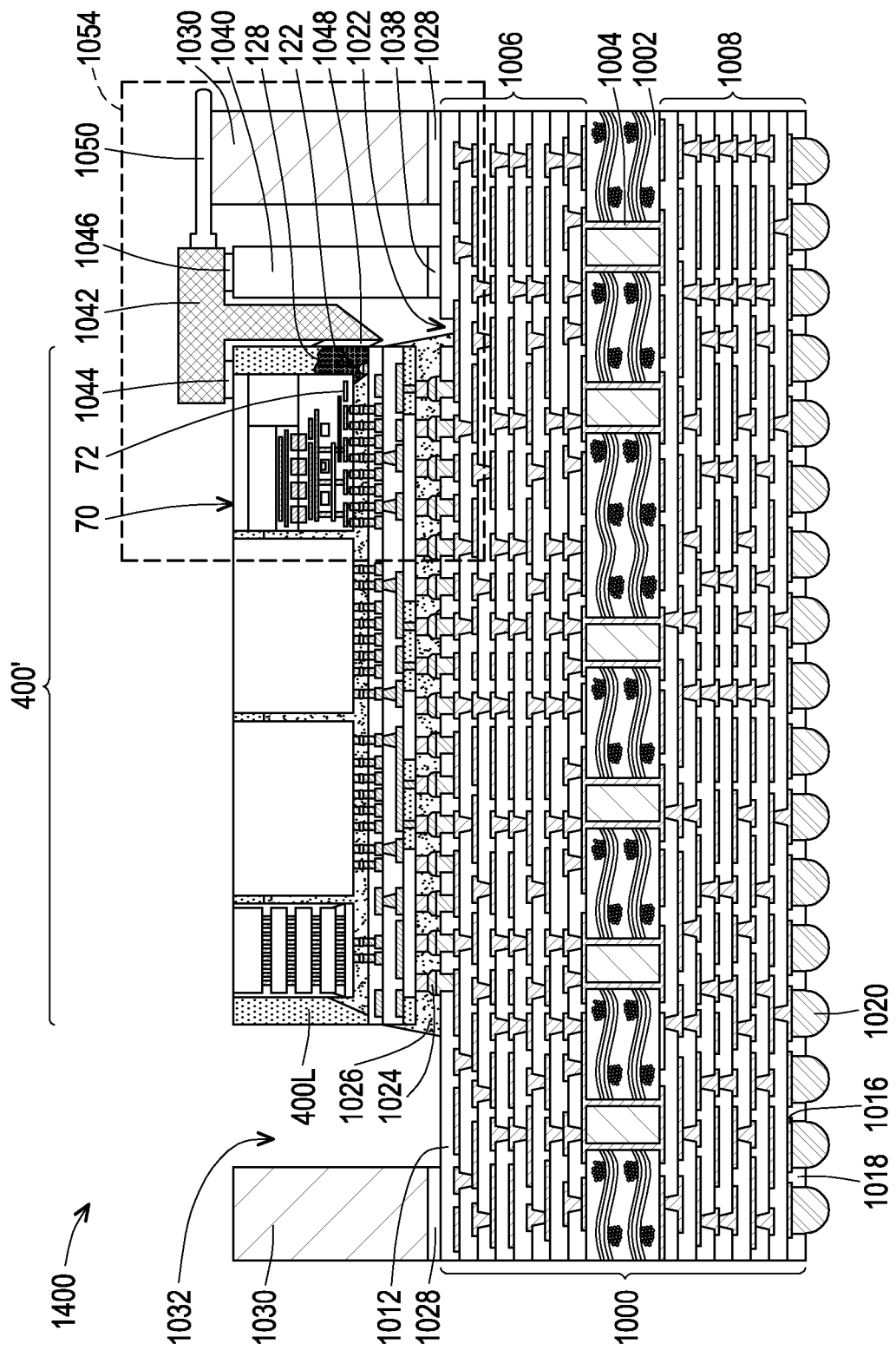
FIGS. 28A and 28B illustrate cross-sectional views of a package, in accordance with some embodiments.
Figure 28B:
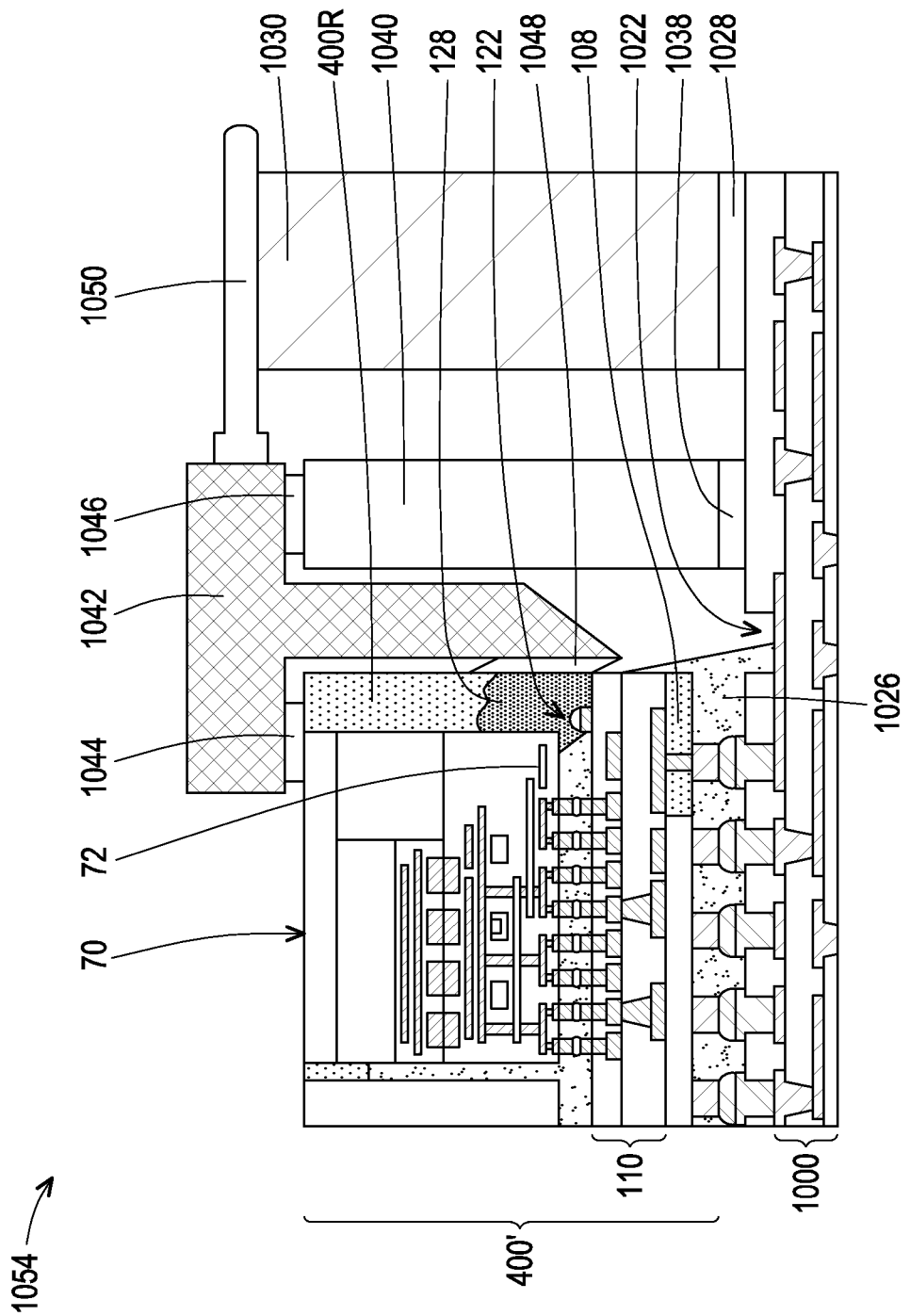

FIGS. 28A and 28B illustrate cross-sectional views of a package 1400, in accordance with some embodiments. FIG. 28B illustrates a magnified view of a region 1054 of FIG. 28A. The package 1400 is similar to the package 1100 (see FIGS. 25A and 25B), with similar features being labeled by similar numerical references, and descriptions of the similar features are not repeated herein. The package 1400 may formed using the process steps described above with reference with FIGS. 23, 24A, 24B, 24C, 25A and 25B, and the description is not repeated herein. In the illustrated embodiment, the underfill 1026 extends along the sidewall 400R of the package component 400' (such as sidewalls of the encapsulant 108 and the redistribution structure 110) and does not extend along a sidewall of the optical glue 128.

Figure 29:
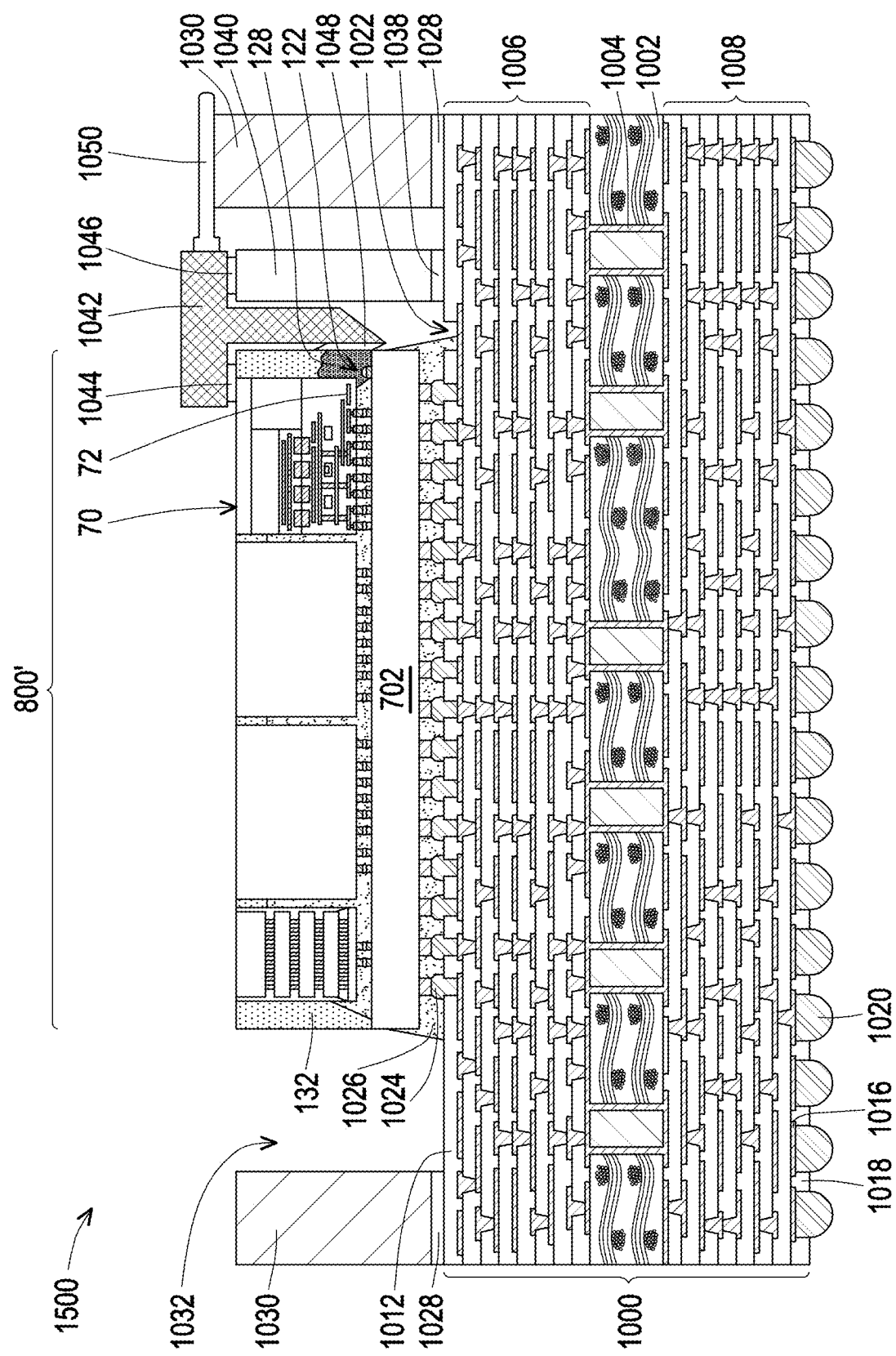
FIG. 29 illustrates a cross-sectional view of a package, in accordance with some embodiments.

FIG. 29 illustrates a cross-sectional view of a package 1500, in accordance with some embodiments. The package 1500 is similar to the package 1100 (see FIGS. 25A and 25B), with similar features being labeled by similar numerical references, and descriptions of the similar features are not repeated herein. The package 1500 may formed using the process steps described above with reference with FIGS. 23, 24A, 24B, 24C, 25A and 25B, with a distinction that the package component 800' (see FIG. 21) is attached to the package substrate 1000 instead of the package component 400' (see FIGS. 25A and 25B).

Figure 30:
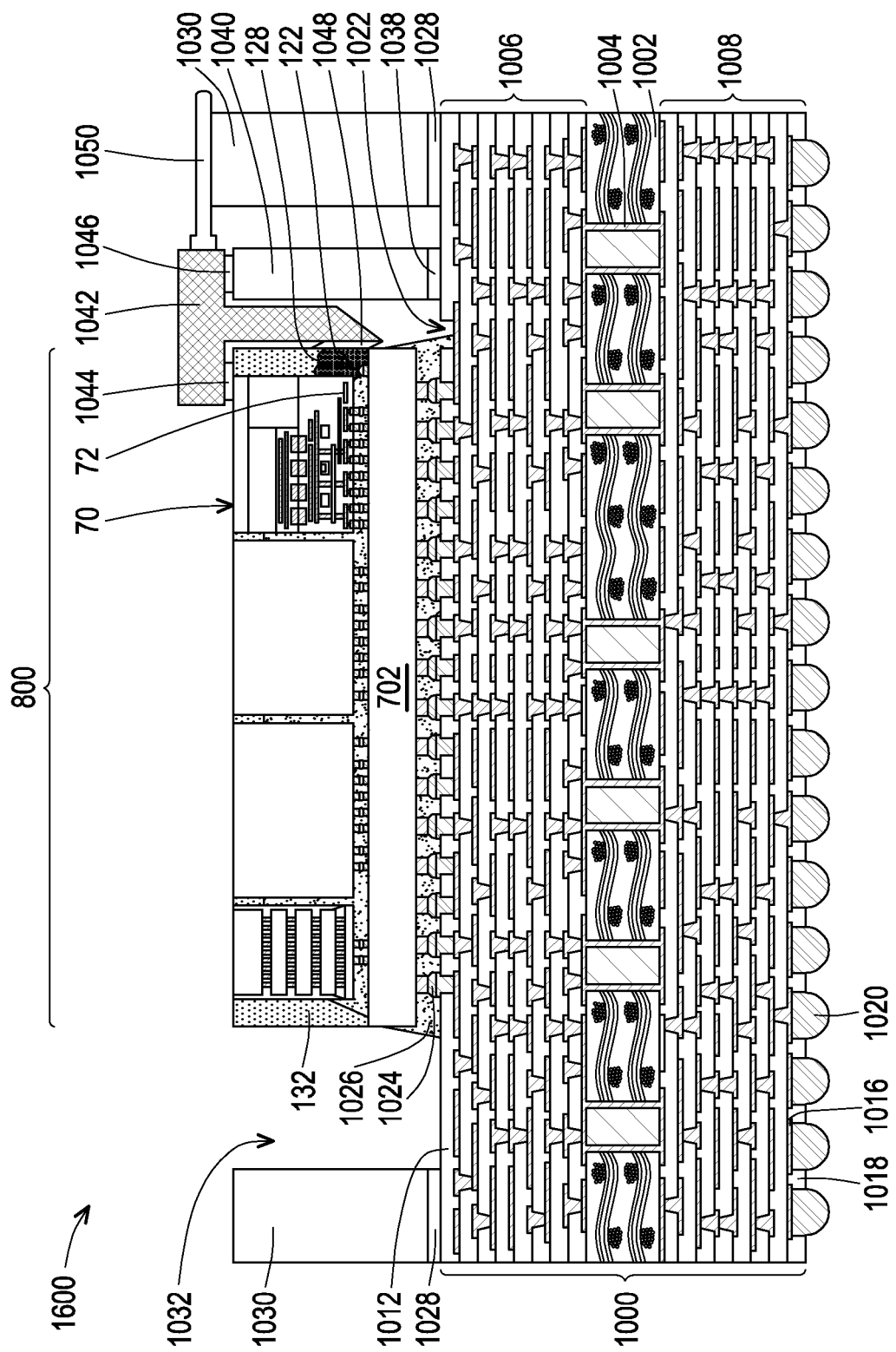
FIG. 30 illustrates a cross-sectional view of a package, in accordance with some embodiments.

FIG. 30 illustrates a cross-sectional view of a package 1600, in accordance with some embodiments. The package 1600 is similar to the package 1100 (see FIGS. 25A and 25B), with similar features being labeled by similar numerical references, and descriptions of the similar features are not repeated herein. The package 1600 may formed using the process steps described above with reference with FIGS. 23, 24A, 24B, 24C, 25A and 25B, with a distinction that the package component 800 (see FIG. 20) is attached to the package substrate 1000 instead of the package component 400' (see FIGS. 25A and 25B).

Figure 31:
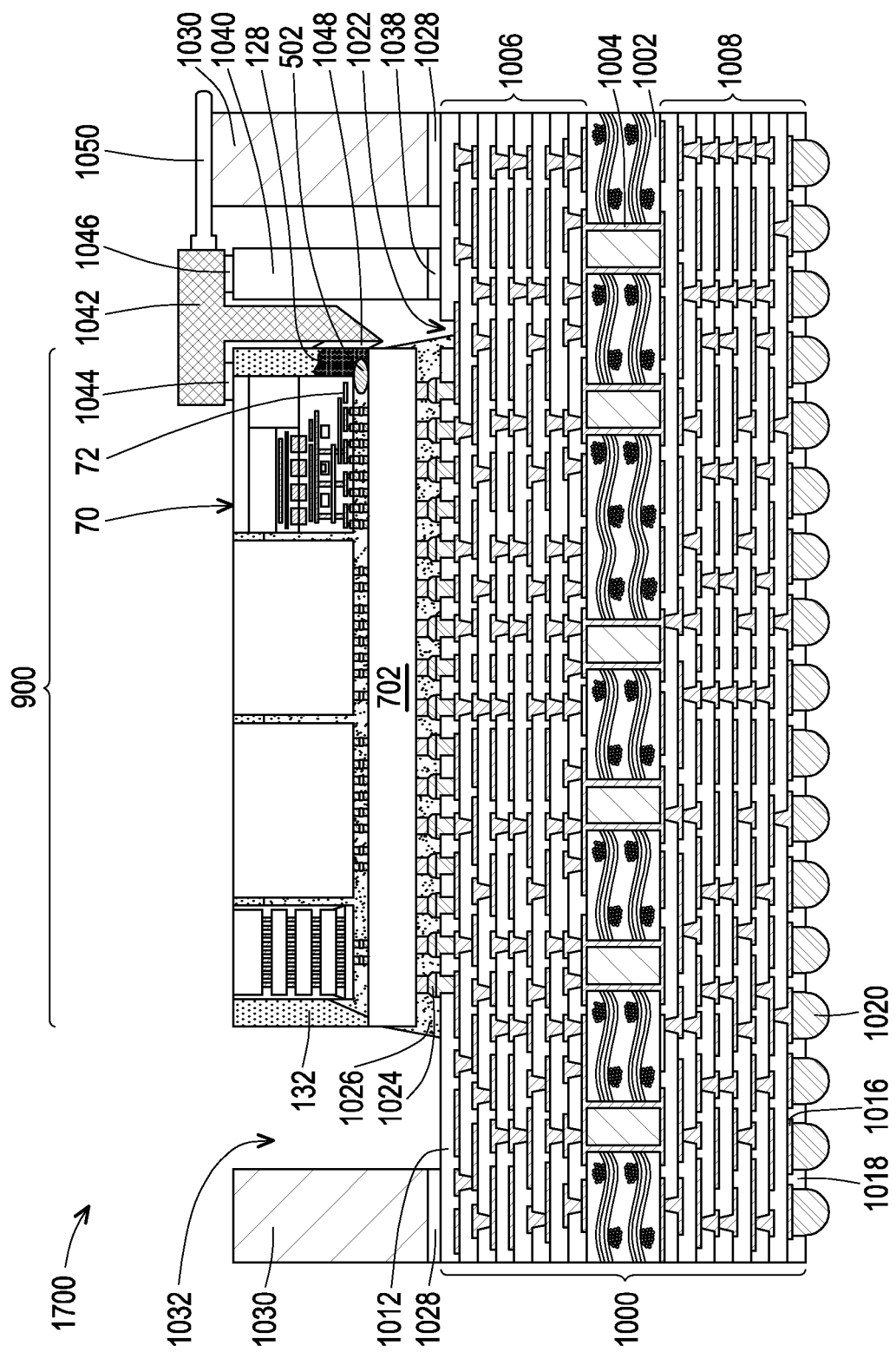
FIG. 31 illustrates a cross-sectional view of a package, in accordance with some embodiments.

FIG. 31 illustrates a cross-sectional view of a package 1700, in accordance with some embodiments. The package 1700 is similar to the package 1100 (see FIGS. 25A and 25B), with similar features being labeled by similar numerical references, and descriptions of the similar features are not repeated herein. The package 1700 may formed using the process steps described above with reference with FIGS. 23, 24A, 24B, 24C, 25A and 25B, with a distinction that the package component 900 (see FIG. 22) is attached to the package substrate 1000 instead of the package component 400' (see FIGS. 25A and 25B).

Figure 32:
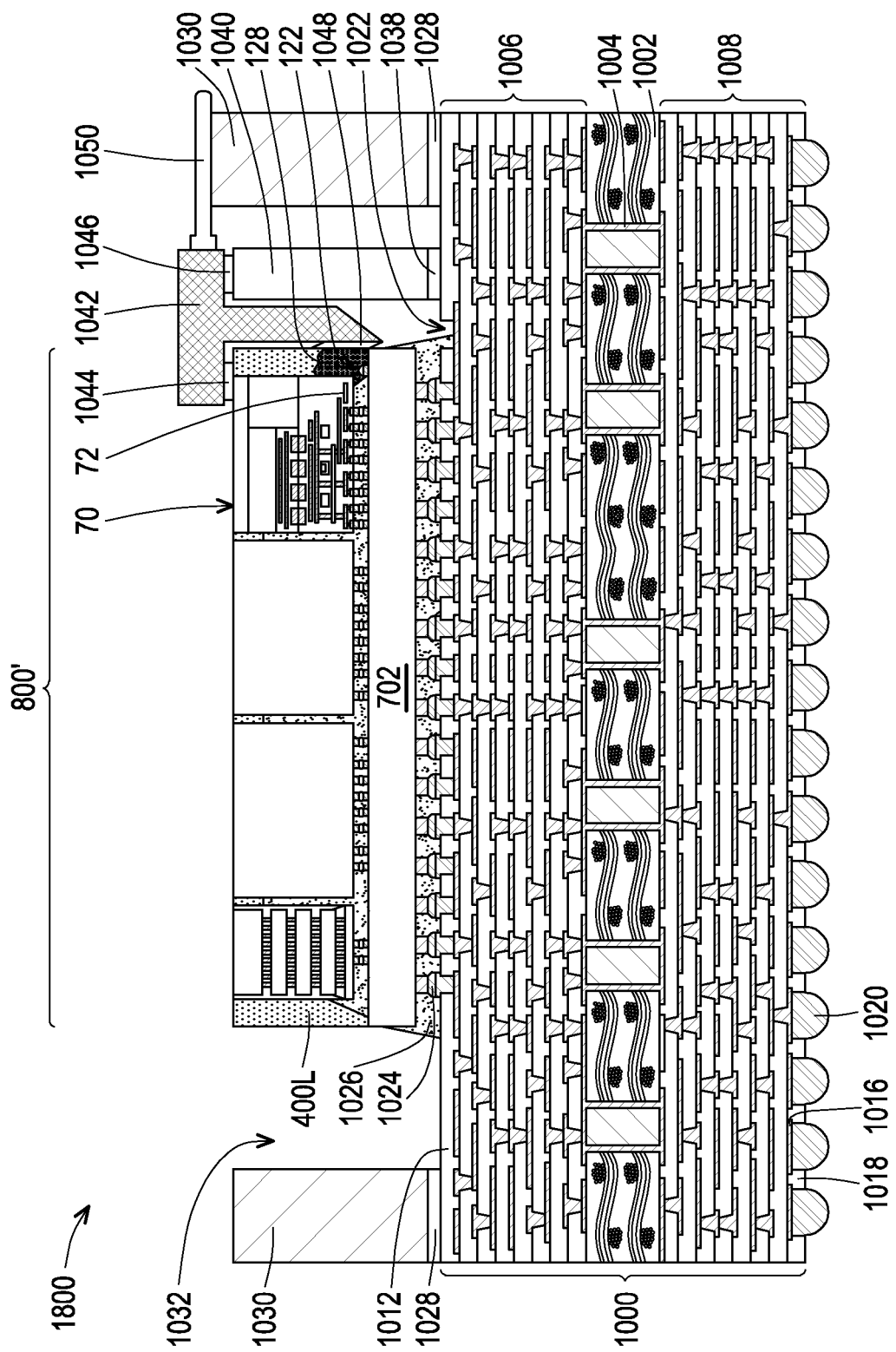
FIG. 32 illustrates a cross-sectional view of a package, in accordance with some embodiments.

FIG. 32 illustrates a cross-sectional view of a package 1800, in accordance with some embodiments. The package 1800 is similar to the package 1500 (see FIG. 29), with similar features being labeled by similar numerical references, and descriptions of the similar features are not repeated herein. The package 1800 may formed in a similar manner as the package 1500, the description is not repeated herein. In the illustrated embodiment, the underfill 1026 extends along a sidewall 800R of the package component 800' (such as a sidewall of the interposer 702) and does not extend along a sidewall of the optical glue 128.

Figure 33:
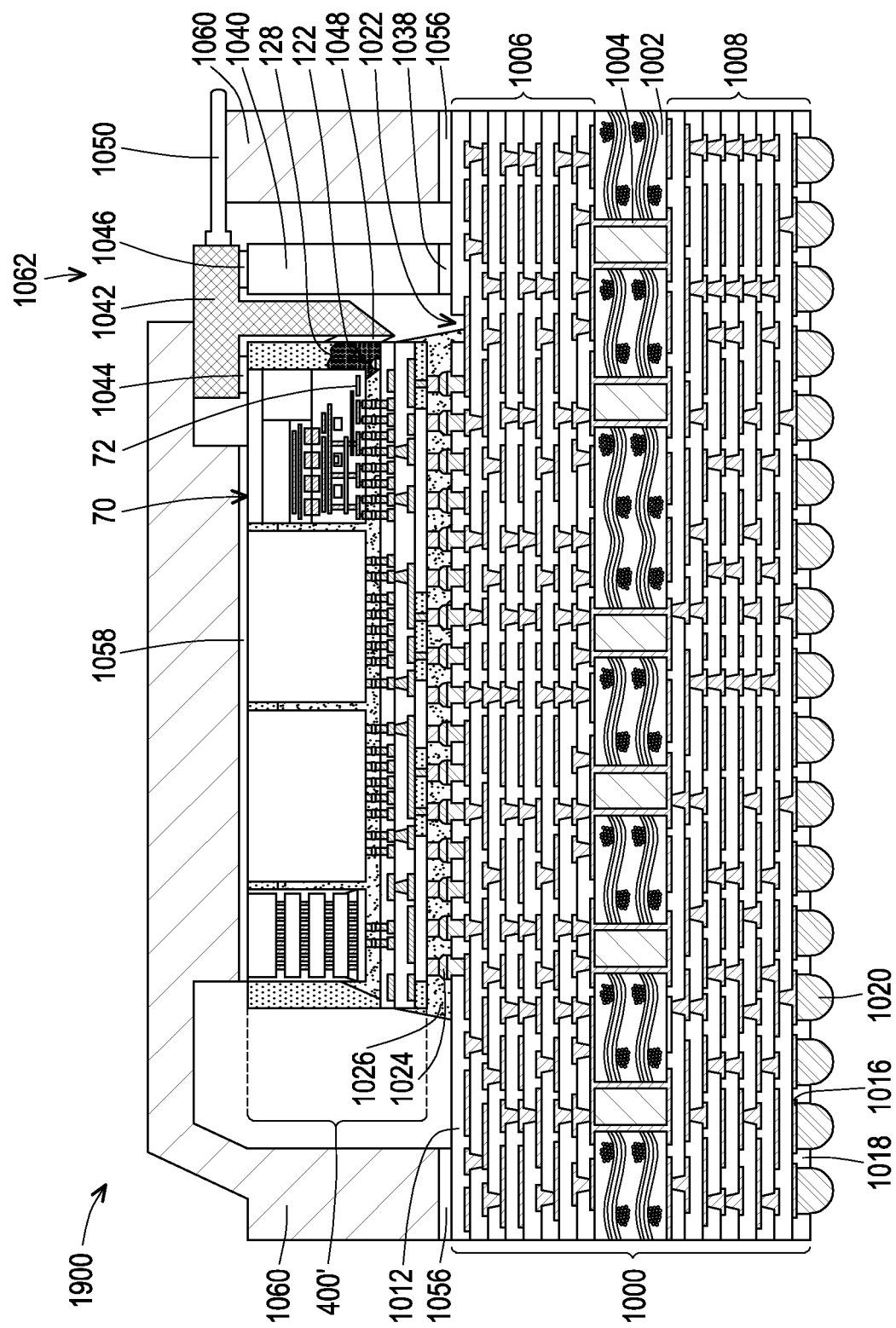
FIG. 33 illustrates a cross-sectional view of a package, in accordance with some embodiments.

FIG. 33 illustrates a cross-sectional view of a package 1900, in accordance with some embodiments. The package 1900 is similar to the package 1100 (see FIGS. 25A and 25B), with similar features being labeled by similar numerical references, and descriptions of the similar features are not repeated herein. The package 1900 may be formed in a similar manner as the package 1100, with a distinction that a heat dissipation lid 1060 is attached to the package substrate 1000 instead of the warpage control structure 1030 (see FIGS. 25A and 25B). In some embodiments, the heat dissipation lid 1060 comprises a high thermal conductivity material, such as a metal, a metal alloy, or the like. The heat dissipation lid 1060 may be attached to the solder resist layer 1012 by an adhesive 1056. The adhesive 1056 may be formed using similar material and methods as the adhesive 1038. In some embodiment, a thermal interface material 1058 is interposed between the top surface of the package component 400' and the heat dissipation lid 1060. The thermal interface material 1058 may comprise a thermal interface material having a high thermal conductivity. In some embodiments, the heat dissipation lid 1060 comprises an opening 1062 that exposed the fiber array unit 1042. In such embodiments, the optical fiber 1050 extends into the opening 1062 and is attached to the fiber array unit 1042.

Figure 34:
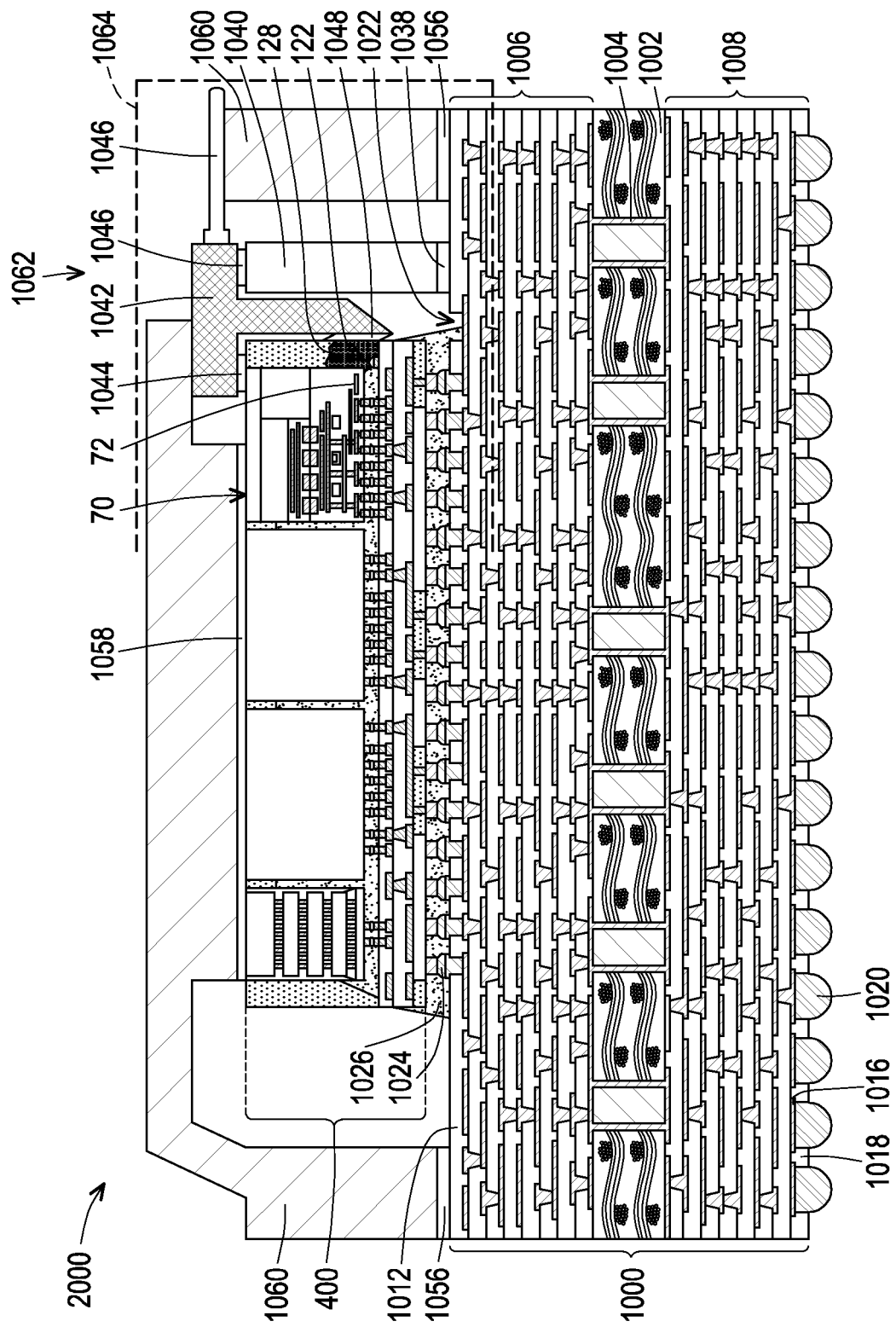
FIG. 34 illustrates a cross-sectional view of a package, in accordance with some embodiments.

FIG. 34 illustrates a cross-sectional view of a package 2000, in accordance with some embodiments. The package 2000 is similar to the package 1200 (see FIG. 26), with similar features being labeled by similar numerical references, and descriptions of the similar features are not repeated herein. The package 2000 may be formed in a similar manner as the package 1200, with a distinction that a heat dissipation lid 1060 is attached to the package substrate 1000 instead of the warpage control structure 1030 (see FIG. 26). In some embodiments, the heat dissipation lid 1060 is attached to the package substrate 1000 as described above with reference to FIG. 33, and the description is not repeated herein.

Figure 35:
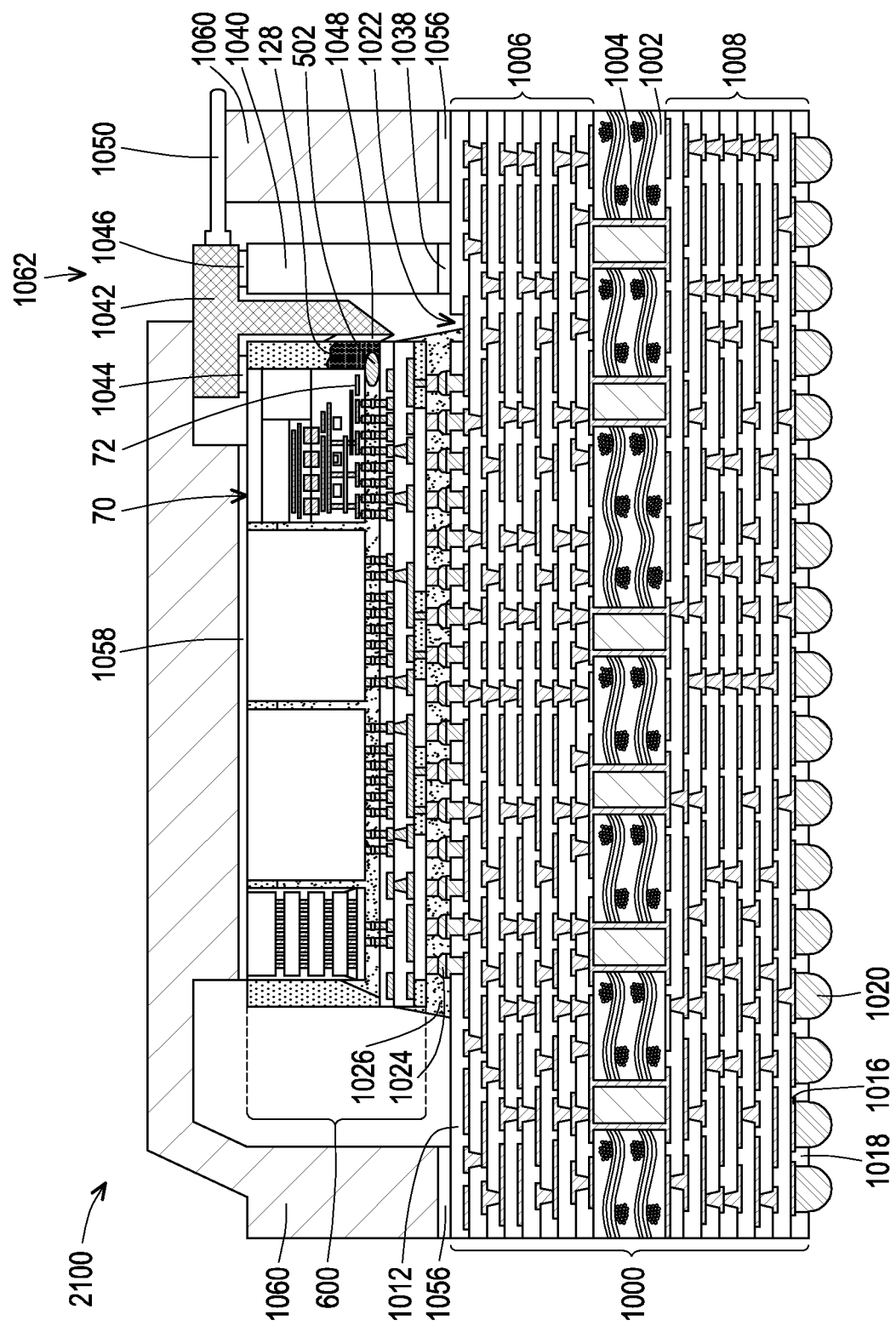
FIG. 35 illustrates a cross-sectional view of a package, in accordance with some embodiments.

FIG. 35 illustrates a cross-sectional view of a package 2100, in accordance with some embodiments. The package 2100 is similar to the package 1300 (see FIG. 27), with similar features being labeled by similar numerical references, and descriptions of the similar features are not repeated herein. The package 2100 may be formed in a similar manner as the package 1300, with a distinction that a heat dissipation lid 1060 is attached to the package substrate 1000 instead of the warpage control structure 1030 (see FIG. 27). In some embodiments, the heat dissipation lid 1060 is attached to the package substrate 1000 as described above with reference to FIG. 33, and the description is not repeated herein.

Figure 36A:
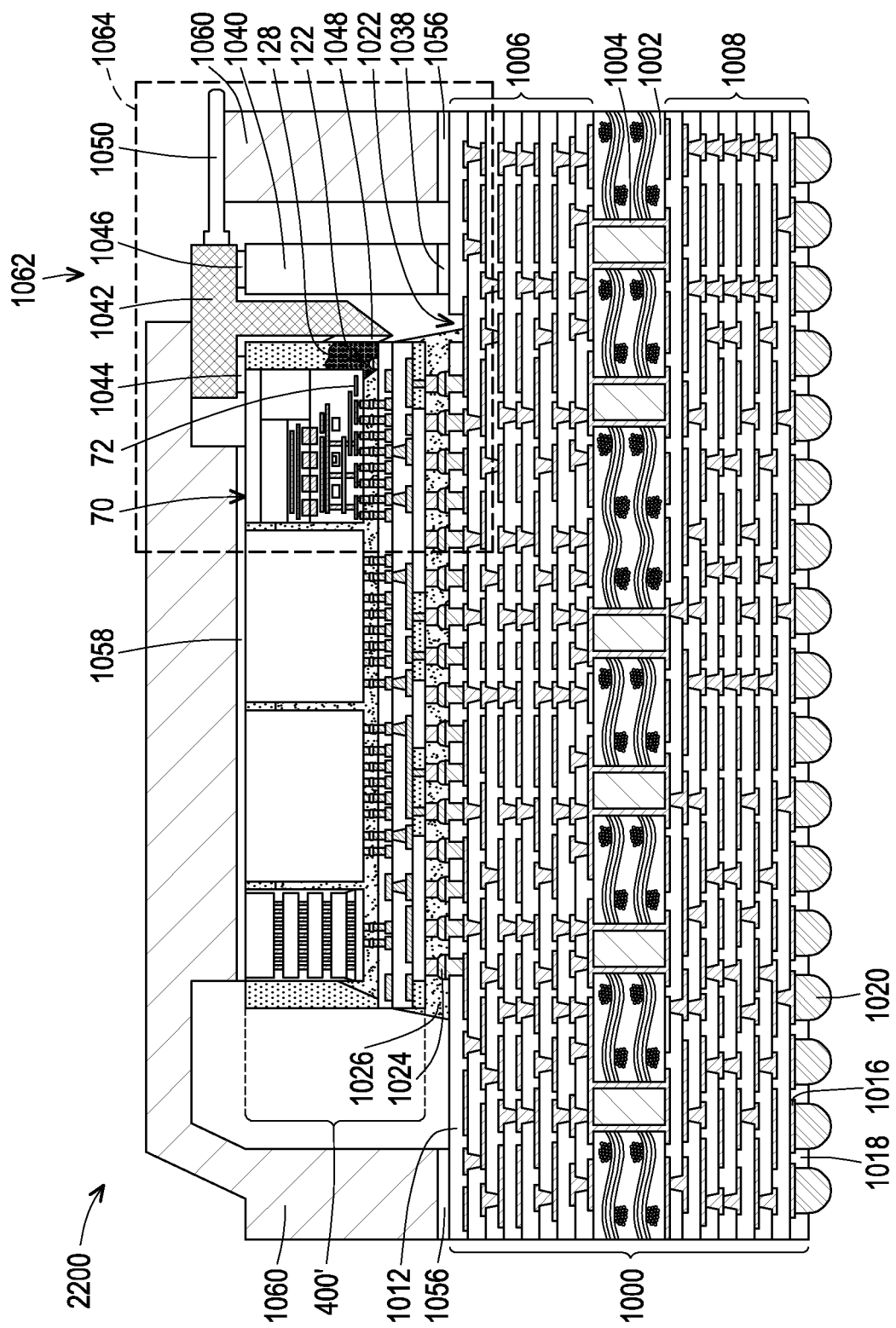
FIGS. 36A and 36B illustrate cross-sectional views of a package, in accordance with some embodiments.
Figure 36B:
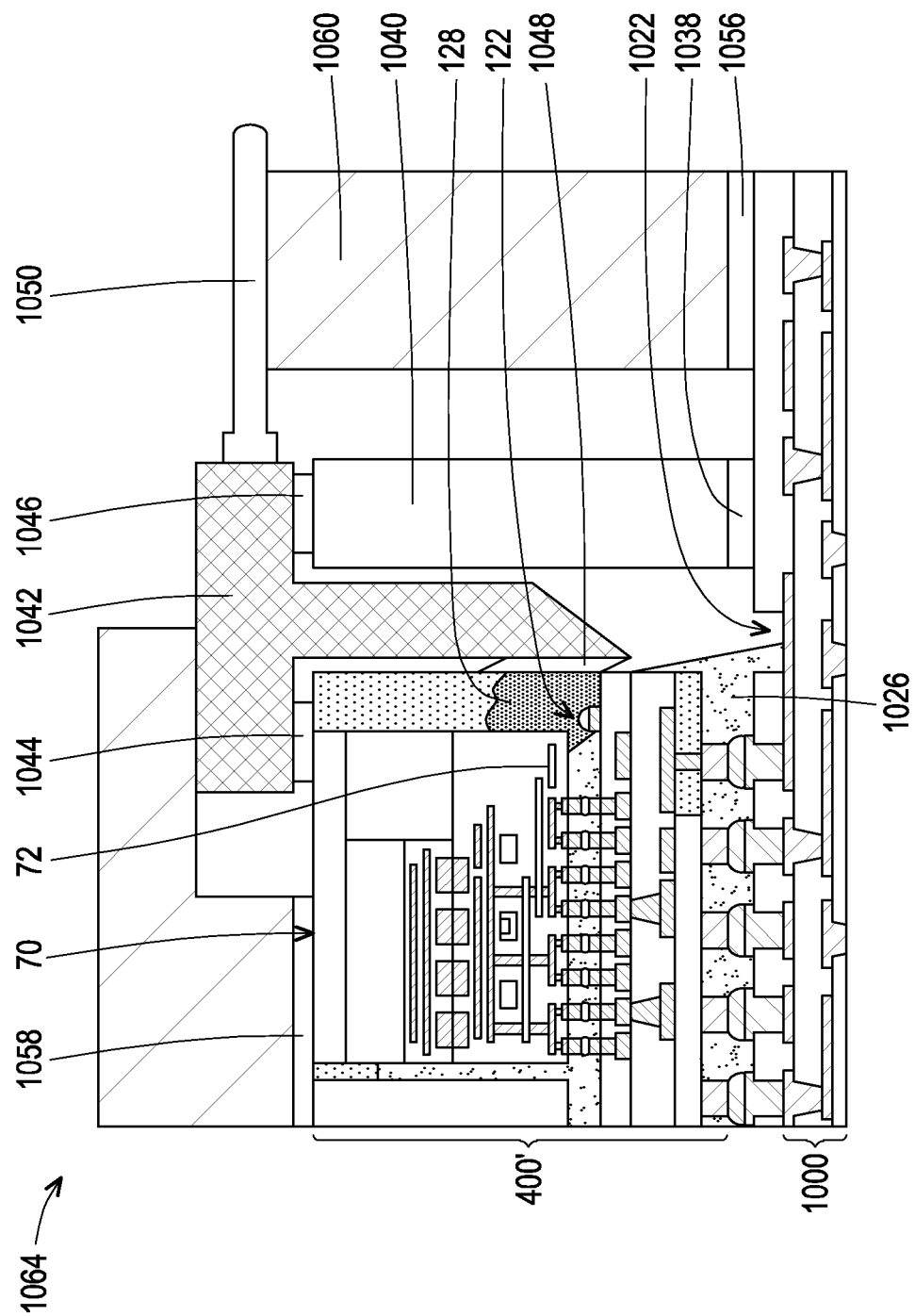

FIGS. 36A and 36B illustrate cross-sectional views of a package 2200, in accordance with some embodiments. FIG. 36B illustrates a magnified view of a region 1064 of FIG. 36A. The package 2200 is similar to the package 1400 (see FIGS. 28A and 28B), with similar features being labeled by similar numerical references, and descriptions of the similar features are not repeated herein. The package 2200 may be formed in a similar manner as the package 1400, with a distinction that a heat dissipation lid 1060 is attached to the package substrate 1000 instead of the warpage control structure 1030 (see FIGS. 28A and 28B). In some embodiments, the heat dissipation lid 1060 is attached to the package substrate 1000 as described above with reference to FIG. 33, and the description is not repeated herein.

Figure 37:
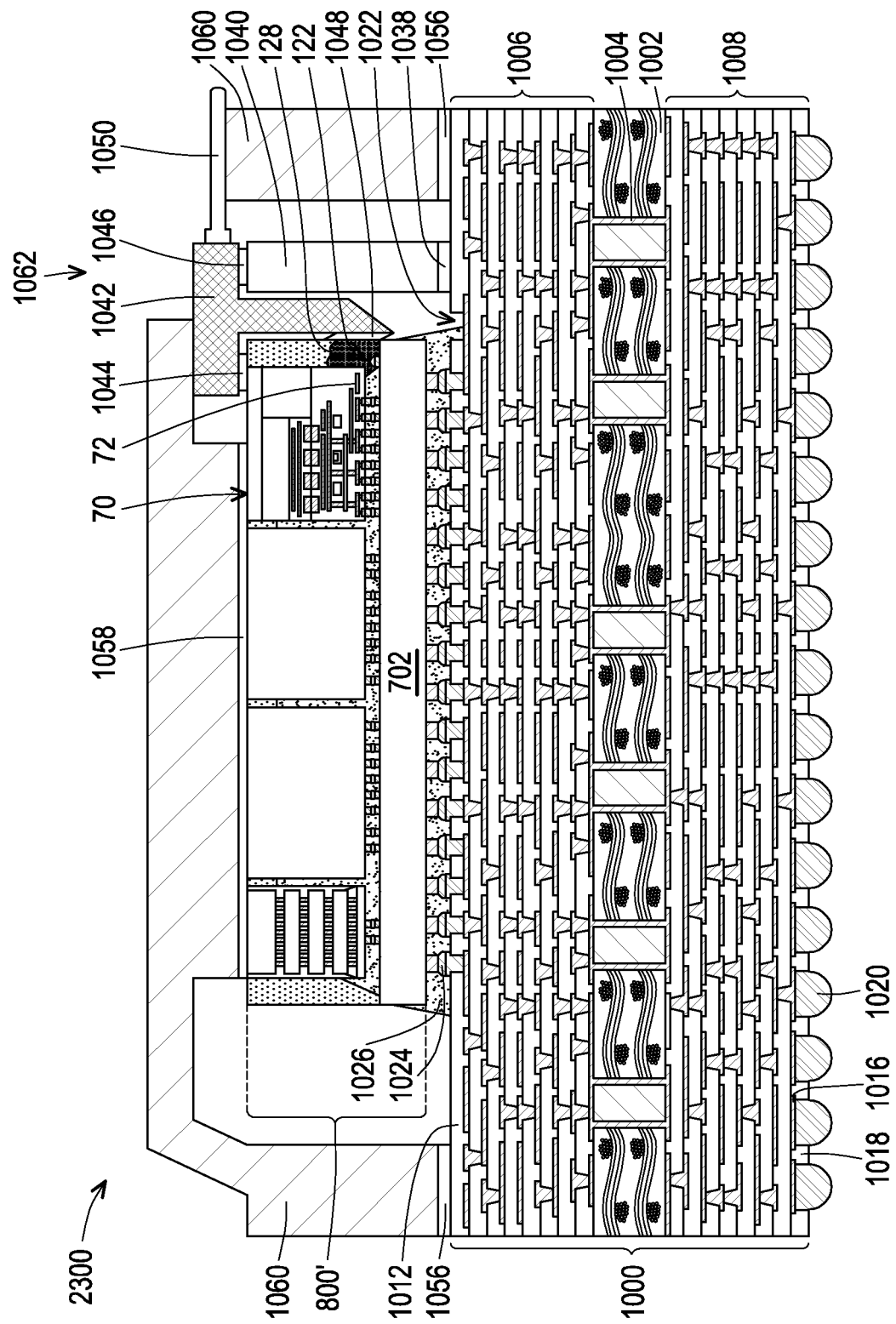
FIG. 37 illustrates a cross-sectional view of a package, in accordance with some embodiments.

FIG. 37 illustrates a cross-sectional view of a package 2300, in accordance with some embodiments. The package 2300 is similar to the package 1500 (see FIG. 29), with similar features being labeled by similar numerical references, and descriptions of the similar features are not repeated herein. The package 2300 may be formed in a similar manner as the package 1500, with a distinction that a heat dissipation lid 1060 is attached to the package substrate 1000 instead of the warpage control structure 1030 (see FIG. 29). In some embodiments, the heat dissipation lid 1060 is attached to the package substrate 1000 as described above with reference to FIG. 33, and the description is not repeated herein.

Figure 38:
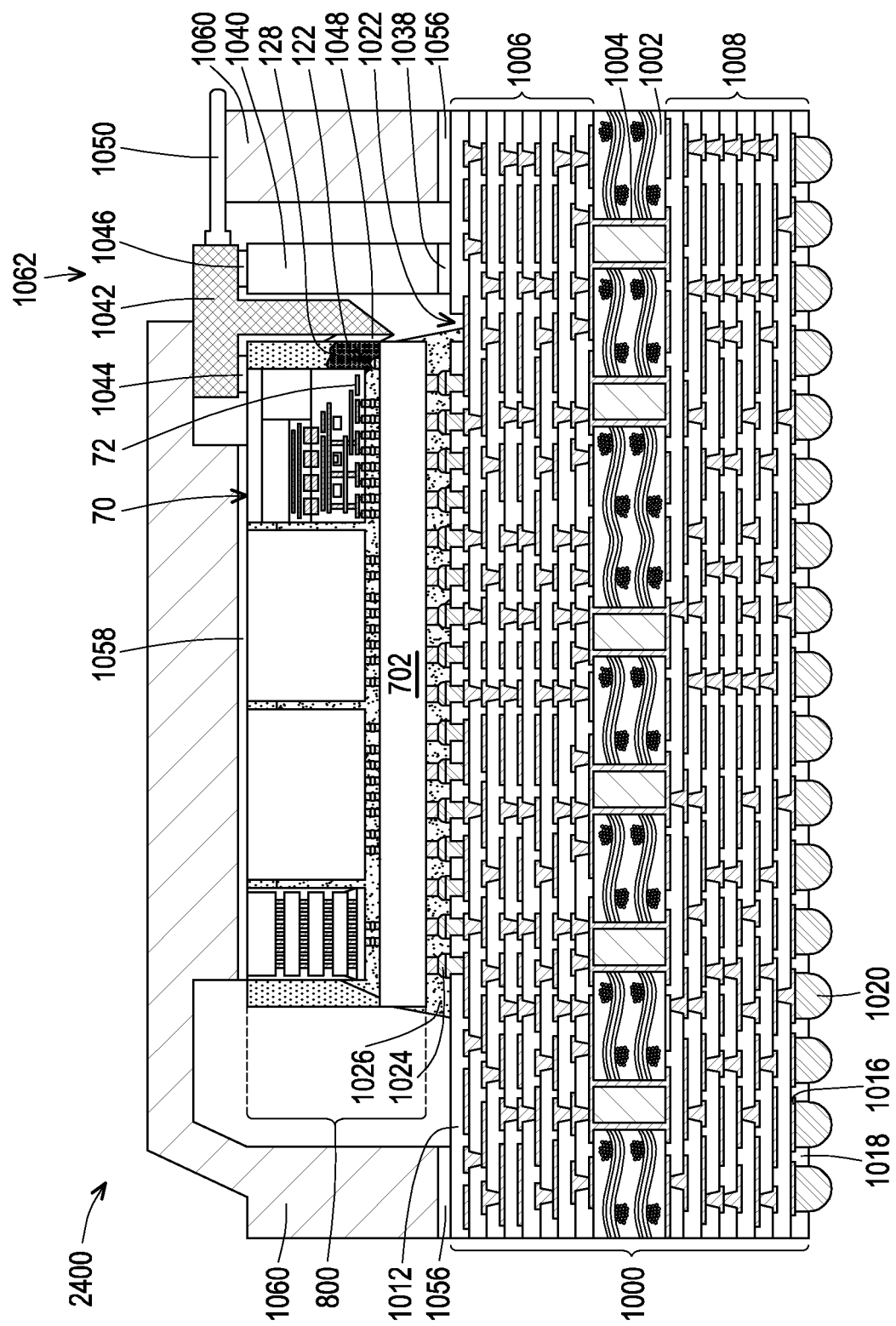
FIG. 38 illustrates a cross-sectional view of a package, in accordance with some embodiments.

FIG. 38 illustrates a cross-sectional view of a package 2400, in accordance with some embodiments. The package 2400 is similar to the package 1600 (see FIG. 30), with similar features being labeled by similar numerical references, and descriptions of the similar features are not repeated herein. The package 2400 may be formed in a similar manner as the package 1600, with a distinction that a heat dissipation lid 1060 is attached to the package substrate 1000 instead of the warpage control structure 1030 (see FIG. 30). In some embodiments, the heat dissipation lid 1060 is attached to the package substrate 1000 as described above with reference to FIG. 33, and the description is not repeated herein.

Figure 39:
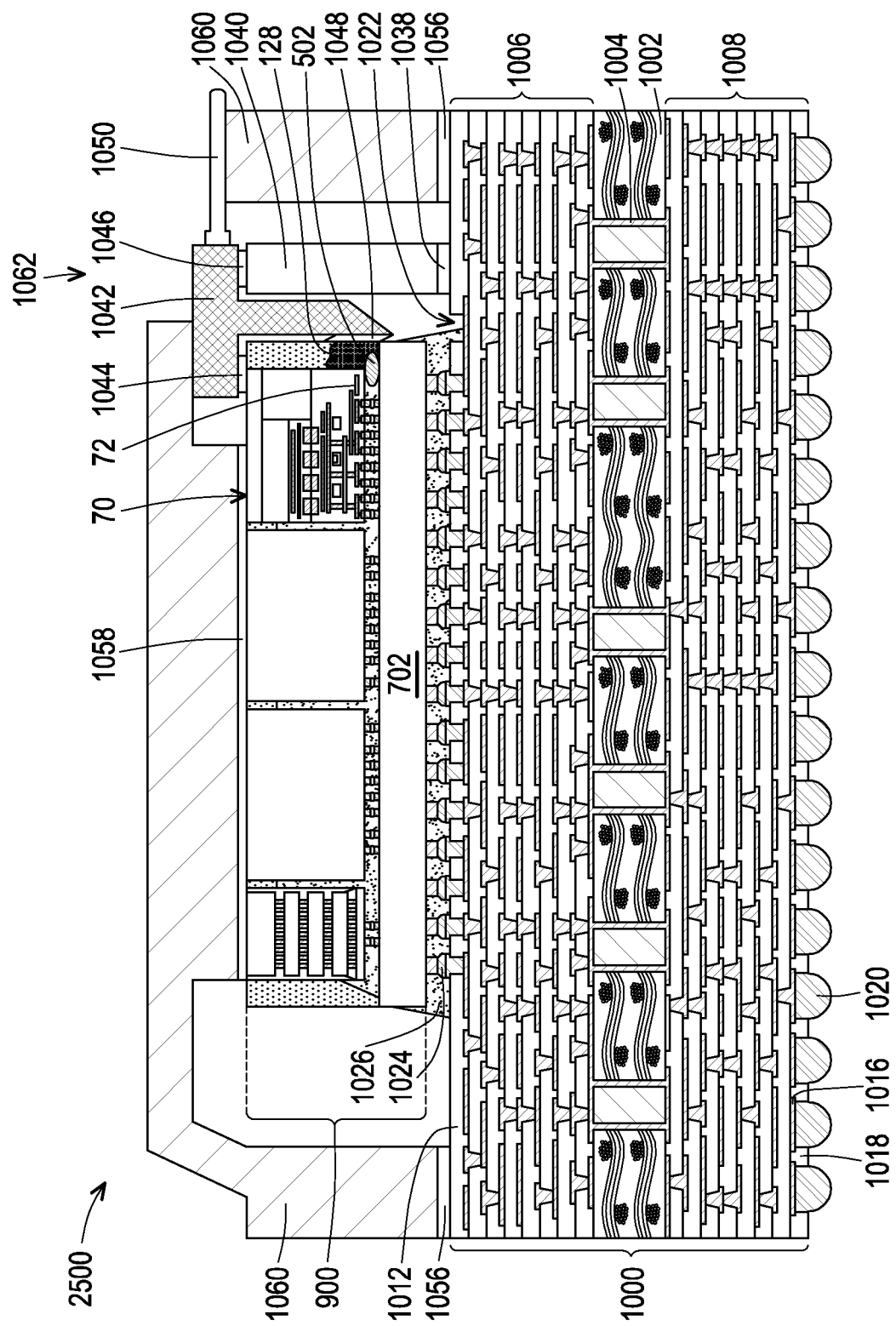
FIG. 39 illustrates a cross-sectional view of a package, in accordance with some embodiments.

FIG. 39 illustrates a cross-sectional view of a package 2500, in accordance with some embodiments. The package 2500 is similar to the package 1700 (see FIG. 31), with similar features being labeled by similar numerical references, and descriptions of the similar features are not repeated herein. The package 2500 may be formed in a similar manner as the package 1700, with a distinction that a heat dissipation lid 1060 is attached to the package substrate 1000 instead of the warpage control structure 1030 (see FIG. 31). In some embodiments, the heat dissipation lid 1060 is attached to the package substrate 1000 as described above with reference to FIG. 33, and the description is not repeated herein.

Figure 40:
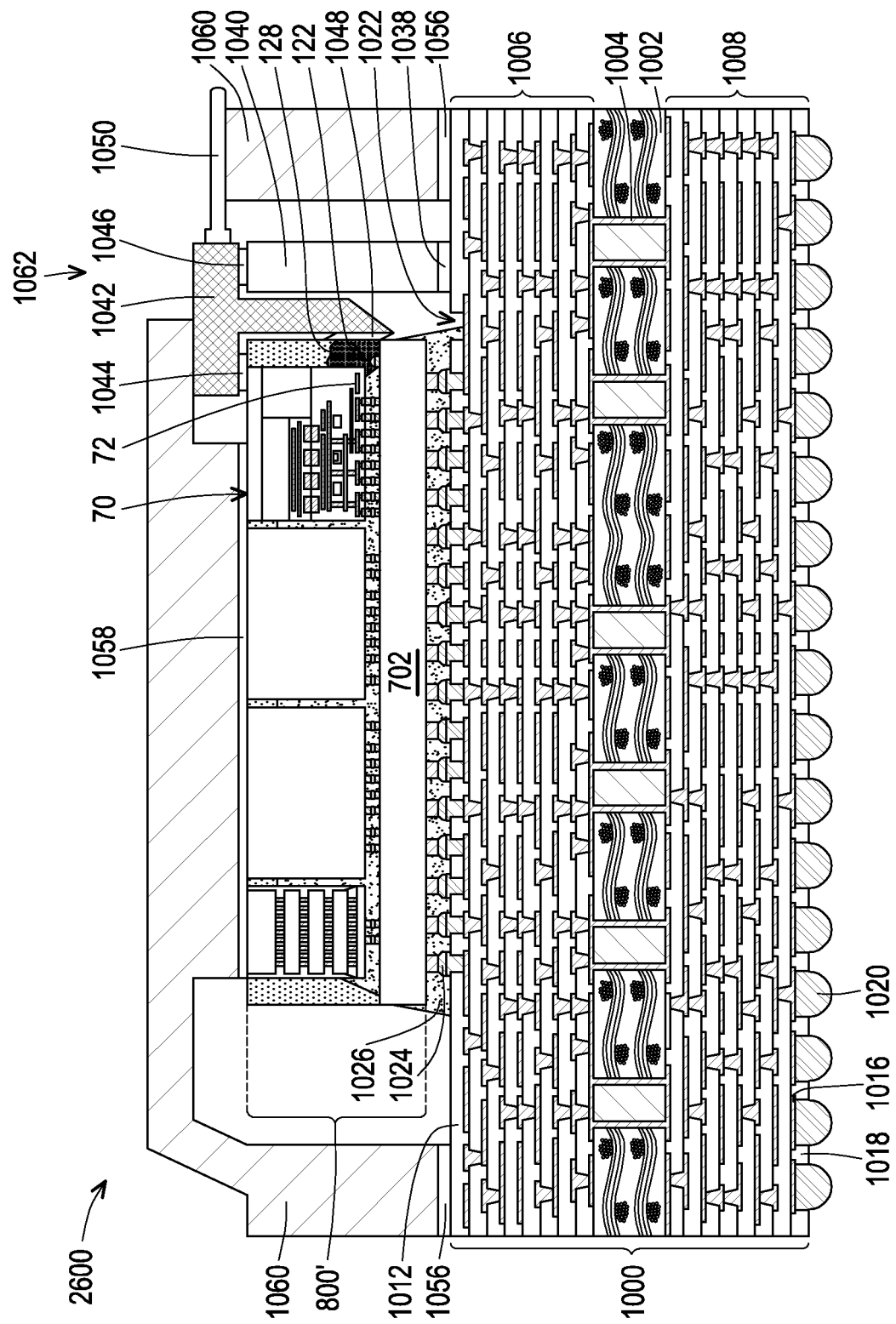
FIG. 40 illustrates a cross-sectional view of a package, in accordance with some embodiments.

FIG. 40 illustrates a cross-sectional view of a package 2600, in accordance with some embodiments. The package 2600 is similar to the package 1800 (see FIG. 32), with similar features being labeled by similar numerical references, and descriptions of the similar features are not repeated herein. The package 2600 may be formed in a similar manner as the package 1800, with a distinction that a heat dissipation lid 1060 is attached to the package substrate 1000 instead of the warpage control structure 1030 (see FIG. 32). In some embodiments, the heat dissipation lid 1060 is attached to the package substrate 1000 as described above with reference to FIG. 33, and the description is not repeated herein.

Embodiments may achieve advantages. By forming a package (such as, for example, the package 1100 illustrated in FIGS. 25A and 25B) comprising a dam structure (such as, for example, the dam structure 122 illustrated in FIGS. 25A and 25B), an optical glue (such as, for example, the optical glue 128 illustrated in FIGS. 25A and 25B), and a solder resist trench (such as, for example, the trench 1022 illustrated in FIGS. 25A and 25B) as described above various advantages may be achieved. The dam prevents an underfill (such as, for example, the underfill 126 illustrated in FIGS. 25A and 25B) that is formed between a package component (such as, for example, the package component 400' illustrated in FIGS. 25A and 25B) and a redistribution structure or an interposer (such as, for example, the redistribution structure 110 illustrated in FIGS. 25A and 25B) from extending along a sidewall of an optical integrated circuit die (such as, for example, the integrated circuit die 70 illustrated in FIGS. 25A and 25B) and from shielding an edge coupler (such as, for example, the edge coupler 72 illustrated in FIGS. 25A and 25B) of the optical integrated circuit die. The optical glue prevents an encapsulant (such as, for example, the encapsulant 132 illustrated in FIGS. 25A and 25B) that encapsulates the optical integrated circuit die from extending along the sidewall of the optical integrated circuit die and from shielding the edge coupler. The solder resist trench allows an underfill (such as, for example, the underfill 1026 illustrated in FIGS. 25A and 25B) that is formed between the package component and a package substrate (such as, for example, the package substrate 1000 illustrated in FIGS. 25A and 25B) to at least partially fill the solder resist trench and prevents the underfill from extending along a sidewall of the package component and from shielding the edge coupler of the optical integrated circuit die that is disposed near the sidewall of the package component. Accordingly, improved coupling between the edge coupler of the optical integrated circuit die and a fiber array unit (such as, for example, the fiber array unit 1042 illustrated in FIGS. 25A and 25B) is achieved. Various embodiments presented herein allow for integration of optical integrated circuit dies comprising edge couplers or grating couplers, achieving high bandwidth with ultra-low power consumption through the edge coupler, extensive integration for co-package optics, and no extra cost for adding the dam structure.

In accordance with an embodiment, a package includes a package substrate including an insulating layer having a trench and a package component bonded to the package substrate adjacent to the trench. The package component includes a redistribution structure, an optical die bonded to the redistribution structure, the optical die including an edge coupler near a first sidewall of the optical die, a dam structure on the redistribution structure near the first sidewall of the optical die, a first underfill between the optical die and the redistribution structure, an encapsulant encapsulating the optical die, and an optical glue in physical contact with the first sidewall of the optical die. The first underfill is in physical contact with the dam structure. The first underfill does not extend along the first sidewall of the optical die. The optical glue separates the dam structure from the encapsulant. The package further includes a second underfill between the insulating layer of the package substrate and the package component. The second underfill is partially disposed in the trench. In an embodiment, the package further includes a fiber array unit coupled to the optical die, where the optical glue is interposed between the edge coupler and the fiber array unit. In an embodiment, the package further includes an optical fiber attached to the fiber array unit. In an embodiment, the dam structure partially overlaps with the optical die in a plan view. In an embodiment, the first sidewall of the optical die is vertically aligned to a first sidewall of the dam structure. In an embodiment, the trench partially overlaps with the optical die in a plan view. In an embodiment, a center of the edge coupler, a center of the dam structure and a center of the trench are aligned along a same line in a plan view.

In accordance with another embodiment, a package includes a package substrate including an insulating layer having a trench, a package component bonded to the package substrate, a first sidewall of the package component being proximate to the trench, and a fiber array unit attached to the first sidewall of the package component. The package component includes a redistribution structure and an optical die bonded to the redistribution structure. The optical die includes an edge coupler. A first sidewall of the optical die and the first sidewall of the package component are proximate to the edge coupler. The package component further includes an optical glue in physical contact with the first sidewall of the optical die and between the edge coupler and the fiber array unit, a dam structure on the redistribution structure adjacent to the first sidewall of the optical die, and a first underfill between the optical die and the redistribution structure. The dam structure is embedded into the optical glue. The first underfill is in physical contact with the dam structure and the optical glue. The first underfill does not extending between the edge coupler and the optical glue. The package further includes a second underfill between the insulating layer of the package substrate and the package component. The second underfill partially fills the trench. The second underfill does not extend between the edge coupler and the fiber array unit. In an embodiment, the package further includes a support structure on the package substrate adjacent to the first sidewall of the package component, where the fiber array unit is attached to the support structure. In an embodiment, the package component further includes an encapsulant over the redistribution structure, where the optical die and the optical glue are embedded in the encapsulant, and where the encapsulant does not extend between the edge coupler and the optical glue. In an embodiment, the encapsulant does not extend between the edge coupler and the fiber array unit. In an embodiment, the package further includes a heat dissipation lid attached to the package substrate and covering the package component, where the heat dissipation lid includes an opening exposing the fiber array unit. In an embodiment, the package further includes an optical fiber within the opening in the heat dissipation lid and attached to the fiber array unit. In an embodiment, the first sidewall of the package component is vertically aligned to a first sidewall of the trench.

In accordance with yet another embodiment, a method includes forming a package component. Forming the package component includes forming a redistribution structure. A dam structure is formed on the redistribution structure. An optical die is bonded to the redistribution structure. The optical die includes an edge coupler proximate to a first sidewall of the optical die. The first sidewall of the optical die is adjacent to the dam structure. A first underfill is deposited in a first gap between the optical die and the redistribution structure. The first underfill is in physical contact with the dam structure. The first underfill does not extend along the first sidewall of the optical die. An optical glue is formed over the dam structure. The optical glue extends along and is in physical contact with the first sidewall of the optical die. An encapsulant is formed over the optical glue. The optical glue separates the dam structure from the encapsulant. The method further includes forming a trench in an uppermost insulating layer of a package substrate. The package component is bonded to the package substrate. The edge coupler of the optical die is adjacent to the trench. A second underfill is deposited in a second gap between the package component and the package substrate. The second underfill partially fills the trench. The second underfill does not extend along the first sidewall of the optical die. In an embodiment, the method further includes attaching a fiber array unit to the first sidewall of the optical die, where no portion of the first underfill, no portion of the second underfill and no portion of the encapsulant extend between the edge coupler and the fiber array unit. In an embodiment, the method further includes, before attaching the fiber array unit to the first sidewall of the optical die, attaching a support structure to the uppermost insulating layer of the package substrate adjacent to the first sidewall of the optical die, where the fiber array unit is attached to the support structure. In an embodiment, the method further includes attaching a heat dissipation lid to the package substrate, the heat dissipation lid covering the package component, where the heat dissipation lid includes an opening exposing the fiber array unit. In an embodiment, the method further includes attaching an optical fiber to the fiber array unit, where the optical fiber is disposed in the opening of the heat dissipation lid. In an embodiment, the method further includes, before bonding the optical die to the redistribution structure, forming a plurality of conductive connectors on the redistribution structure, where the plurality of conductive connectors and the dam structure are formed in a same process.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package comprising:
   a package substrate comprising an insulating layer having a trench;
   a package component bonded to the package substrate adjacent to the trench, the package component comprising:
      a redistribution structure;
      an optical die bonded to the redistribution structure, the optical die comprising an edge coupler near a first sidewall of the optical die;
      a dam structure on the redistribution structure near the first sidewall of the optical die;
      a first underfill between the optical die and the redistribution structure, the first underfill being in physical contact with the dam structure, the first underfill not extending along the first sidewall of the optical die;
      an encapsulant encapsulating the optical die; and
      an optical glue in physical contact with the first sidewall of the optical die, the optical glue separating the dam structure from the encapsulant; and
   a second underfill between the insulating layer of the package substrate and the package component, wherein the second underfill is partially disposed in the trench.

2. The package of claim 1, further comprising a fiber array unit coupled to the optical die, wherein the optical glue is interposed between the edge coupler and the fiber array unit.

3. The package of claim 2, further comprising an optical fiber attached to the fiber array unit.

4. The package of claim 1, wherein the dam structure partially overlaps with the optical die in a plan view.

5. The package of claim 1, wherein the first sidewall of the optical die is vertically aligned to a first sidewall of the dam structure.

6. The package of claim 1, wherein the trench partially overlaps with the optical die in a plan view.

7. The package of claim 1, wherein a center of the edge coupler, a center of the dam structure and a center of the trench are aligned along a same line in a plan view.

8. A package comprising:
- a package substrate comprising an insulating layer having a trench;
- a package component bonded to the package substrate, a first sidewall of the package component being proximate to the trench;
- a fiber array unit attached to the first sidewall of the package component, wherein the package component comprises:
  - a redistribution structure;
  - an optical die bonded to the redistribution structure, the optical die comprising an edge coupler, wherein a first sidewall of the optical die and the first sidewall of the package component are proximate to the edge coupler;
  - an optical glue in physical contact with the first sidewall of the optical die and between the edge coupler and the fiber array unit;
  - a dam structure on the redistribution structure adjacent to the first sidewall of the optical die, the dam structure being embedded into the optical glue; and
  - a first underfill between the optical die and the redistribution structure, the first underfill being in physical contact with the dam structure and the optical glue, the first underfill not extending between the edge coupler and the optical glue; and
- a second underfill between the insulating layer of the package substrate and the package component, wherein the second underfill partially fills the trench, and wherein the second underfill does not extend between the edge coupler and the fiber array unit.

9. The package of claim 8, further comprising a support structure on the package substrate adjacent to the first sidewall of the package component, wherein the fiber array unit is attached to the support structure.

10. The package of claim 8, wherein the package component further comprises an encapsulant over the redistribution structure, wherein the optical die and the optical glue are embedded in the encapsulant, and wherein the encapsulant does not extend between the edge coupler and the optical glue.

11. The package of claim 10, wherein the encapsulant does not extend between the edge coupler and the fiber array unit.

12. The package of claim 8, further comprising a heat dissipation lid attached to the package substrate and covering the package component, wherein the heat dissipation lid comprises an opening exposing the fiber array unit.

13. The package of claim 12, further comprising an optical fiber within the opening in the heat dissipation lid and attached to the fiber array unit.

14. The package of claim 8, wherein the first sidewall of the package component is vertically aligned to a first sidewall of the trench.

15. A method comprising:
- forming a package component, wherein forming the package component comprises:
  - forming a redistribution structure;
  - forming a dam structure on the redistribution structure;
  - bonding an optical die to the redistribution structure, the optical die comprising an edge coupler proximate to a first sidewall of the optical die, the first sidewall of the optical die being adjacent to the dam structure;
  - depositing a first underfill in a first gap between the optical die and the redistribution structure, wherein the first underfill is in physical contact with the dam structure, and wherein the first underfill does not extend along the first sidewall of the optical die;
  - forming an optical glue over the dam structure, wherein the optical glue extends along and is in physical contact with the first sidewall of the optical die; and
  - forming an encapsulant over the optical glue, wherein the optical glue separates the dam structure from the encapsulant;
- forming a trench in an uppermost insulating layer of a package substrate;
- bonding the package component to the package substrate, the edge coupler of the optical die being adjacent to the trench; and
- depositing a second underfill in a second gap between the package component and the package substrate, wherein the second underfill partially fills the trench, and wherein the second underfill does not extend along the first sidewall of the optical die.

16. The method of claim 15, further comprising attaching a fiber array unit to the first sidewall of the optical die, wherein no portion of the first underfill, no portion of the second underfill and no portion of the encapsulant extend between the edge coupler and the fiber array unit.

17. The method of claim 16, further comprising, before attaching the fiber array unit to the first sidewall of the optical die, attaching a support structure to the uppermost insulating layer of the package substrate adjacent to the first sidewall of the optical die, wherein the fiber array unit is attached to the support structure.

18. The method of claim 16, further comprising attaching a heat dissipation lid to the package substrate, the heat dissipation lid covering the package component, wherein the heat dissipation lid comprises an opening exposing the fiber array unit.

19. The method of claim 18, further comprising attaching an optical fiber to the fiber array unit, wherein the optical fiber is disposed in the opening of the heat dissipation lid.

20. The method of claim 15, further comprising, before bonding the optical die to the redistribution structure, forming a plurality of conductive connectors on the redistribution structure, wherein the plurality of conductive connectors and the dam structure are formed in a same process.

* * * * *